(12) United States Patent
Fuji et al.

(10) Patent No.: US 8,649,127 B2
(45) Date of Patent: Feb. 11, 2014

(54) MAGNETO-RESISTIVE EFFECT DEVICE, MAGNETIC HEAD ASSEMBLY, AND MAGNETIC RECORDING DEVICE

(75) Inventors: Yoshihiko Fuji, Kanagawa-ken (JP); Michiko Hara, Kanagawa-ken (JP); Hideaki Fukuzawa, Kanagawa-ken (JP); Hiromi Yuasa, Kanagawa-ken (JP); Shuichi Murakami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 13/240,062

(22) Filed: Sep. 22, 2011

(65) Prior Publication Data

US 2012/0212857 A1    Aug. 23, 2012

(30) Foreign Application Priority Data

Feb. 17, 2011 (JP) ................. 2011-032611

(51) Int. Cl.
*G11B 5/127* (2006.01)

(52) U.S. Cl.
USPC ....................................... 360/322

(58) Field of Classification Search
USPC ............ 360/322, 122, 324.12, 324.2, 125.33
See application file for complete search history.

(56) References Cited

U.S. PATENT DOCUMENTS

| 6,876,524 B2 * | 4/2005 | Tagawa et al. ........... 360/324.12 |
| 6,914,757 B2 * | 7/2005 | Yuasa et al. .................. 360/322 |
| 7,301,733 B1 | 11/2007 | Fukuzawa et al. |

FOREIGN PATENT DOCUMENTS

| JP | 2001-102657 A | 4/2001 |
| JP | 2002-208744 | 7/2002 |
| JP | 2003-229614 A | 8/2003 |
| JP | 2003-281705 A | 10/2003 |
| JP | 2004-6589 | 1/2004 |
| JP | 2004-146480 A | 5/2004 |
| JP | 2007-142424 A | 6/2007 |
| JP | 2008-187048 A | 8/2008 |
| JP | 2009-283499 A | 12/2009 |
| JP | 2010-97981 A | 4/2010 |
| JP | 2010-199539 A | 9/2010 |
| WO | WO 03/092083 A1 | 11/2003 |
| WO | WO 2011/064822 A1 | 6/2011 |

OTHER PUBLICATIONS

Office Action issued Jan. 17, 2013 in Japanese Patent Application No. 2011-032611 with English language translation.
U.S. Appl. No. 13/481,317, Fuji et al.
Office Action issued May 23, 2013 in Japanese Patent Application No. 2011-032611 with English language translation.

\* cited by examiner

Primary Examiner — Allen T Cao
(74) Attorney, Agent, or Firm — Oblon, Spivak, McClelland, Maier & Neustadt, L.L.P.

(57) ABSTRACT

According to one embodiment, a magneto-resistive effect device includes a stacked body, a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. A crystalline structure of the metal oxide is a NaCl structure.

34 Claims, 22 Drawing Sheets

$Fe_{0.95}O_1$

● METAL ATOM
○ OXYGEN ATOM $Fe_3O_4$

● METAL ATOM ···A SITE
● METAL ATOM ···B SITE
○ OXYGEN ATOM $\gamma-Fe_2O_3$

● METAL ATOM ···A SITE
● METAL ATOM ···B SITE
○ OXYGEN ATOM

MAGNETO-RESISTIVE EFFECT DEVICE, MAGNETIC HEAD ASSEMBLY, AND MAGNETIC RECORDING DEVICE

CROSS-REFERENCE TO RELATED APPLICATIONS

This application is based upon and claims the benefit of priority from the prior Japanese Patent Application No. 2011-032611, filed on Feb. 17, 2011; the entire contents of which are incorporated herein by reference.

FIELD

Embodiments described herein relate generally to a magnetic head assembly and a magnetic recording device.

BACKGROUND

In recent years, the miniaturization and high densification of hard disk drives (HDD) has rapidly advanced and further advances in densification are expected. High densification of an HDD is possible by increasing track density through decreasing memory track width. However, when track width is decreased, the size of the recorded magnetization, specifically the recorded signal, decreases, and this leads to the necessity of an enhancement in the reproduction sensitivity of the magneto-resistive (MR) head, which reproduces the media signals.

Recently, tunneling magneto-resistance (TMR) heads including highly-sensitive spin-valve films using the tunneling magneto-resistance effect are being used. A spin-valve film is a stacked film with a sandwich structure including a spacer layer between two ferromagnetic layers. A magnetization direction of a first of the two ferromagnetic layers (referred to as a "pinned layer" or a "magnetization fixing layer") is fixed by an antiferromagnetic layer or the like. A magnetization direction of a second of the ferromagnetic layers (referred to as a "free layer" or a "magnetization free layer") is modifiable by an external magnetic field. A great amount of magneto-resistance effect can be obtained by varying the relative angles of the magnetization directions of the two ferromagnetic layers in the spin-valve film. Here, the sandwich structure where the spacer layer is sandwiched between the two ferromagnetic layers is referred to as a "spin-dependent resistance variation unit".

Examples of magneto-resistive effect devices using spin-valve films include CIP (Current In Plane)-GMR devices, CPP (Current Perpendicular to Plane)-GMR devices, and TMR (Tunneling Magneto-Resistance) devices. In CIP-GMR devices, sense current flows parallel with the spin-valve film face, and in CPP-GMR devices and TMR devices sense current flows substantially perpendicular to the spin-valve film face.

In a system in which the sense current flows in a direction perpendicular to the film face, a metal layer is used as the spacer layer in regular CPP-GMR devices, and an insulating layer is used as the spacer layer in TMR devices.

In order to enhance the memory density of a hard disk drive and also to enhance the data transmission rate, excellent high-frequency responsiveness of the reproduction head is required. Therefore, it is necessary to reduce the resistance of the reproduction head device. Reducing the thickness of a tunneling insulating layer is effective for reducing the resistance of conventional TMR devices. However, if the thickness of the tunneling insulating layer is reduced excessively, a large number of pin holes will form in the insulating layer. This leads to problems related to the deterioration of the characteristics of the TMR device such as reductions in the MR rate of change and/or increases in noise due to an increase in magnetic coupling of the free layer and the pinned layer.

On the other hand, in CPP-GMR devices a metal layer is used as the spacer layer. Therefore, from the perspective of reducing resistance, CPP-GMR devices are more advantageous than TMR devices. However, there is a problem in that with CPP-GMR devices, a sufficiently large MR rate of change cannot be obtained.

In order to solve the problems described above, efforts are being made such as modifying the structure of CPP-GMR devices, selecting the material of the spacer layer, and the like.

For example, a CPP device constituted by a nano-oxide layer (NOL) including a current path in a thickness direction, instead of a simple metal layer, as the spacer layer used in a CPP-GMR device has been proposed. With this device, the MR rate of change can be increased due to a current-confined-path effect. Such a device is referred to as a "CCP-CPP device".

Aside from the effort described above, magneto-resistive effect devices have been proposed in which a thin film spin filter (SF) layer formed from oxides or nitrides is inserted in the ferromagnetic layers and/or at an interface between these and a nonmagnetic spacer layer. This SF layer can increase the MR rate of change due to having a spin filtering effect by which the flow of either up spin electrons or down spin electrons is blocked.

DETAILED DESCRIPTION

Figure 1:
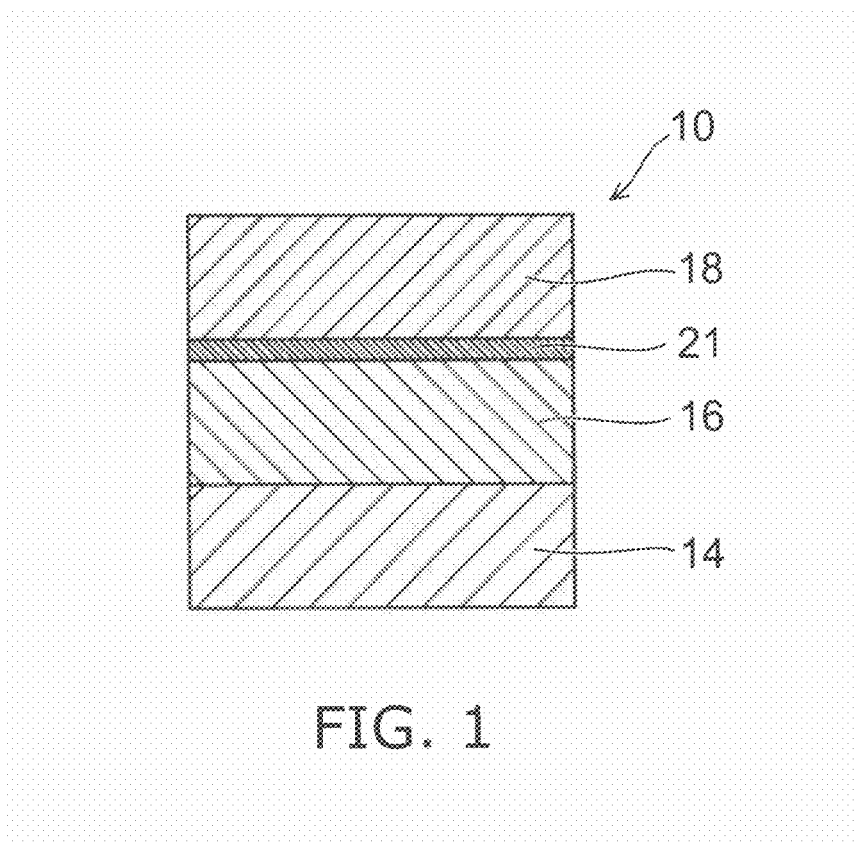
FIG. 1 is a cross-sectional view illustrating a stacked body of a magneto-resistive effect device according to a first embodiment.

In general, according to one embodiment, a magneto-resistive effect device includes a stacked body, a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. A crystalline structure of the metal oxide is a NaCl structure.

According to another embodiment, a magnetic head assembly includes a magneto-resistive effect device, a suspension having the magneto-resistive effect device mounted on a first end thereof, and an actuator arm connected to a second end of the suspension. The magneto-resistive effect device includes a stacked body and a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. A crystalline structure of the metal oxide being a NaCl structure.

According to another embodiment, a magnetic recording device includes a magnetic head assembly and a magnetic recording media. A magnetic head assembly includes a magneto-resistive effect device, a suspension having the magneto-resistive effect device mounted on a first end thereof, and an actuator arm connected to a second end of the suspension. A magnetic recording media on which data is recorded uses the magneto-resistive effect device mounted on the magnetic head assembly. The magneto-resistive effect device includes a stacked body, and a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. A crystalline structure of the metal oxide is a NaCl structure.

According to another embodiment, a magneto-resistive effect device includes a stacked body and a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. A crystalline structure of the metal oxide is a spinel structure. The metal oxide includes divalent metal ions.

According to another embodiment, a magnetic head assembly includes a magneto-resistive effect device, a suspension having the magneto-resistive effect device mounted on a first end thereof, and an actuator arm connected to a second end of the suspension. The magneto-resistive effect device includes a stacked body, and a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. A crystalline structure of the metal oxide is a spinel structure. The metal oxide including divalent metal ions.

According to another embodiment, a magneto-resistive effect device includes a stacked body, and a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer includes an oxide layer formed from a metal oxide. The oxide layer includes iron. A crystalline orientation of the oxide layer is a (111) plane orientation. An interplanar spacing of the (111) plane is not less than 0.242 nm.

According to another embodiment, a magneto-resistive effect device is a spin accumulation type magneto-resistive effect device. The spin accumulation type magneto-resistive effect device includes a non-magnetic layer, a magnetization fixed layer provided on a first region of the non-magnetic layer and having magnetization fixed in one direction, and a magnetization free layer provided on a second region of the non-magnetization layer and having magnetization changing in response to an external magnetic field. The spin accumulation type magneto-resistive effect device supplies a current between the non-magnetic layer and the magnetization fixed layer, and measures a voltage between the non-magnetic layer and the free layer. The device includes a stacked body, and a pair of electrodes for supplying current in a stacking direction of the stacked body. The stacked body includes a first magnetic layer, a second magnetic layer, and a spacer layer disposed between the first magnetic layer and the second magnetic layer. At least one of the first magnetic layer, the second magnetic layer, and the spacer layer including an oxide layer formed from a metal oxide. A crystalline structure of the metal oxide is a spinel structure. The metal oxide includes divalent metal ions.

First Embodiment

Hereinafter, embodiments will be explained below with reference to the drawings. In the drawings described hereinafter, constituents indicated by the same reference number are identical and repetitive descriptions thereof are omitted.

First, a first embodiment will be described.

FIG. 1 is a cross-sectional view illustrating a stacked body of a magneto-resistive effect device according to the first embodiment.

As illustrated in FIG. 1, a magneto-resistive effect device 10 of the first embodiment is provided with the stacked body. The stacked body includes a first magnetic layer 14 and a second magnetic layer 18, and a spacer layer 16 provided between these.

The first magnetic layer 14 and the second magnetic layer 18 are both formed from a ferromagnetic material. The first magnetic layer 14 is a pinned layer wherein a magnetization direction thereof is fixed in substantially one direction, or is free layer wherein the magnetization direction changes in accordance with an external magnetic field. The second magnetic layer 18 is a free layer wherein a magnetization direction thereof changes in accordance with an external magnetic field. As a result of relative angles of the magnetization direction of the first magnetic layer 14 and the magnetization direction of the second magnetic layer 18 changing in accordance with the external magnetic fields, electric resistance when current flows in a direction perpendicular to the film face changes. Thus, the magneto-resistive effect device 10 functions as a magnetic sensor.

Here, a MR rate of change of the perpendicular current flow-type magneto-resistive effect device 10 is determined by spin-dependent scattering in the magnetic layers (bulk scattering) and spin-dependent interfacial scattering at the interface between the magnetic layers and the spacer layer. The MR rate of change increases as a result of applying a material with high spin-dependent scattering to the magnetic layers and the spacer layer.

From this perspective, as a result of independent experimentation and investigation, the inventors discovered that spin-dependent scattering can be promoted and the MR rate of change can be increased by providing an oxide layer 21 having a unique crystalline structure in at least one of the first magnetic layer, the second magnetic layer, and the spacer layer.

As illustrated in FIG. 1, the oxide layer 21 is provided in the stacked body of the magneto-resistive effect device 10 according to the first embodiment. The MR rate of change of the magneto-resistive effect device 10 can be increased by providing the oxide layer 21. The oxide layer 21 is formed from a metal oxide, but the crystal structure and composition thereof are limited.

Figure 2A:
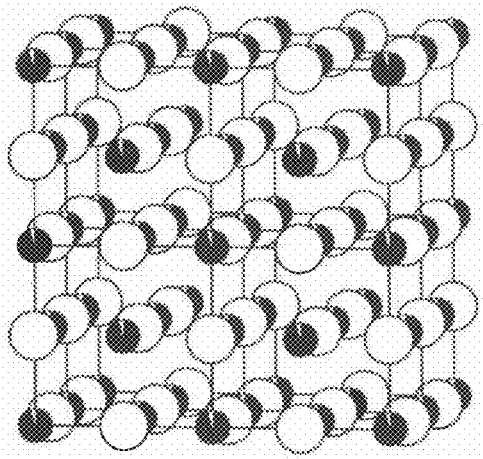
FIG. 2A is a drawing illustrating a metal oxide having a NaCl crystal structure.
Figure 2B:
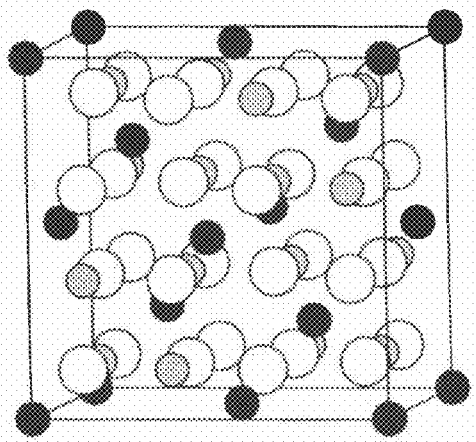
FIGS. 2B and 2C are drawings illustrating metal oxides having a spinel crystal structure.
Figure 2C:
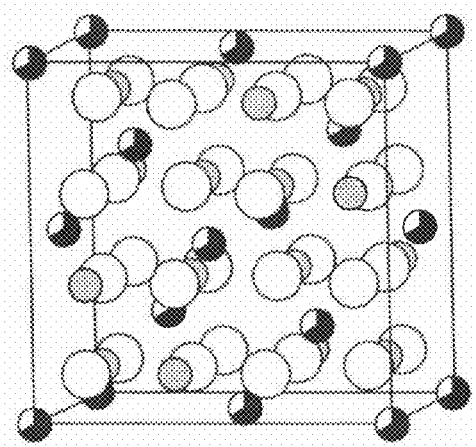

FIG. 2A is a drawing illustrating a metal oxide having a NaCl crystal structure. FIGS. 2B and 2C are drawings illustrating metal oxides having a spinel crystal structure.

The oxide layer 21 includes metal oxides having a NaCl crystal structure such as that illustrated in FIG. 2A and metal oxides having a spinel crystal structure such as those illustrated in FIGS. 2B and 2C.

When the metal is Me and oxygen is O, the chemical formula of the metal oxide having the NaCl structure illustrated in FIG. 2A can be substantially expressed as MeO. Because oxygen is a divalent negative ion, the metal of the metal oxide contributes a divalent positive ion ($Me^{2+}$). Note that in actuality, the metal oxide having a NaCl structure is most stable when a composition ratio thereof is approximately $Me_{0.95}O_{1.00}$. In this case, an oxygen concentration of the metal oxide is approximately 51 at. %. In FIG. 2A, a case is illustrated where the metal (Me) is iron (Fe). The chemical formula thereof is expressed $Fe_{0.95}O_1$. This iron oxide having a NaCl structure is referred to as "Wustit".

Additionally, the chemical formula of the metal oxide having the spinel structure illustrated in FIG. 2B can be expressed $Me_3O_4$. In FIG. 2B, a case is illustrated where the metal is iron. The chemical formula thereof is expressed $Fe_3O_4$. Additionally, the spinel structure illustrated in FIG. 2B includes $\gamma\text{-}Me_2O_3$ as an oxide having a cation vacancy at the metal atom Me site. In FIG. 2C, a case is illustrated where the metal atom Me is iron. The chemical formula thereof is expressed $\gamma\text{-}Fe_2O_3$. Note that in FIGS. 2A and 2C, a proportion of the area blackened in of the black circles representing the metal atoms corresponds to the existence probability of atoms at that site.

In actuality, an intermediate composition ratio may be used. In $Me_3O_4$, a divalent positive ion ($Me^{2+}$) and a trivalent positive ion ($Me^{3+}$) coexist as the metal atom Me. In this case the oxygen concentration is approximately 57 at. %. On the other hand, in $\gamma\text{-}Me_2O_3$, only a substantially trivalent positive ion ($Me^{3+}$) exists as the metal atom Me. In this case the oxygen concentration is approximately 60 at. %. When the metal (Me) is iron (Fe), $Fe_3O_4$ is referred to as "magnetite", and $\gamma\text{-}Fe_2O_3$ is referred to as "maghemite".

In order to sufficiently increase the MR rate of change of the magneto-resistive effect device 10, the metal oxide forming the oxide layer 21 must either be a NaCl structure or a spinel structure having the chemical formula $Me_3O_4$. In contrast, a high MR rate of change cannot be obtained with a spinel structure having the chemical formula $Me_2O_3$. In other words, the metal oxide forming the oxide layer 21 must include a divalent metal ion. Here, when expressing the composition of the metal oxide as $Me_XO_Y$, a value of a ratio (Y/X) is not greater than 4/3. However, because there is a degree of allowance regarding the composition ratio of the metal oxide, even if the ratio (Y/X) exceeds 4/3, a high MR rate of change can be obtained so long as a divalent metal ion is included.

A reason for the increase in the MR rate of change as a result of providing an oxide layer having the structure described above is thought to be as follows. In the NaCl structure, rather, in a band structure of the spinel structure oxide layer ($Me_3O_4$), a difference in the density of states of up spin electrons and down spin electrons on the Fermi surface, or a difference of the derivatives of the density of states of the up spin electrons and the down spin electrons (Fermi velocity) is great. Therefore, it is though that high spin-dependent scattering can be realized.

Figure 3A:
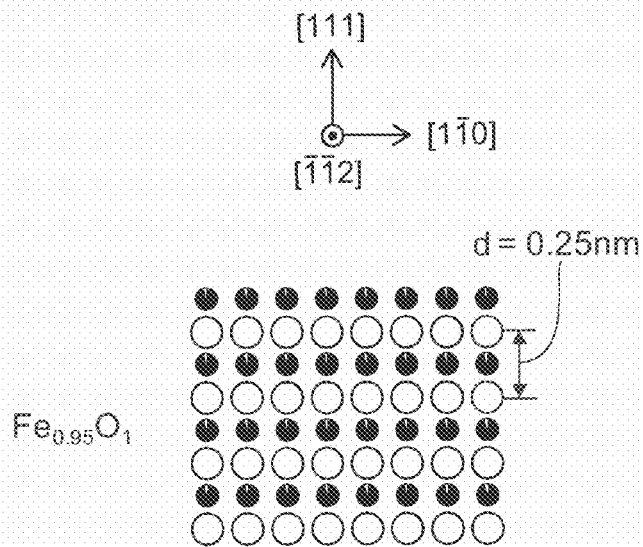
FIGS. 3A to 3F illustrate atom layer structures when $Me_{0.95}O_1$, $Me_3O_4$, and $\gamma\text{-}Me_2O_3$ are in the [111] orientation.
Figure 3D:
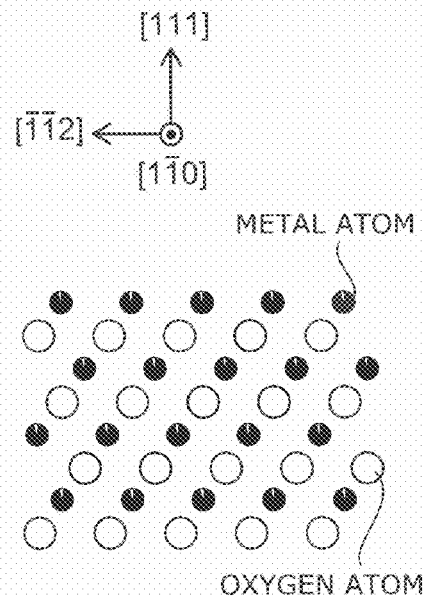
Figure 3B:
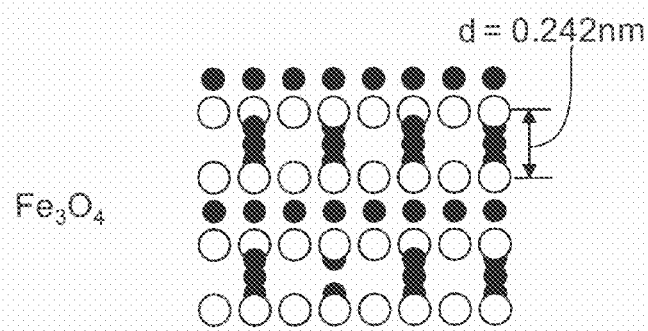
Figure 3E:
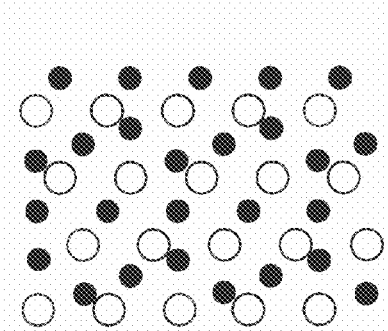
Figure 3C:
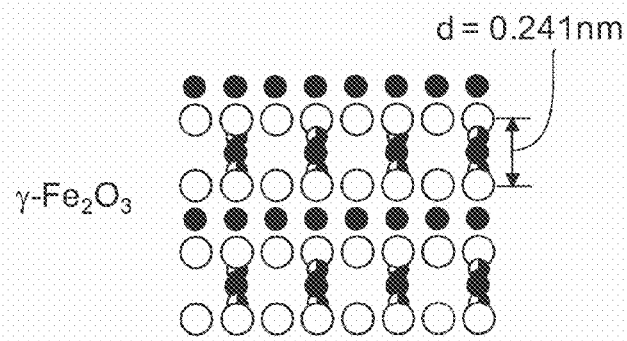
Figure 3F:
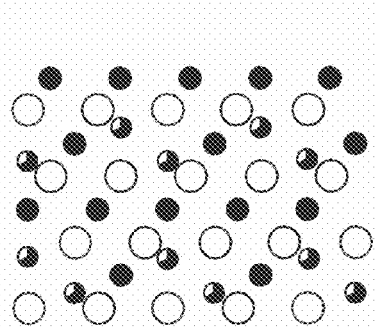

FIGS. 3A to 3F illustrate atom layer structures when $Me_{0.95}O_1$, $Me_3O_4$, and $\gamma\text{-}Me_2O_3$ are in the [111] orientation. FIGS. 3A and 3D illustrate atom layer structures of $Me_{0.95}O_1$; FIGS. 3B and 3E illustrate atom layer structures of $Me_3O_4$; and FIGS. 3C and 3F illustrate atom layer structures of γ-$Me_2O_3$. FIGS. 3A, 3B, and 3C are cross-sectional views from the [−1-12] orientation; and FIGS. 3D, 3E, and 3F are cross-sectional views from the [1-10] orientation. As illustrated in FIGS. 3A to 3F, an entirety of the atom layer structures from the [111] orientation of $Me_3O_4$ and γ-$Me_2O_3$ consists of repetitions of MeT/O/Me/O units. Here, "MeT" refers to a Me atom layer in a tetrahedral position; and "Me" and "O" that are not accompanied by subscript characters are each atom layers of Me atoms and O atoms in an octahedral position.

On the other hand, the atom layer structure from the [111] orientation of $Me_{0.95}O_1$ consists of repetitions of Me/O/Me/O units. Thus, the atom layer structure of $Me_{0.95}O_1$, $Me_3O_4$, and γ-$Me_2O_3$, of the four layers has, uniquely, a different yet extremely similar structure and, as described above, these three structures change continuously in accordance with the oxygen concentration thereof. Here, when Me is a Fe atom, an interplanar spacing in the [111] orientation of $Fe_{0.95}O_1$ is 0.25 nm, an interplanar spacing in the [111] orientation of $Fe_3O_4$ is 0.242 nm, and an interplanar spacing in the [111] orientation of γ-$Fe_2O_3$ is 0.241 nm. Thus, the interplanar spacing decreases in subsequently from the $Fe_{0.95}O_1$ to the $Fe_3O_4$ to the γ-$Fe_2O_3$.

A cause of $Me_{0.95}O_1$ and $Me_3O_4$ being able to achieve a higher spin-dependent scattering than γ-$Me_2O_3$ is thought to be because $Me_{0.95}O_1$ and $Me_3O_4$ have larger interplanar spacings than γ-$Me_2O_3$, which leads to an increase in distance between the Me atoms and the O atoms. As a result, the band structure of the oxide layer 21 changes and a difference in the density of states of up spin electrons and down spin electrons on the Fermi surface, or a difference of the derivatives of the density of states of the up spin electrons and the down spin electrons (Fermi velocity) is great.

Additionally, as illustrated in FIGS. 2A to 2C and 3A to 3F, $Me_{0.95}O_1$ has a simpler crystalline structure and atom layer structure than $Me_3O_4$ and γ-$Me_2O_3$. As a result, when fabricated as an ultrathin film in a magneto-resistive film, $Me_{0.95}O_1$, having the simple crystalline structure, can easily obtain an ideal crystalline structure that is similar to bulk. Thus it is possible for $Me_{0.95}O_1$ to realize the highest spin-dependent scattering.

When forming the oxide layer 21 using a metal oxide having a NaCl crystal structure, examples of such a metal oxide include oxides containing at least one material selected from the group consisting of iron (Fe), cobalt (Co), nickel (Ni), manganese (Mn), titanium (Ti), vanadium (V), zinc (Zn), silver (Ag), calcium (Ca), palladium (Pd), platinum (Pt), ruthenium (Ru), samarium (Sm), tantalum (Ta), gadolinium (Gd), neodymium (Nd), silicon (Si), and cadmium (Cd).

These metal oxides can be used because they are oxides having a NaCl crystal structure that can include oxidizing compounds, and can realize a high MR rate of change. When the oxide layer 21 includes iron (Fe), a particularly high MR rate of change can be realized. When the oxide layer 21 includes iron (Fe), examples of addable elements that can be used include cobalt (Co), nickel (Ni), zinc (Zn), cadmium (Cd), stannous (Sn), indium (In), aluminum (Al), silicon (Si), magnesium (Mg), titanium (Ti), vanadium (V), chromium (Cr), manganese (Mn), cobalt (Co), nickel (Ni), copper (Cu), zirconium (Zr), ruthenium (Ru), palladium (Pd), platinum (Pt), silver (Ag), hafnium (Hf), calcium (Ca), rhodium (Rh), tungsten (W), molybdenum (Mo), calcium (Ca), and the like.

By including the addable elements described above, the band structure can be changed and high spin-dependent scattering can be realized. Additionally, by including these addable elements, excellent heat resistance can be obtained. The oxide materials described above include materials that display magnetism and materials that do not display magnetism, but both types are effective for intensifying spin-dependent scattering.

Here when using an oxide layer 21 that is a magnetic material, the oxide layer 21 itself will have spin-dependent bulk scattering and spin-dependent interfacial scattering. On the other hand, when using an oxide layer 21 that is a nonmagnetic material, because the nonmagnetic material contacts the metal ferromagnetic material, spin polarization occurs in the oxide layer of the nonmagnetic material due to the spin accumulation effect from the metal ferromagnetic material. In this case as well, high spin-dependent scattering can be realized. Particularly, when the metal oxide forming the oxide layer 21 includes iron (Fe) and zinc (Zn), a considerably high MR rate of change can be realized.

The oxide layer 21 is an oxide material having a spinel crystal structure and, when formed from a metal oxide including a divalent metal ion, can realize a high MR rate of change when an oxide material including at least one metal selected from iron (Fe), cobalt (Co), and nickel (Ni), and at least one material selected from the group consisting of zinc (Zn), cadmium (Cd), stannous (Sn) and indium (In) is used. The oxide materials described above include materials that display magnetism and materials that do not display magnetism, but both types are effective for intensifying spin-dependent scattering. Here when using an oxide layer that is a magnetic material, the oxide layer itself will display spin-dependent bulk scattering and spin-dependent interfacial scattering. On the other hand, when using an oxide layer that is a nonmagnetic material, because the nonmagnetic material contacts the metal ferromagnetic material, spin polarization occurs in the oxide layer of the nonmagnetic material due to the spin accumulation effect from the metal ferromagnetic material. In this case as well, high spin-dependent scattering can be realized. Particularly, when the metal oxide forming the oxide layer 21 includes iron (Fe) and zinc (Zn), a considerably high MR rate of change can be realized.

FIGS. 4A to 4K are cross-sectional views illustrating forming positions of the oxide layer among the main constituents the magneto-resistive effect device. The basic structures illustrated in FIGS. 4A to 4K include, from the bottom, the first magnetic layer 14, the spacer layer 16, and the second magnetic layer 18. Note that the structure may be inverted. In other words, the first magnetic layer 14 may be on the bottom or the second magnetic layer 18 may be on the bottom.

Figure 4A:
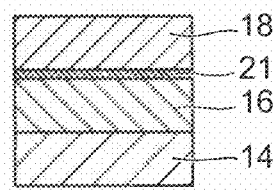
FIGS. 4A to 4K are cross-sectional views illustrating forming positions of the oxide layer among the main constituents the magneto-resistive effect device.
Figure 4B:
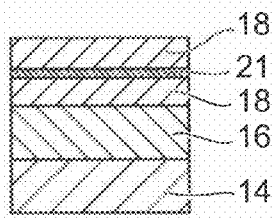
Figure 4C:
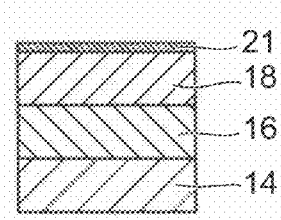
Figure 4D:
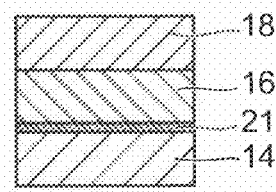
Figure 4E:
Figure 4F:
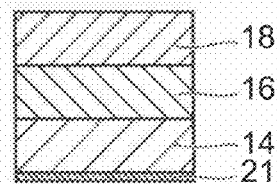
Figure 4G:
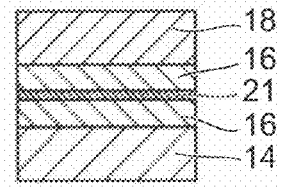
Figure 4H:
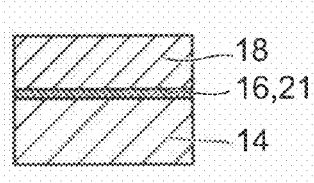
Figure 4I:
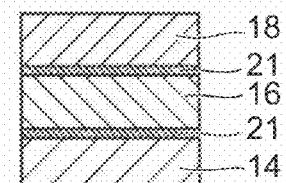
Figure 4J:
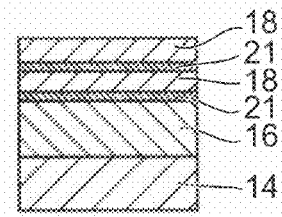
Figure 4K:
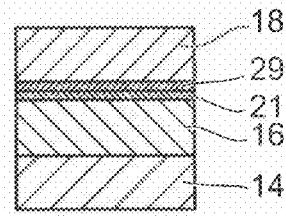

FIGS. 4A to 4K illustrate variations in the forming position of the oxide layer. Specifically, FIG. 4A illustrates a case in which the oxide layer is provided under the second magnetic layer or on top of the spacer layer; FIG. 4B illustrates a case in which the oxide layer is provided in the second magnetic layer; FIG. 4C illustrates a case in which the oxide layer is provided on top of the second magnetic layer; FIG. 4D illustrates a case in which the oxide layer is provided on top of the first magnetic layer or under the spacer layer; FIG. 4E illustrates a case in which the oxide layer is provided in the first magnetic layer; FIG. 4F illustrates a case in which the oxide layer is provided under the first magnetic layer; FIG. 4G illustrates a case in which the oxide layer is provided in the spacer layer; FIG. 4H illustrates a case in which an entirety of the spacer layer is the oxide layer; FIG. 4I illustrates a case in which the oxide layer is provided on top of the first magnetic layer or under the spacer layer and on top of the spacer layer or under the second magnetic layer; and FIG. 4J illustrates a case in which the oxide layer is provided under the second magnetic layer or on top of the spacer layer and is disposed in the second magnetic layer. FIG. 4K illustrates a case in which the oxide layer is disposed on top of the spacer layer and, furthermore, a nonmagnetic layer 29 is added between the oxide layer and the second magnetic layer.

In all of the structures illustrated in FIGS. 4A to 4K, the MR rate of change can be increased by providing the oxide layer 21. In other words, the oxide layer 21 can be provided at any position with regards to the first magnetic layer 14, the second magnetic layer 18, and the spacer layer 16.

Additionally, in order to form a uniform oxide layer, a thickness of the oxide layer 21 is preferably not less than 0.5 nm, and in order to suppress an increase in device resistance, is preferably not more than 4 nm.

As illustrated in FIGS. 4I and 4J, a plurality of layers of the oxide layer can be provided and a plurality of layers of the oxide layer can be provided in the first magnetic layer. Additionally, as illustrated in FIG. 4K, when the nonmagnetic layer 29 is provided between the oxide layer and the second magnetic layer, in order for the spin to accumulate from the magnetic layer to the oxide layer and a sufficient spin filtering effect to be exercised, a thickness of the nonmagnetic layer 29 is preferably not more than 2 nm.

Hereinafter, the magneto-resistive effect device according to an embodiment of the invention will be described with referring to the drawings.

Figure 5:
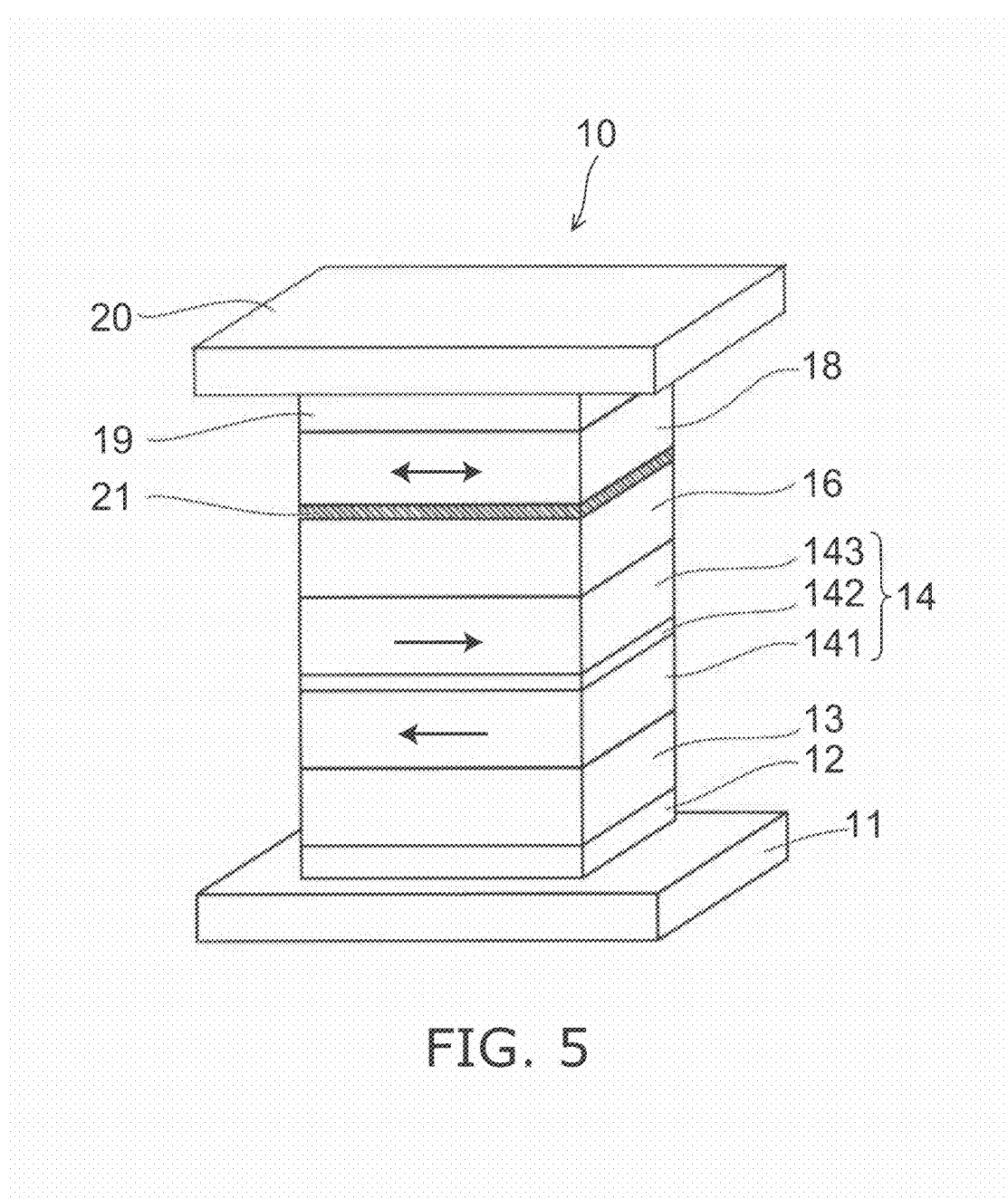
FIG. 5 is a perspective view illustrating the magneto-resistive effect device according to the first embodiment.

FIG. 5 is a perspective view illustrating the magneto-resistive effect device according to the first embodiment.

As illustrated in FIG. 5, with the magneto-resistive effect device 10 according to this embodiment, a bottom electrode 11 is provided, a base material layer 12 is provided on the bottom electrode 11, and a pinning layer 13 is provided on the base material layer 12. The base material layer 12 is, for example, constituted by a buffer layer and a seed layer that are stacked. The buffer layer is positioned on the bottom electrode 11 side and the seed layer is positioned on the pinning layer 13 side.

A pinned layer 14 in which the magnetization direction is fixed is provided on the pinning layer 13, and the spacer layer 16 is provided on the pinned layer 14. The spacer layer 16 includes a material formed from a nonmagnetic material.

A free layer 18 in which the magnetization direction rotates freely is provided on the spacer layer 16, and a cap layer 19 that protects the magneto-resistive effect device 10 from deterioration, such as oxidation and the like, is provided on the free layer 18.

A top electrode 20 is provided on the cap layer 19.

In order to feed current to the magneto-resistive effect device 10, a material having relatively low electrical resistance such as copper (Cu), gold (Au), or the like is used as a material for the bottom electrode 11 and the top electrode 20.

In this embodiment, the oxide layer 21 is provided under the free layer 18 or above the spacer layer 16.

In this embodiment, the bottom electrode 11 and the top electrode 20 feed current in a stacking direction of the magneto-resistive effect device 10. Current flows along the stacking direction in the magneto-resistive effect device 10 as a result of voltage being applied between the bottom electrode 11 and the top electrode 20. It is possible to detect changes in resistance caused by magneto-resistance effect due to the current flowing and, thus, detect magnetism.

The buffer layer mitigates roughness of the surface of the bottom electrode 11, and enhances the crystallinity of a layer stacked on the buffer layer. At least one metal selected from the group consisting of tantalum (Ta), titanium (Ti), vanadium (V), tungsten (W), zirconium (Zr), hafnium (Hf), and chromium (Cr) can be used as the buffer layer. Alloys of these can also be used. A thickness of the buffer layer is preferably not less than 1 nm and not more than 10 nm, and more preferably not less than 1 nm and not more than 5 nm. If the thickness of the buffer layer is insufficient, the buffering effect will be lost. On the other hand, if the thickness of the buffer layer is excessive, series resistance, which does not contribute to the MR rate of change, will increase. Note that when the seed layer that is formed on the buffer layer has buffering effects it is not absolutely necessary to provide the buffer layer. A preferable example thereof is one wherein a tantalum layer with a thickness of 1 nm is formed.

The seed layer controls the crystalline orientation and the crystal grain size of a layer stacked on the seed layer. Preferable examples of the seed layer include metals or the like with an fcc structure (face-centered cubic structure), a hcp structure (hexagonal close-packed structure), or a bcc structure (body-centered cubic structure).

For example, by using ruthenium (Ru) having a hcp structure or NiFe having an fcc structure as the seed layer, the crystalline orientation of the spin-valve film provided thereon can be adjusted to the fcc (111) orientation. Additionally, when the pinning layer 13 is IrMn, an excellent fcc (111) orientation is realized, and when the pinning layer 13 is PtMn, an ordered fct (111) structure (face-centered tetragonal structure) is obtained. Moreover, when an fcc metal is used as the free layer 18 and the pinned layer 14, an excellent fcc (111) orientation can be realized, and when a bcc metal is used as the free layer 18 and the pinned layer 14, an excellent bcc (110) orientation can be obtained. In order to sufficiently display functionality as a crystallinity orientation enhancing seed layer, a thickness of the seed layer is preferably not less than 1 nm and not more than 5 nm, and more preferably not less than 1 nm and not more than 3 nm. A preferable example thereof is one wherein a ruthenium layer having a thickness of 2 nm is formed.

Other examples of materials that can be used for the seed layer in place of ruthenium include NiFe based alloys (e.g. $Ni_xFe_{100-x}$ (where x=90% to 50% and preferably 75% to 85%) or NiFe to which a third element X is added and thus rendered nonmagnetic ($(Ni_xFe_{100-x})_{100-y}X_y$ (where X is Cr, V, Nb, Hf, Zr, or Mo)). With the NiFe based seed layer, it will be relatively simple to obtain excellent crystalline orientation, and a FWHM (full width half maximum) of the rocking curve can be configured to be from 3° to 5°.

The seed layer does not only function to enhance crystalline orientation, but also functions to control the crystal grain size of the spin-valve film. Specifically, the seed layer can control the crystal grain size of the spin-valve film so as to be not more than 5 nm and not less than 20 nm, and, can realize a high MR rate of change without inviting inconsistencies in characteristics even when the size of the magneto-resistive effect device is small.

Note that by configuring the crystal grain size of the seed layer to be not less than 5 nm and not more than 20 nm, electron irregular reflection and non-elastic scattering sites caused by crystal grain boundaries are reduced. In order to obtain the crystal grain size described above, the ruthenium layer is formed with a thickness of 2 nm. Additionally, in cases where ($(Ni_xFe_{100-x})_{100-y}Z_y$ (where Z is Cr, V, Nb, Hf, Zr, or Mo) is used, a composition y of a third element Z is configured to be from about 0% to 30% (including cases when y is 0), and a thickness thereof is preferably configured to be 2 nm.

The crystal grain size of the spin-valve film can be identified by the grain size of the crystal grains of the layer disposed between the seed layer and the spacer layer 16 (e.g. determination is possible using a cross-section TEM or the like). For example, with a bottom-type spin-valve film wherein the pinned layer 14 is positioned below the spacer layer 16, the crystal grain size of the spin-valve film can be identified by the crystal grain sizes of the pinning layer 13 (antiferromagnetic layer) and/or the pinned layer 14 (magnetization fixed layer) formed on the seed layer.

The pinning layer 13 imparts the ferromagnetic layer (that becomes the pinned layer 14) formed thereon with unidirectional anisotropy, and functions to pin the magnetizations. Examples of materials that can be used for the pinning layer 13 include antiferromagnetic materials such as IrMn, PtMn, PdPtMn, RuRhMn, and the like. Of these, IrMn is useful as a material for a head compatible with high memory densities. Unidirectional anisotropy can be applied to IrMn using a film with a smaller thickness than that of PtMn, and is suitable for reducing gap width that is necessary for high density recording.

The thickness of the pinning layer 13 is appropriately configured so as to impart unidirectional anisotropy of sufficient intensity. When the material of the pinning layer 13 is PtMn or PdPtMn, the film thickness thereof is preferably not less than 8 nm and not more than 20 nm, and more preferably not less than 10 nm and not more than 15 nm. When the material of the pinning layer 13 is IrMn, it is possible to impart unidirectional anisotropy with a smaller thickness than with the PtMn and the like, and a thickness thereof is preferably not less than 4 nm and not more than 18 nm, and more preferably not less than 5 nm and not more than 15 nm. A preferable example thereof is one wherein $Ir_{22}Mn_{78}$ is formed having a thickness of 7 nm.

In place of the antiferromagnetic layer, a hard magnetic layer can be used as the pinning layer 13. Examples of the hard magnetic layer that can be used include CoPt (where Co=50% to 85%), $(Co_xPt_{100-x})_{100-y}Cr_y$, (where x=50% to 85%, and y=0% to 40%), and FePt (where Pt=40% to 60%). Increases in series resistance and resistance area (RA) can be suppressed due to the electric resistivity of the hard magnetic layer (particularly CoPt) being relatively small.

Here, "resistance area RA" refers to a product of a cross-sectional area perpendicular to the stacking direction of the stacked films of the magneto-resistive effect device 10 and the resistance obtained from the pair of electrodes when current is fed perpendicular to the film surface of the stacked films of the magneto-resistive effect device 10.

The crystalline orientations of the spin-valve film and the pinning layer 13 can be measured via X-ray diffraction. Excellent orientation can be obtained by configuring the FWHM (full width half maximum) of the rocking curve at an fcc (111) peak of the spin-valve film, and a fct (111) peak or a bcc (110) peak of the pinning layer 13 (PtMn) to be from 3.5° to 6°. Note that an angular dispersion of this orientation can be determined from a diffraction spot using a cross-section TEM.

In the pinned layer 14, a lower pinned layer 141, a magnetic coupling layer 142, and an upper pinned layer 143 are stacked subsequently on the pinning layer 13 side.

The pinning layer 13 and the lower pinned layer 141 are magnetic exchange coupled so as to have unidirectional anisotropy. The lower pinned layer 141 and the upper pinned layer 143 that sandwich the magnetic coupling layer 142 are strongly coupled so that the orientation of the magnetizations are mutually antiparallel.

Examples of materials that can be used for the lower pinned layer 141 include $Co_xFe_{100-x}$ alloy (where x=0% to 100%), $Ni_xFe_{100-x}$ alloy (where x=0% to 100%), or the alloys described above to which a nonmagnetic element has been added. Additionally, examples of materials that can be used for the lower pinned layer 141 include single elements of Co, Fe, or Ni, and alloys thereof. Moreover, a $(Co_xFe_{100-x})_{100-y}B_x$ alloy (where x=0% to 100% and x=0% to 30%) can be used. An amorphous alloy such as $(Co_xFe_{100-x})_{100-y}B_x$ is preferably used because inconsistencies between devices can be suppressed when a device size of the magneto-resistive effect device is small.

A thickness of the lower pinned layer 141 is preferably not less than 1.5 nm and not more than 5 nm. Such a thickness acts to strongly maintain the unidirectional anisotropic magnetic field intensity caused by the pinning layer 13 and the antiferromagnetic coupling magnetic field between the lower pinned layer 141 and the upper pinned layer 143 via the magnetic coupling layer 142.

Additionally, if the lower pinned layer 141 is excessively thin, the thickness of the upper pinned layer 143, which affects the MR rate of change, will have to be reduced, thus leading to a decrease in the MR rate of change. On the other hand, if the lower pinned layer 141 is excessively thick, it will be difficult to obtain a sufficient unidirectional anisotropic magnetic field that is necessary for device actuation.

Additionally, the magnetic thickness (saturation magnetization Bs× thickness t (product of Bs·t)) of the lower pinned layer 141, when is taken into account, is preferably substantially equivalent to the magnetic thickness of the upper pinned layer 143. In other words, the magnetic thickness of the upper pinned layer 143 preferably corresponds to the magnetic thickness of the lower pinned layer 141.

For example, when the upper pinned layer 143 is $Fe_{50}Co_{50}$ (3 nm), the saturation magnetization of the $Fe_{50}Co_{50}$ at the thin film is about 2.2 T. Therefore, the magnetic thickness is 2.2 T×3 nm=6.6 Tnm. The saturation magnetization of $Co_{75}Fe_{25}$ is about 2.1 T. Therefore, a thickness t of the lower pinned layer 141 that imparts a magnetic thickness that is substantially equivalent to that described above is 6.6 Tnm/2.1 T=3.15 nm. Thus, in this case, $Co_{75}Fe_{25}$ having a thickness of about 3.2 nm is preferably used as the lower pinned layer 141.

Here the symbol "/" is used to designate the order in which constituents are stacked, from left to right. For example, in the case of Au/Cu/Ru, a Cn layer is stacked on an Au layer, and a Ru layer is stacked on the Cu layer. Additionally, the symbol "×2" is used to indicate two layers. For example, in the case of (Au/Cu)×2, a Cu layer is stacked on an Au layer, and another Au layer and Cu layer are subsequently stacked on the first Cu layer. Moreover, the square brackets "[ ]" indicate the thickness of the material being described.

The magnetic coupling layer 142 functions to cause antiferromagnetic coupling in the lower pinned layer 141 and the upper pinned layer 143 that sandwich the magnetic coupling layer 142 and, thus, form a synthetic pinned structure. Ru can be used as the magnetic coupling layer 142, and a thickness of the magnetic coupling layer 142 is preferably not less than 0.8 nm and not more than 1 nm. Note that a material other than Ru may be used so long as that material can cause sufficient antiferromagnetic coupling in the lower pinned layer 141 and the upper pinned layer 143 that sandwich the magnetic coupling layer 142. Instead of a thickness of the magnetic coupling layer 142 being not less than 0.8 nm and not more than 1 nm and corresponding to a 2nd peak of a RKKY (Ruderman-Kittel-Kasuya-Yosida) coupling, a thickness not less than 0.3 nm and not more than 0.6 nm corresponding to a 1st peak of the RKKY coupling can be used. An example by which stable coupling and characteristics with greater reliability can be obtained is a ruthenium layer having a thickness of 0.9 nm.

The upper pinned layer 143 is a magnetic layer that contributes directly to the MR effect, and both the material constituting the upper pinned layer 143 and the thickness thereof are important in obtaining a high MR rate of change.

$Fe_{50}Co_{50}$ can be used as the upper pinned layer 143. $Fe_{50}Co_{50}$ is a magnetic material with a bcc structure. This material has a large spin-dependent interfacial scattering effect, thus a high MR rate of change can be achieved. Examples of the FeCo based alloy with the bcc structure include $Fe_xCo_{100-x}$ (where x=30% to 100%) and $Fe_xCo_{100-x}$, to which another element has been added. From the perspective of satisfying all the requirements described above, a $Fe_{40}Co_{60}$ to a $Fe_{80}Co_{20}$ alloy is an example of a material that is easy to use.

If the upper pinned layer 143 is formed from the magnetic layer with the bcc structure, by which a high MR rate of change is easily realized, a total thickness of the magnetic layer is preferably not less than 1.5 nm. This is in order to maintain the bcc structure with stability. Since the material used for the spin valve film is commonly a metallic material with an fcc-structure or a fct-structure, only the upper pinned layer 143 can have a bcc-structure. Therefore, if the upper pinned layer 143 is excessively thin, it will be difficult to maintain the bcc structure with stability, resulting in a high MR rate of change being impossible to obtain.

Additionally, a $(Co_xFe_{100-x})_{100-y}B_X$ alloy (where x=0% to 100% and x=0% to 30%) can be used as the material for the upper pinned layer 143. An amorphous alloy such as $(Co_xFe_{100-x})_{100-y}B_X$ is preferably used because the issue of inconsistencies caused by the crystal grains between devices can be suppressed when a device size of the magneto-resistive effect device is small. Additionally, when using such an amorphous alloy, the upper pinned layer 143 can be formed into a flat film, thus leading to a flattening effect of the tunneling insulating layer formed on the upper pinned layer 143. Flattening of the tunneling insulating layer leads to being able to reduce the frequency of defects in the tunneling insulating layer, which is important for obtaining a high MR rate of change and a low resistance area. Particularly, when MgO is used as the material for the tunneling insulating layer, by using an amorphous alloy such as $(Co_xFe_{100-x})_{100-y}B_X$, the (100) orientation of the MgO layer formed thereon can be enhanced. The (100) orientation of the MgO layer is important for obtaining a high MR rate of change. Additionally, with the $(Co_xFe_{100-x})_{100-y}B_X$ alloy the MgO (100) plane crystallizes as a template when annealing. Therefore, excellent crystal alignment of the MgO and the $(Co_xFe_{100-x})_{100-y}B_X$ alloy can be obtained. Excellent crystal alignment is important for obtaining a high MR rate of change.

A greater thickness of the upper pinned layer 143 leads to ease in obtaining a high MR rate of change, but from the perspective of obtaining a large pinning magnetic field, a thin upper pinned layer 143 is preferable. Thus, there is a tradeoff relationship. For example, when using a FeCo alloy layer with a bcc structure, the thickness is preferably not less than 1.5 nm as it is necessary to stabilize the bcc structure. Additionally, when using a CoFe alloy layer with an fcc structure, the thickness is also preferably not less than 1.5 nm so as to obtain a high MR rate of change. On the other hand, in order to obtain a large pinning magnetic field, a maximum thickness of the upper pinned layer 143 is preferably not more than 5 nm, and more preferably not more than 4 nm. As described above, the thickness of the upper pinned layer 143 is preferably not less than 1.5 nm and not more than 5 nm, and more preferably not less than 2.0 nm and not more than 4 nm.

In place of the magnetic material with the bcc structure, a conventional $Co_{90}Fe_{10}$ alloy with an fcc structure, Co with an hcp structure, or a Co alloy that is widely used in conventional magneto-resistive effect devices can be used for the upper pinned layer 143. Elemental metals such as Co, Fe, Ni, or the like or alloy materials including any one of these elements can be used as the upper pinned layer 143. A FeCo alloy material with a bcc structure, a cobalt alloy with not less than 50% cobalt content, and a Ni alloy with not less than 50% Ni content are preferable as the magnetic material of the upper pinned layer 143 as a high MR rate of change can be obtained.

Additionally, a Heusler magnetic alloy layer formed from $Co_2MnGe$, $Co_2MnSi$, $Co_2MnAl$, or the like can be used as the upper pinned layer 143.

The spacer layer 16 splits the magnetic coupling of the pinned layer 14 and the free layer 18. A nonmagnetic metal layer including at least one element selected from copper (Cu), silver (Ag), and gold (Au); or a CCP spacer layer or a tunneling insulating spacer layer is formed as the spacer layer 16. When using a CCP spacer layer, a structure having, for example, a copper (Cu) metal path in an aluminum oxide ($Al_2O_3$) insulating layer can be used. When using a tunneling insulating layer, for example, magnesium oxide (MgO), aluminium oxide ($Al_2O_3$), titanium oxide ($TiO_2$), zinc oxide (ZnO), or the like can be used.

The oxide layer 21 is formed on top of the spacer layer 16 or under the second magnetic layer 18. An example of a method for forming the oxide layer 21 is given hereinafter. In this example, a case is described, as an example, in which a Zn—Fe oxide with a NaCl structure and a Zn—Fe oxide with a spinel structure expressed by $(Zn-Fe)_XO_Y$ (where Y/X≤4/3) are used as the material for the oxide layer 21. First, a metal layer including Fe and Zn is formed on the spacer layer 16. Here, the metal layer including Fe and Zn may be a stacked body of a Fe layer and a Zn layer in an arrangement such as Fe/Zn, Zn/Fe, or (Fe/Zn)×2, or may be a single layer of an alloy such as $Zn_{20}Fe_{80}$.

Next, the metal material including Zn and Fe is subjected to oxidation treatment. Examples of the oxidation treatment that can be used include ion assisted oxidation (IAO) wherein oxidation is performed by supplying oxygen while irradiating the metal material layer with an ion beam of an inert gas or the like, or plasma. Additionally, in the ion assisted oxidation process described above, oxygen gas may be ionized or plasmatized. As a result of the energy assistance to the metal material layer via the ion beam irradiation, a stable, uniform oxide layer 21 can be formed.

Additionally, the metal material layer forming and oxidation treatment described above may be repeated multiple times when forming a layer of the oxide layer 21. In this case, an oxide layer 21 having a given thickness is not fabricated by a single process of forming and oxidizing, rather the thickness is preferably divided and thin metal material layers are subjected to the oxidation treatment. Additionally, the metal material layer including Zn and Fe may be naturally oxidized through exposure to an oxygen atmosphere. However, a method of oxidation using energy assistance is preferable from the perspective of forming a stable oxide. Furthermore, when the metal material including Zn and Fe is arranged as a stacked body, oxidation is preferably performed while irradiating with an ion beam as such leads to the forming of an oxide layer 21 wherein Zn and Fe are blended evenly.

When using an ion beam of an inert gas or the like, or plasma, a gas including at least one selected from the group consisting of, for example, argon, xenon, helium, neon, and krypton can be used as the inert gas.

Note that aside from ion beam irradiation, heat treatment or the like may be performed as the method of energy assistance. In this case, for example, oxygen may be supplied while heating the metal material layer, after forming, at a temperature of from 100° C. to 300° C.

Hereinafter, beam conditions when using ion beam irradiation as the energy assistance method in the oxidation treatment for forming the oxide layer 21 are described. With the oxidation treatment, in cases of ionizing or plasmatizing the inert gas described above and irradiating therewith when forming the oxide layer 21, an acceleration voltage V thereof is preferably set to from 30 V to 130 V and a beam current Ib is preferably set to from 20 mA to 200 mA. These conditions are markedly weaker than conditions used when performing ion beam etching. The oxide layer 21 can be formed in the same manner even when using a plasma such as RF plasma or the like in place of the ion beam.

An angle of incidence is defined as 0° when the ion beam is irradiated perpendicular to the film face and 90° when irradiated parallel to the film face, and the angle of incidence varies arbitrarily in a range from 0° to 90°. A treatment time by this process is preferably from 15 seconds to 1,200 seconds, and from the perspectives of controllability and the like, is more preferably not less than 30 seconds. It is not preferable that the treatment time is excessively long because such leads to inferior productivity of the magneto-resistive effect device. From these perspectives, the treatment time is preferably from 30 seconds to 600 seconds.

When oxidation treating using ions or plasma, an amount of oxygen exposure in cases of IAO is preferably from $1 \times 10^3$ to $1 \times 10^4$ L (Langmiur; 1 L=$1 \times 10^{-6}$ Torr×sec). In cases of natural oxidation the amount of oxygen exposure is preferably from $3 \times 10^3$ L to $3 \times 10^4$ L.

After the oxidation treatment described above, a reduction treatment that uses a reducing gas may be performed. Examples of the reducing gas that can be used include gases that contain at least one of ions, plasma, or radicals of argon, helium, neon, krypton, or xenon; or molecules, ions, or plasma of hydrogen or nitrogen. Particularly, a gas that contains at least one of ions or plasma of argon, helium, neon, krypton, or xenon; or ions or plasma of hydrogen or nitrogen is preferably used as the reducing gas. Furthermore, a gas containing at least one of ions or plasma of argon is preferably used as the reducing gas.

An oxygen concentration of the film formed from an oxidation treated base material can be adjusted through the reduction treatment, and the structure thereof can be adjusted to have an oxygen concentration at which the strongest spin-dependent scattering is displayed. In a third process, the reduction treatment can be performed while heating the film formed from the oxidation treated base material. For example, reduction treatment can be performed on a base material that has been heated to from 100° C. to 300° C. The heating enhances the effectiveness of the reduction treatment.

Here, the reduction treated film can be further subjected to moisture removal treatment such as argon ion irradiation, argon plasma irradiation, heating, or the like. Thereby, moisture that is produced at reduction treatment can be removed.

Additionally, in the fabrication of the oxide layer 21, after the process described above is completed, the oxidation treatment and the reduction treatment may be repeated. By alternating the produced moisture removal and the reduction treatment, the film can be more effectively reduced.

Beam conditions for the reduction treatment, particularly when performing Ar ion beam irradiation, are described below. With the reduction treatment, in cases of ionizing or plasmatizing the inert gas described above and irradiating therewith when forming the oxide layer 21, the acceleration voltage V thereof is preferably set to from 30 V to 130 V and the beam current Ib is preferably set to from 20 mA to 200 mA. These conditions are markedly relaxed compared to conditions used when performing ion beam etching.

The oxide layer 21 can be formed in the same manner even when using a plasma such as RF plasma or the like in place of the ion beam. An angle of incidence is defined as 0° when the ion beam is irradiated perpendicular to the film face, and 90° when irradiated parallel to the film face. Thus, the angle of incidence varies arbitrarily in a range from 0° to 90°. A treatment time by this process is preferably from 15 seconds to 1,200 seconds, and from the perspectives of controllability and the like, is more preferably not less than 30 seconds. It is not preferable that the treatment time is excessively long because such leads to inferior productivity of the magneto-resistive effect device. From these perspectives, the treatment time is preferably from 30 seconds to 600 seconds.

In the oxidation treatment and the reduction treatment described above, as a result of performing appropriate energy assistance, a Zn—Fe oxide with a NaCl structure and a Zn—Fe oxide with a spinel structure expressed by $(Zn-Fe)_XO_Y$ (where Y/X≤4/3) can be produced. Specifically, when ion beam assistance oxidation treatment is performed, in cases of ionizing or plasmatizing the inert gas described above and irradiating therewith when forming the oxide layer 21, the acceleration voltage V thereof is preferably set to from 40 V to 130 V and the beam current Ib is preferably set to from 40 mA to 200 mA.

When using a plasma such as RF plasma or the like in place of the ion beam, a plasma voltage thereof is preferably set to from 20 W to 200 W. Additionally, in the reduction treatment, particularly with AR ion beam irradiation is performed, the acceleration voltage V thereof is preferably set to from 40 V to 130 V and the beam current Ib is preferably set to from 40 mA to 200 mA. When using a plasma such as RF plasma or the like in place of the ion beam, a plasma voltage thereof is preferably set to from 20 W to 200 W.

The free layer 18 is a layer having a ferromagnetic material wherein the magnetization direction changes due to an external magnetic field. For example, a bilayer configuration $Co_{90}Fe_{10}$ [1 nm]/$Ni_{83}Fe_{17}$ [3.5 nm] using CoFe formed on the interface and NiFe can be used. When not using the NiFe layer, a monolayer of $Co_{90}Fe_{10}$ [4 nm] can be used. Additionally, a free layer 18 having a triple-layer configuration such as CoFe/NiFe/CoFe or the like can also be used.

Of CoFe alloys, from the perspective of having stable soft magnetic properties, $Co_{90}Fe_{10}$ is preferably used for the free layer 18. When using a CoFe alloy that is in the neighborhood of $Co_{90}Fe_{10}$, a thickness thereof is preferably not less than 0.5 nm and not more than 4 nm. Additionally, $Co_xFe_{100-x}$ (where x=70% to 90%) can be used.

Moreover, a stacked body having a plurality of alternately stacked CoFe layers or Fe layers having a thickness of not less than 1 nm and not more than 2 nm and ultrathin Cu layers having a thickness of not less than 0.1 nm and not more than 0.8 nm may be used as the free layer 18.

Additionally, an amorphous magnetic layer formed from CoZrNb or the like may be used as a portion of the free layer 18. However, when using an amorphous magnetic layer, a magnetic layer with a crystalline structure must be used for the interface contacting the spacer layer 16 that greatly affects the MR rate of change.

From the spacer layer 16 side, the structure of the free layer 18 may be configured in the following manners. Specifically, (1) crystal layer only, (2) crystal layer/amorphous layer stacked body, (3) crystal layer/amorphous layer/crystal layer stacked body, and the like can be considered for the structure of the free layer 18. What is important is that with any of (1) to (3), a crystal layer must be in contact at the interface with the spacer layer 16.

The cap layer 19 functions to protect the spin-valve film. The cap layer 19 can be configured from, for example, a plurality of metal layers, and can, for example, have a two-layer structure formed from a Cu layer and a Ru layer (Cu [1 nm]/Ru [10 nm]). Additionally, an Ru/Cu layer or the like wherein Ru is disposed on the free layer 18 side can be used as the cap layer 19. In this case, a thickness of the Ru is preferably not less than 0.5 nm and not more than 2 nm. The cap layer 19 having such a configuration is particularly preferable in cases where the free layer 18 is formed from NiFe. This is because Ru and Ni are in an immiscible relationship and therefore magnetostriction of an interfacial mixing layer formed between the free layer 18 and the cap layer 19 can be reduced.

Regardless of whether the cap layer 19 is Cu/Ru or Ru/Cu, the thickness of the Cu layer is preferably not less than 0.5 nm and not more than 10 nm and the thickness of the Ru layer can be configured to be not less than 0.5 nm and not more than 5 nm. Since a specific resistance value of Ru is high, it is not preferable to use a Ru layer having a great thickness. Therefore, configuring the thickness to be within the range described above is preferable.

Other metal layers may be provided in place of the Cu layer and/or the Ru layer for use as the cap layer 19. The configuration of the cap layer 19 is not particularly limited, and other materials may be used so long as the materials can protect the spin-valve film as a cap. However, care is needed as the MR rate of change and long-term reliability may vary based on the selection of the cap layer. From this perspective, Cu and Ru are examples of preferable cap layer materials.

Next, actuation of the magneto-resistive effect device according to the first embodiment will be described.

In FIG. 5, the bottom electrode 11 and the top electrode 20 feed current in the stacking direction of the magneto-resistive effect device 10. It is possible to detect changes in resistance caused by magneto-resistance effect due to the current flowing.

Next, the effects of the magneto-resistive effect device according to the first embodiment will be described while making a comparison with Comparative Examples.

The magneto-resistive effect device 10 according to the first embodiment was fabricated and the RA value and MR rate of change thereof were evaluated. Specifically, as illustrated in FIG. 5, the oxide layer 21 was provided on top of the spacer layer 16 or under the free layer 18.

Configurations of the magneto-resistive effect device 10 formed in this embodiment are described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Zn—Fe—O [1.5 nm]
Free layer 18: $Fe_{50}Co_{50}$ [3 nm]

The oxide layer 21 was fabricated by first depositing 1 nm of Fe on the spacer layer 16 and then depositing 0.6 nm of Zn thereon. Next, the oxide layer 21 was formed by converting the deposited Fe and Zn to a mixed oxide of Zn and Fe (hereinafter referred to as "Zn—Fe—O") by surface oxidation.

Additionally, a magneto-resistive effect device wherein the oxide layer 21 was not provided was fabricated as a Comparative Example for this embodiment. A film structure thereof was as follows.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Free layer 18: $Fe_{50}Co_{50}$ [4 nm]

These layers were stacked and, thereafter, were annealed for five hours at 280° C. Thereafter, the bottom electrode 11 and the top electrode 20 were formed.

As a result of arduous investigation into the conditions for surface oxidizing the oxide layer 21, the inventors succeeded in fabricating oxide layers with differing crystalline structures.

Table 1 shows the MR rate of change and the resistance area of the magneto-resistive effect device according to the first embodiment where the forming process of the oxide layer 21 and the structure of the oxide layer were changed.

TABLE 1

| | Oxide layer forming process | Oxide layer structure | MR [%] | RA [$\Omega\mu m^2$] |
|---|---|---|---|---|
| Comparative Example 1-1 | None | — | 1.5 | 0.05 |
| Comparative Example 1-2 | Fe10Å/Zn6Å sputter-formed → Low acceleration IAO (Vb = 60 b, Ib = 60 mA) | Spinel structure $\gamma$-$(Fe_{85}Zn_{15})_2O_3$ | 3.5 | 0.22 |
| Working Example 1-1 | Fe10Å/Zn6Å sputter-formed → Low acceleration IAO (Vb = 60 b, Ib = 60 mA) → Then, Ar plasma irradiation (60 W) | NaCl structure $(Fe_{85}Zn_{15})O_x$ (Wustit) | 18.5 | 0.2 |
| Working Example 1-2 | Fe10Å/Zn6Å sputter-formed → High acceleration IAO (Vb = 80b, Ib = 60 mA) | NaCl structure $(Fe_{85}Zn_{15})O_x$ (Wustit) | 18.2 | 0.2 |
| Working Example 1-3 | Fe10Å/Zn6Å sputter-formed → Low acceleration IAO (Vb = 60 b, Ib = 60 mA) → Then, Ar plasma irradiation (20 W) | Spinel structure $(Fe_{85}Zn_{15})_3O_4$ | 11 | 0.21 |

As shown in Table 1, Comparative Example 1-1 is an example of a magneto-resistive effect device in which the oxide layer 21 is not formed. Comparative Example 1-2 is an example of a magneto-resistive effect device in which the oxide layer 21 is formed by depositing, by a sputtering method, 1.0 nm of iron (Fe) and 0.6 nm of zinc (Zn), and then performing ion beam assisted oxidation under low acceleration IAO beam conditions (acceleration voltage Vb=60 V, beam current Ib=60 mA). The formed oxide layer 21 had a spinel crystal structure and was a $\gamma$-$(Fe_{85}Zn_{15})_2O_3$ layer.

Working Example 1-1 is an example of a magneto-resistive effect device in which the oxide layer 21 is formed by depositing, by a sputtering method, 1.0 nm of iron (Fe) and 0.6 nm of zinc (Zn), and then performing ion beam assisted oxidation under low acceleration IAO beam conditions (acceleration voltage Vb=60 V, beam current Ib=60 mA). Furthermore, after the ion beam assisted oxidation, input power of the argon (Ar) plasma when irradiating was set to high acceleration conditions (60 W). The formed oxide layer 21 had a NaCl crystal structure and was a $(Fe_{85}Zn_{15})O_x$ layer or, rather, a Wustit iron oxide layer.

Working Example 1-2 is an example of a magneto-resistive effect device in which the oxide layer 21 is formed by depositing, by a sputtering method, 1.0 nm of iron (Fe) and 0.6 nm of zinc (Zn), and then performing ion beam assisted oxidation under high acceleration IAO beam conditions (acceleration voltage Vb=80 V, beam current Ib=60 mA). The formed oxide layer 21 had a NaCl crystal structure and was a $(Fe_{85}Zn_{15})O_x$ layer or, rather, a Wustit iron oxide layer.

Working Example 1-3 is an example of a magneto-resistive effect device in which the oxide layer 21 is formed by depositing, by a sputtering method, 1.0 nm of iron (Fe) and 0.6 nm of zinc (Zn), and then performing ion beam assisted oxidation under low acceleration IAO beam conditions (acceleration voltage Vb=60 V, beam current Ib=60 mA). Furthermore, after the ion beam assisted oxidation, input power of the argon (Ar) plasma when irradiating was set to low acceleration conditions (20 W). The formed oxide layer 21 had a spinel structure and was a $(Fe_{85}Zn_{15})_3O_4$ layer.

The Zn—Fe oxide of the oxide layer 21 of the magneto-resistive effect device according to this embodiment has a structure such as $(Zn—Fe)_1O_1$ having a NaCl structure, $(Zn—Fe)_3O_4$ having a spinel structure, $\gamma$-$(Zn—Fe)_2O_3$ also having a spinel structure, or the like. The structures are listed in order of oxygen content, from least to greatest. These three oxides have the same basic cubic crystal structure and, therefore, are a material system in which continuous structural change due to oxidation and reduction reactions is seen. Due to the oxidation/reduction conditions, structures having oxygen contents with midpoint stoichiometric oxygen numbers are continuously realized. As shown in Table 1, in this embodiment, the inventors succeeded in fabricating the three structures described above through investigation into the conditions of surface oxidation.

The structures of the Zn—Fe—O oxide layers fabricated for Working Examples 1-1 to 1-3 and Comparative Example 1-2 under different surface oxidation conditions were evaluated using an X-ray diffraction method and XPS analysis. In the X-ray diffraction method, in order to accurately identify the crystalline structure of the oxide, a test material, formed by repeating the forming process of the Zn—Fe—O layer was 30 times, including a roughly 45 nm Zn—Fe—O layer on a Ta [5 nm]/Cu [5 nm] base material, was used.

Figure 6A:
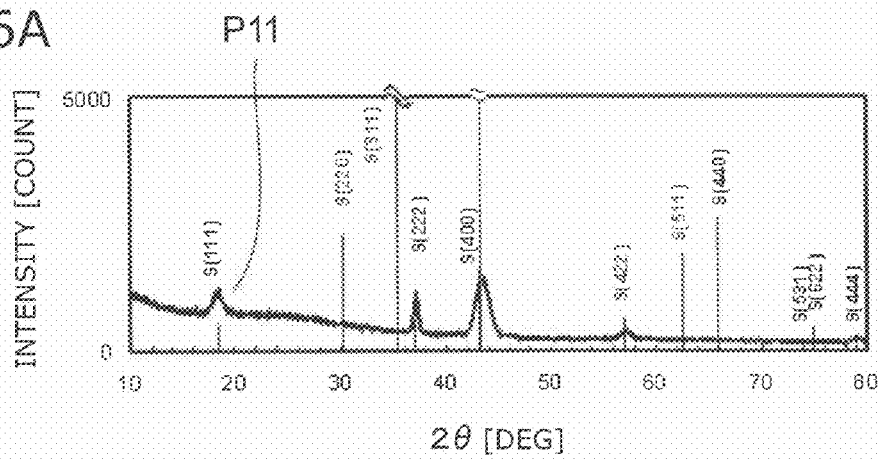
FIG. 6A is a graph showing an X-ray diffraction profile of the oxide layer 21 for Comparative Example 1-2 according to the first embodiment.
Figure 6B:
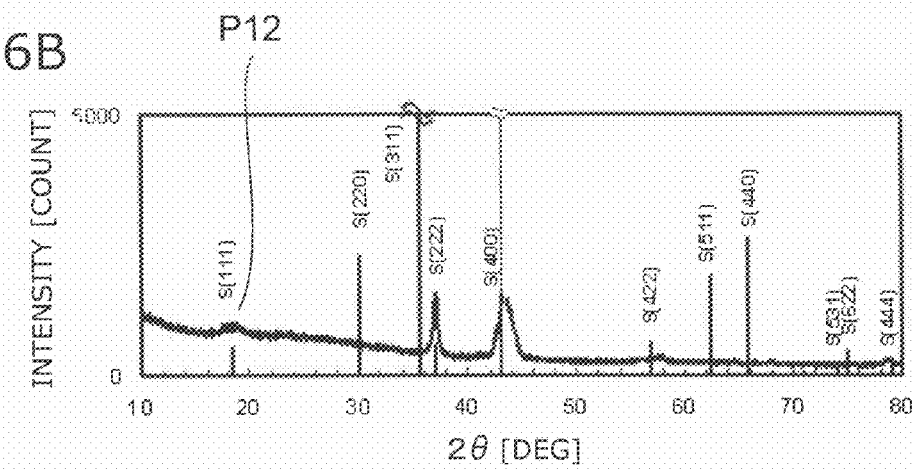
FIG. 6B is a graph showing an X-ray diffraction profile of the oxide layer 21 for Working Example 1-3 according to the first embodiment.
Figure 6C:
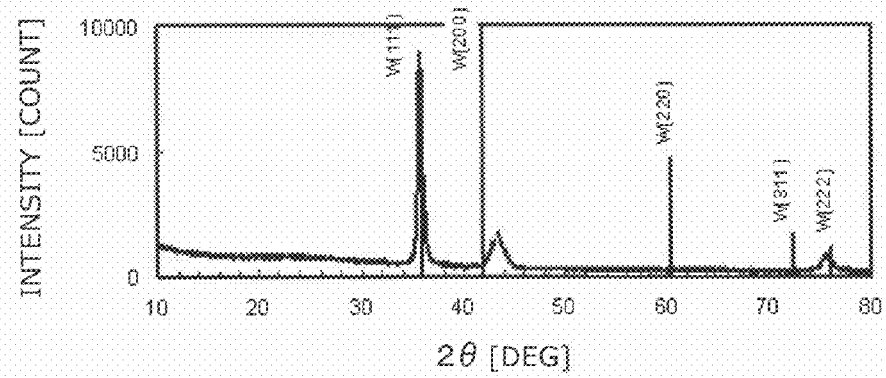
FIG. 6C is a graph showing an X-ray diffraction profile of the oxide layer 21 for Working Example 1-1 according to the first embodiment.

FIG. 6A is a graph showing an X-ray diffraction profile of the oxide layer 21 for Comparative Example 1-2 according to the first embodiment, FIG. 6B is a graph showing an X-ray diffraction profile of the oxide layer 21 for Working Example 1-3 according to the first embodiment, and FIG. 6C is a graph showing an X-ray diffraction profile of the oxide layer 21 for Working Example 1-1 according to the first embodiment. $2\theta$ is shown on the horizontal axis and intensity is shown on the vertical axis.

Figure 7A:
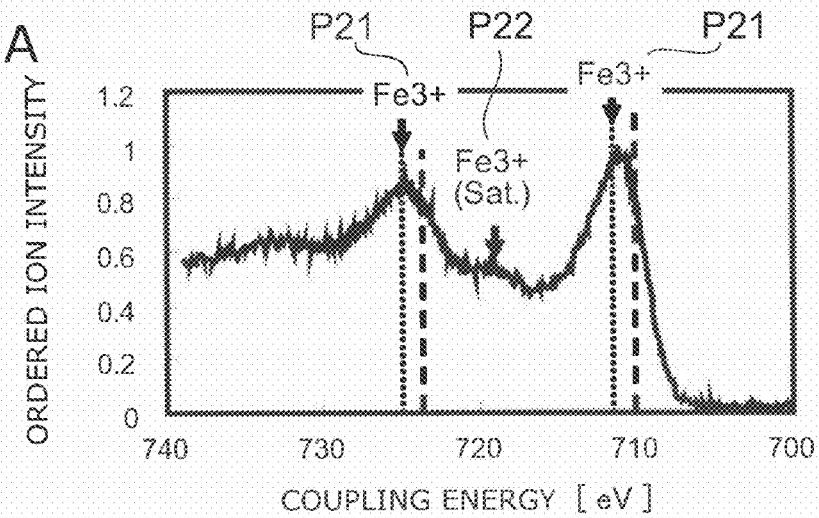
FIG. 7A is a graph showing a Fe 2p XPS spectra for Comparative Example 1-2 according to the first embodiment.
Figure 7B:
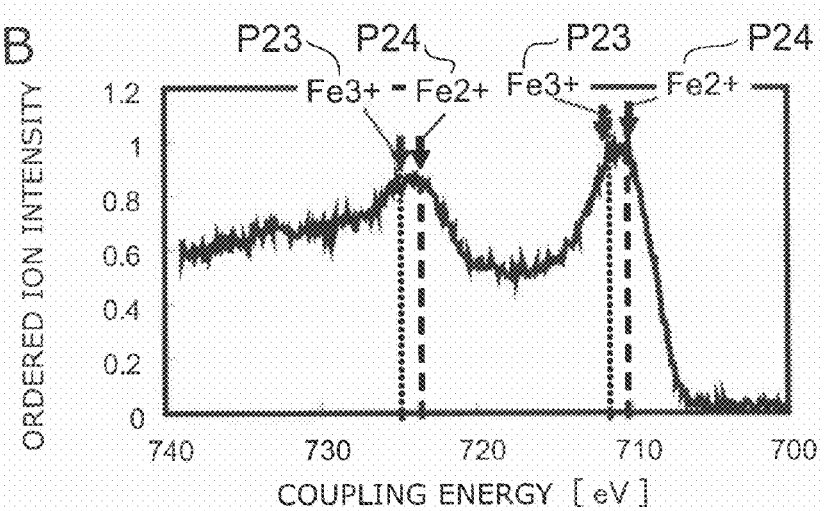
FIG. 7B is a graph showing a Fe 2p XPS spectra for Working Example 1-3 according to the first embodiment.
Figure 7C:
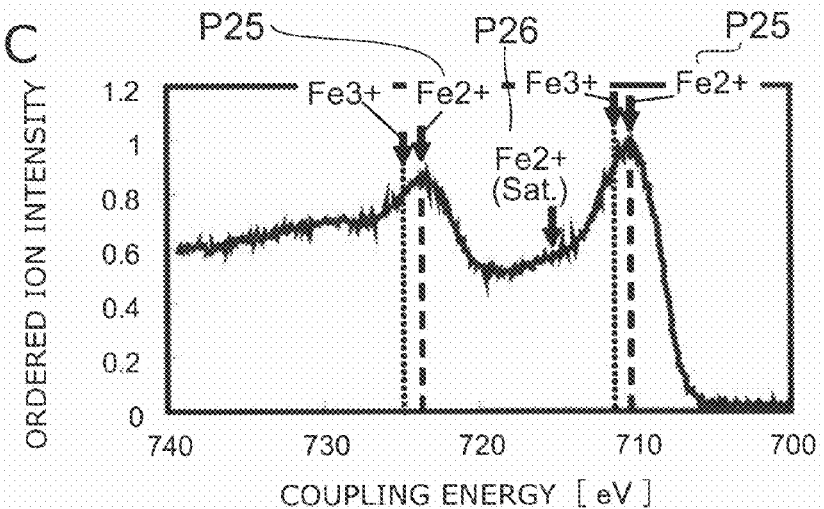
FIG. 7C is a graph showing a Fe 2p XPS spectra for Working Example 1-1 according to the first embodiment.

FIG. 7A is a graph showing a Fe 2p XPS spectra for Comparative Example 1-2 according to the first embodiment, FIG. 7B is a graph showing a Fe 2p XPS spectra for Working Example 1-3 according to the first embodiment, and FIG. 7C is a graph showing a Fe 2p XPS spectra for Working Example 1-1 according to the first embodiment. Coupling energy is shown on the horizontal axis and intensity is shown on the vertical axis.

As shown in FIG. 6A, the Zn—Fe—O oxide layer formed by only the low acceleration IAO process (Comparative Example 1-2) was identified as having a spinel structure due to a peak P11 that is unique to spinel structures occurring near $20°$ of the $2\theta$ in the X-ray diffraction.

Additionally, as shown in FIG. 7A, the iron ions of this oxide layer 21 were identified as being mainly trivalent due to the Fe 2p spectra of the Zn—Fe—O oxide layer formed by only the low acceleration IAO process (Comparative Example 1-2) matching a $Fe^{3+}$ peak P21 occurring near 712 and 725 eV of the coupling energy in the XPS analysis and due to a $Fe^{3+}$ satellite peak P22 occurring near 718 eV. In other words it was identified that an oxidation number of the oxide layer of Comparative Example 1-2 was $(Zn—Fe)_2O_3$, and that the spinel structure was the $\gamma$-$(Zn—Fe)_2O_3$ type.

Next, as shown in FIG. 6B, the Zn—Fe—O oxide layer formed by the low acceleration IAO process and then the high acceleration Ar plasma irradiation (Working Examples 1-3) was identified as having a spinel structure due to a peak P12 that is unique to spinel structures occurring near $20°$ of the $2\theta$ in the X-ray diffraction, the same as in FIG. 6A. However, as shown in FIG. 7B the Fe 2p spectra of the Zn—Fe—O oxide layers of Working Examples 1-3 has a $Fe^{2+}$ peak P24 occurring near 710 and 723 eV of the coupling energy in the XPS analysis in addition to the $Fe^{2+}$ peak P23 occurring near 712 and 725 eV of the coupling energy in the XPS analysis. Due to both the peak P23 and P24 being identified, it is clear from that this oxide layer 21 has divalent and trivalent iron ions. In other words, it was identified that an oxidation number of the oxide layer of Working Examples 1-3 was $(Zn—Fe)_3O_4$, and that the spinel structure was the $(Zn—Fe)_3O_4$ type.

Next, as shown in FIG. 6C, the Zn—Fe—O oxide layer formed by the low acceleration IAO process and then the high acceleration Ar plasma irradiation (Working Example 1-1) was identified as having a NaCl structure, specifically due to the absence of a peak that is unique to spinel structures. Additionally, as shown in FIG. 7C, the iron ions of this oxide layer 21 were identified as being mainly divalent due to the Fe 2p spectra of the Zn—Fe—O oxide layer formed by the low acceleration IAO process and then the high acceleration Ar plasma irradiation matching a $Fe^{2+}$ peak P25 occurring near 710 and 723 eV of the coupling energy in the XPS analysis and due to a $Fe^{2+}$ satellite peak P26 occurring near 715 eV. In other words, the oxidation number of the oxide layer 21 of Working Example 1-1 was identified as being $(Zn—Fe)O_x$ (where $x\approx1$). In other words, the Zn—Fe—O oxide layer of Working Example 1-1 was identified as having a NaCl structure (commonly referred to as "Wustit" when including Fe) with the lowest oxygen content of the three crystalline structures described above.

The Zn—Fe—O oxide layer of Working Example 1-2 wherein the high acceleration IAO process was performed was identified as having a NaCl structure through the same type of analysis. Additionally, the oxidation number of Working Example 1-2 was found to be a number between $(Zn—Fe)O_x$ (where $x\approx1$) and $(Zn—Fe)_3O_4$. Moreover, all of the crystalline orientations of Working Examples 1-1 to 1-3 and Comparative Example 1-2 were identified as being (111) orientations of a cubic system.

As shown in Table 1, each of the magneto-resistive effect devices of Working Examples 1-1 to 1-3 and Comparative Example 1-2, wherein the Zn—Fe—O oxide layer was inserted as a spin filtering layer, displayed a higher MR rate of change than Comparative Example 1-1, wherein the device was not provided with a spin filtering layer. The NaCl structures or, rather, the magneto-resistive effect devices provided with the Zn—Fe—O oxide layer with the $(Zn—Fe)_3O_4$ type spinel structure illustrated in Working Examples 1-1 to 1-3 displayed a higher MR rate of change than the $\gamma$-$(Zn—Fe)_2O_3$ type spinel structure illustrated in Comparative Example 1-2. Furthermore, the devices of Working Example 1-1 and 1-2, wherein the Zn—Fe—O oxide layer with the NaCl structure was provided displayed higher MR rates of change than the devices wherein the Zn—Fe—O oxide layer with the (Zn—Fe)$_3$O$_4$ type spinel structure was provided.

From the results described above, it was confirmed that the MR rate of change is enhanced profoundly by inserting, in the magneto-resistive effect device, an oxide layer with a NaCl structure or a Me$_X$O$_Y$ type spinel structure (where Y/X≤4/3) as the spin filtering layer.

Figure 8:
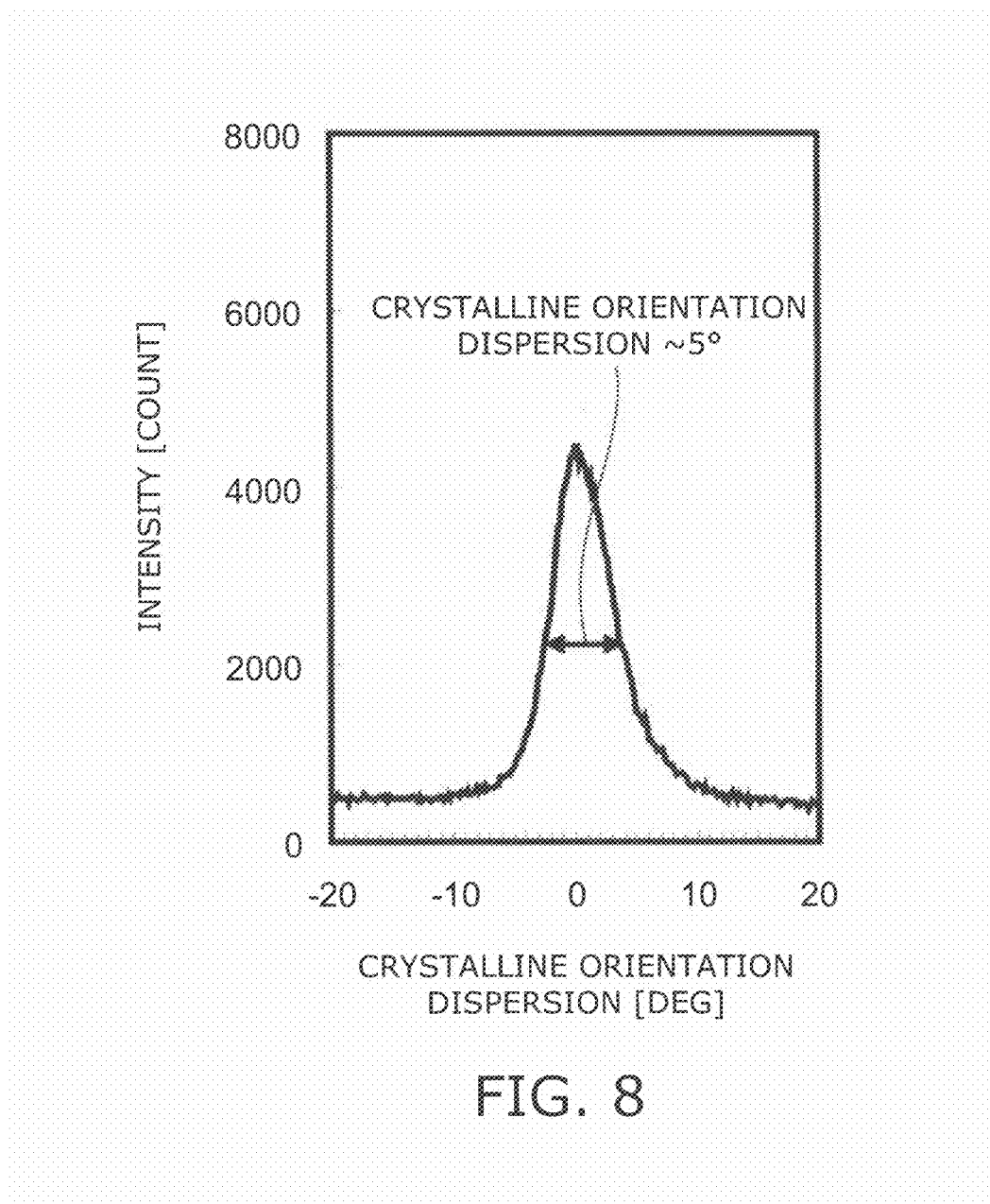
FIG. 8 is a graph showing a profile of crystalline orientation dispersion of the oxide layer of Working Example 1-1 according to the first embodiment.

FIG. 8 is a graph showing a profile of crystalline orientation dispersion of the oxide layer of Working Example 1-1 according to the first embodiment. A flapping angle is shown on the horizontal axis and intensity is shown on the vertical axis.

Results of using an X-ray analyzer to measure a crystalline orientation dispersion angle of the oxide layer of Working Example 1-1, wherein 2θ-θ was constant as the value of the NaCl (111) plane and a flapping angle ω was varied, are shown. From FIG. 7, the crystalline orientation dispersion angle of the oxide layer of Working Example 1-1 was 5°. A smaller crystalline orientation dispersion angle is preferable because a high MR rate of change can be obtained. The crystalline orientation dispersion angle is preferably not more than 10°, and more preferably not more than 5°, as in Working Example 1-1.

Figure 9A:
FIG. 9A is a TEM image illustrating a cross-section of the magneto-resistive effect device of Working Example 1-1 according to the first embodiment.

FIG. 9A is a TEM image illustrating a cross-section of the magneto-resistive effect device 10 of Working Example 1-1 according to the first embodiment. As illustrated in FIG. 9A, it was confirmed that the oxide layer 21 is formed uniformly between the spacer layer 16 and the free layer 18.

Figure 9B:
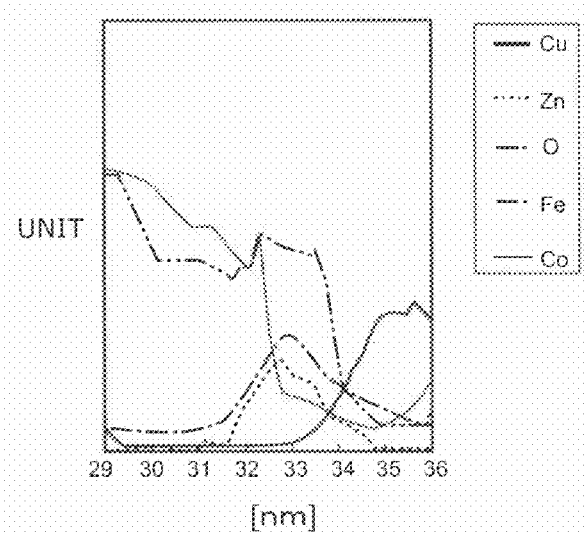
FIG. 9B is a graph showing an EDX line analysis that corresponds to FIG. 9A.
Figure 9B:
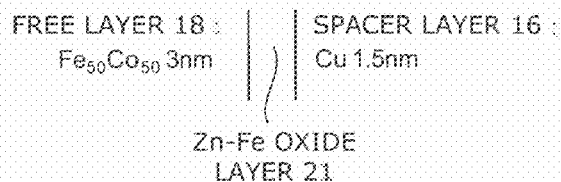

FIG. 9B is a graph showing an EDX line analysis that corresponds to FIG. 9A. The vertical direction or, rather, the depth of the stacked body of the image shown in FIG. 9A, is shown on the vertical axis, and the concentration of each element is shown on the vertical axis. As shown in FIG. 9B, Zn, Fe, and O peaks match at a location corresponding to the oxide layer 21. It is clear that, when forming the film having a stacked structure such as Fe [1 nm]/Zn [0.6 nm], an oxide layer is produced in which the Zn and the Fe are completely blended as a result of providing the energy assistance during surface oxidation. Each magneto-resistive effect device according to the invention was identified as having a similar uniform oxide layer by TEM image and EDX line analysis.

The crystalline structure of the oxide layer 21 described above can also be analyzed by taking a nanodiffraction pattern by irradiating the oxide layer portion of the cross-section TEM test material of the magneto-resistive effect device 10 with an electron beam narrowed to a diameter of about 1 nm.

Figure 10:
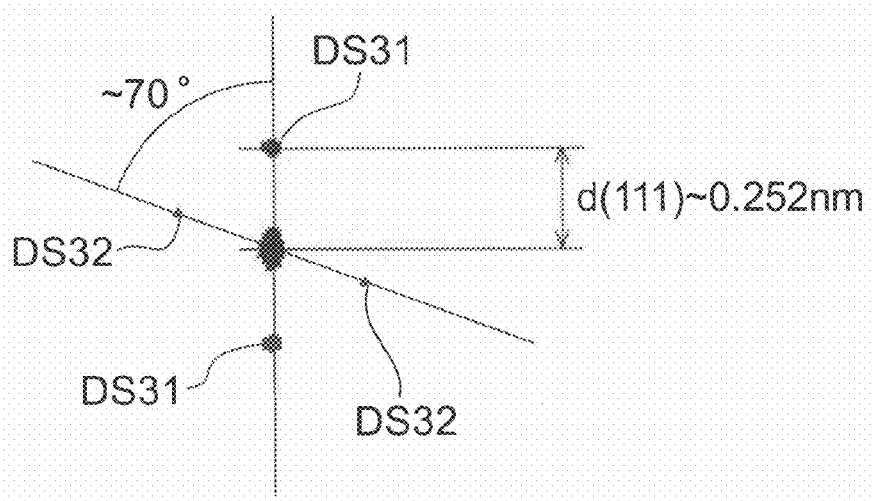
FIG. 10 is a drawing illustrating the results of measuring the nanodiffraction of the oxide layer of Working Example 1-1.

FIG. 10 is a drawing illustrating the results of measuring the nanodiffraction of the oxide layer of Working Example 1-1.

As illustrated in FIG. 10, a diffraction spot attributed to a crystal plane oriented in a direction perpendicular to the film face and having an interplanar spacing d of 0.252 nm was confirmed as a diffraction spot DS31, and a diffraction spot attributed to a crystal plane oriented in a direction inclined 70° from the diffraction spot D31 and also having an interplanar spacing d of 0.252 nm was confirmed as a diffraction spot D32. An angle formed by the diffraction spot D31 and the diffraction spot D32 matches the 70° angle formed by the <111> direction and an equivalent plane thereof (e.g. t<−111>). Therefore, it is clear that the diffraction spot D31 is the (111) plane orientation and the diffraction spot D32 is the equivalent plane of the (111) plane orientation of the diffraction spot D32.

On the other hand, from the results of measuring the nanodiffraction shown in FIG. 10, a diffraction spot, attributed to a (111) plane of a spinel structure having an interplanar spacing of about 0.485 nm, was not confirmed. Therefore, it is clear that the oxide layer of Working Example 1-1 has a diffraction pattern that corresponds with the (111) plane orientation of a NaCl structure.

Second Embodiment

Next, a magneto-resistive effect device according to a second embodiment will be described.

Figure 11:
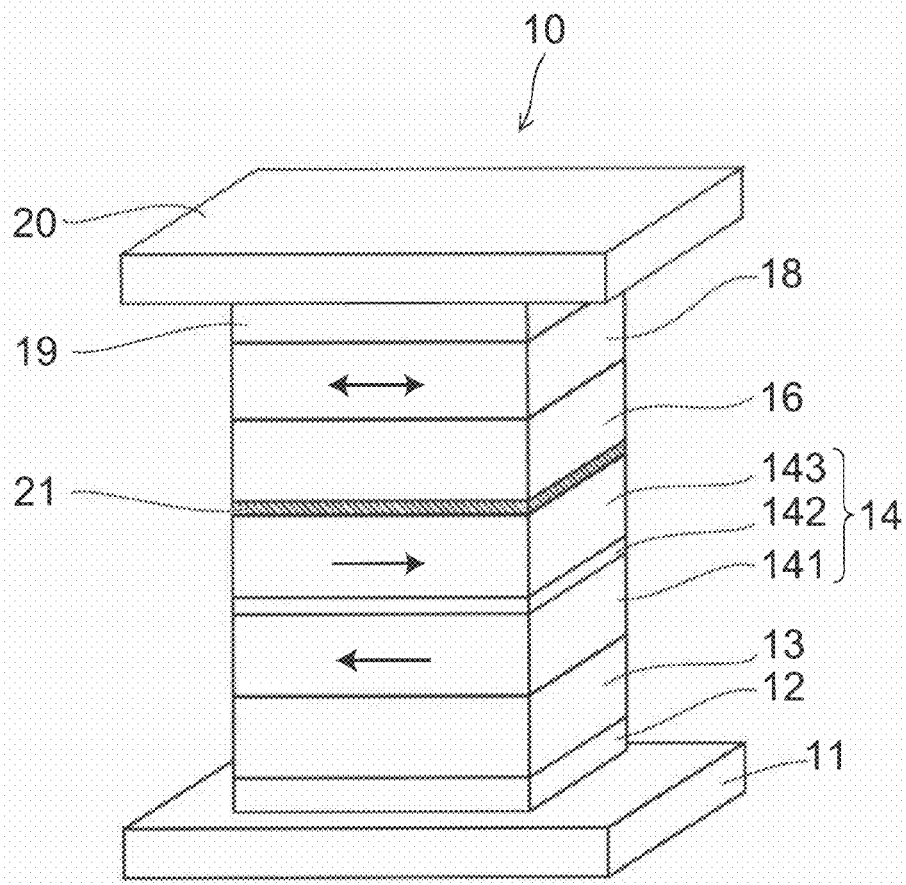
FIG. 11 is a perspective view illustrating a magneto-resistive effect device according to a second embodiment.

FIG. 11 is a perspective view illustrating the magneto-resistive effect device according to the second embodiment.

As illustrated in FIG. 11, in the magneto-resistive effect device according to this embodiment, the oxide layer 21 is provided between the spacer layer 16 and the pinned layer 14. Other aspects of the configuration, with the exception of the thickness of the free layer being 4 nm, are, as described below, the same as in the magneto-resistive effect device according to the first embodiment.

Base material layer 12: Ta [1 nm]/Ru [2 nm]
Pinning layer 13: Ir$_{22}$Mn$_{78}$ [7 nm]
Pinned layer 14: Co$_{90}$Fe$_{10}$ [4.4 nm]/Ru [0.9 nm]/Fe$_{50}$Co$_{50}$ [3 nm]
Oxide layer 21: Zn—Fe—O [1.5 nm]
Spacer layer 16: Cu [1.5 nm]
Free layer 18: Fe$_{50}$Co$_{50}$ [4 nm]

In this embodiment, just as with the first embodiment, as a result of arduous investigation into the conditions for surface oxidizing the oxide layer 21, the inventors succeeded in fabricating oxide layers with differing crystalline structures and differing crystalline orientations.

Table 2 shows the MR rate of change and the resistance area of the magneto-resistive effect device according to the second embodiment where the forming process of the oxide layer 21 and the structure of the oxide layer were changed.

TABLE 2

| | Oxide layer forming process | Oxide layer structure | MR [%] | RA [Ωμm$^2$] |
|---|---|---|---|---|
| Comparative Example 2-1 | None | — | 1.5 | 0.05 |
| Comparative Example 2-2 | Fe10A/Zn6A sputter-formed → Low acceleration IAO (Vb = 60 b, Ib = 60 mA) | Spinel structure γ-(Fe$_{85}$Zn$_{15}$)$_2$O$_3$ | 3.2 | 0.21 |
| Working Example 2-1 | Fe10A/Zn6A sputter-formed → Low acceleration IAO (Vb = 60 b, Ib = 60 mA) → Then, Ar plasma irradiation (60 W) | NaCl structure (Fe$_{85}$Zn$_{15}$)O$_x$ (Wustit) | 13.2 | 0.2 |
| Working Example 2-2 | Fe10A/Zn6A sputter-formed → High acceleration IAO (Vb = 80 b, Ib = 60 mA) | NaCl structure (Fe$_{85}$Zn$_{15}$)O$_x$ (Wustit) | 13 | 0.22 |
| Working Example 2-3 | Fe10A/Zn6A sputter-formed → Low acceleration IAO (Vb = 60 b, Ib = 60 mA) → Then, Ar plasma irradiation (20 W) | Spinel structure (Fe$_{85}$Zn$_{15}$)$_3$O$_4$ | 9.5 | 0.23 |

As shown in Table 2, Comparative Example 2-1 is an example of a magneto-resistive effect device in which the oxide layer 21 is not formed. Comparative Example 1-2 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. The formed oxide layer 21 had a spinel crystal structure and formed a $\gamma$-$(Fe_{85}Zn_{15})_2O_3$ layer.

Working Example 2-1 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. Furthermore, after the ion beam assisted oxidation, input power of the Ar plasma when irradiating was set to high acceleration conditions. The formed oxide layer 21 had a NaCl crystal structure and formed a $(Fe_{85}Zn_{15})O_x$ layer or, rather, a Wustit iron oxide layer.

Working Example 2-2 is an example of a magneto-resistive effect device in which the oxide layer 21 is formed by depositing, by a sputtering method, 1.0 nm of iron and 0.6 nm of zinc, and then performing ion beam assisted oxidation under high acceleration IAO beam conditions. The formed oxide layer 21 had a NaCl crystal structure and formed a $(Fe_{85}Zn_{15})O_x$ layer or, rather, a Wustit iron oxide layer.

Working Example 2-3 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. Furthermore, after the ion beam assisted oxidation, input power of the argon (Ar) plasma when irradiating was set to low acceleration conditions. The formed oxide layer 21 had a spinel structure and formed a $(Fe_{85}Zn_{15})_3O_4$ layer.

In the second embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 2. Moreover, all of the crystalline orientations of Working Examples 2-1 to 2-3 and Comparative Example 2-2 were identified as being (111) orientations of a cubic system.

Each of the magneto-resistive effect devices of Working Examples 2-1 to 2-3 and Comparative Example 2-2, wherein the Zn—Fe—O oxide layer was inserted as a spin filtering layer, displayed a higher MR rate of change than Comparative Example 2-1, wherein the device was not provided with a spin filtering layer. The NaCl structures or, rather, the magneto-resistive effect devices provided with the Zn—Fe—O oxide layer with the $(Zn—Fe)_3O_4$ type spinel structure illustrated in Working Examples 2-1 to 2-3 displayed a higher MR rate of change than the $\gamma$-$(Zn—Fe)_2O_3$ type spinel structure illustrated in Comparative Example 2-2. Furthermore, the devices of Working Example 2-1 and 2-2, wherein the Zn—Fe—O oxide layer with the NaCl structure was provided displayed higher MR rates of change than the device of Working Example 2-3 wherein the Zn—Fe—O oxide layer with the $(Zn—Fe)_3O_4$ type spinel structure was provided.

From the results described above, it was confirmed that, even when the oxide layer is provided between the spacer layer 16 and the pinned layer 14, the MR rate of change is enhanced profoundly by inserting, in the magneto-resistive effect device, an oxide layer with a NaCl structure or a $Me_XO_Y$ type spinel structure (where $Y/X \leq 4/3$) as the spin filtering layer.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 2-1, it was confirmed that the diffraction pattern corresponded to the (111) plane orientation of a NaCl structure.

Additionally, the crystalline orientation dispersion angle of the oxide layer of Working Example 2-1 was 5°. A smaller crystalline orientation dispersion angle is preferable because a high MR rate of change can be obtained. The crystalline orientation dispersion angle is preferably not more than 10°, and more preferably not more than 5°, as in Working Example 2-1.

It was confirmed from the cross-section TEM observation results of the magneto-resistive effect device 10 of Working Example 2-1 that the oxide layer 21 was formed uniformly between the spacer layer 16 and the pinned layer 14. Additionally, from the results of the EDX line analysis, if was found that Zn, Fe, and O peaks matched at a location corresponding to the oxide layer 21. Thus, it is clear that, when forming the film having a stacked structure such as Fe [1 nm]/Zn [0.6 nm], an oxide layer is produced in which the Zn and the Fe are completely blended as a result of providing the energy assistance during surface oxidation.

Third Embodiment

Next, a magneto-resistive effect device according to a third embodiment will be described.

Figure 12:
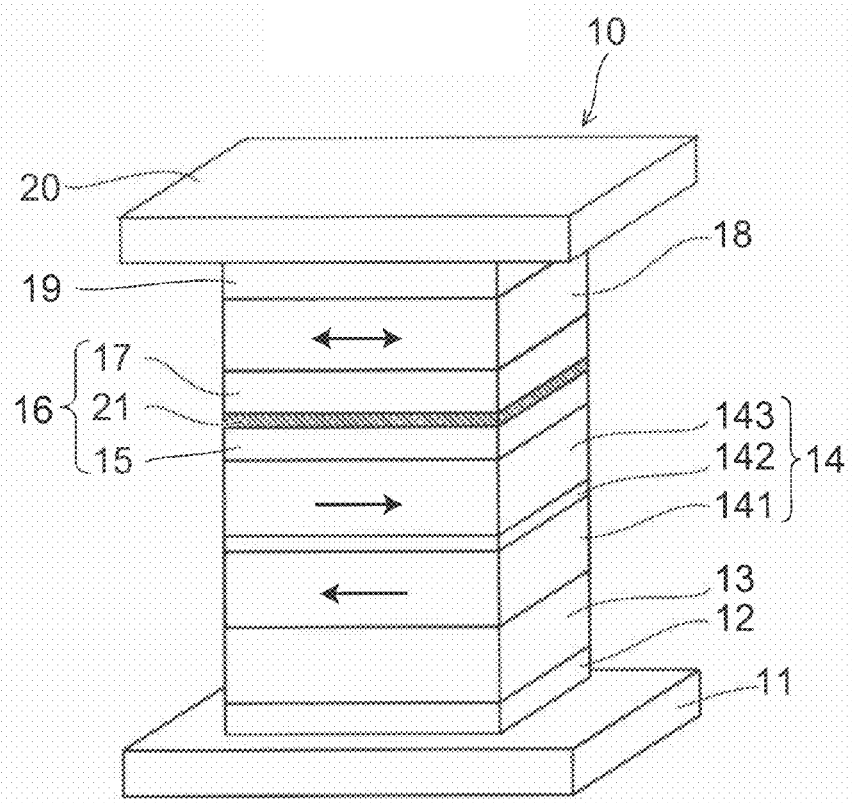
FIG. 12 is a perspective view illustrating a magneto-resistive effect device according to a third embodiment.

FIG. 12 is a perspective view illustrating the magneto-resistive effect device according to the third embodiment.

As illustrated in FIG. 12, in the magneto-resistive effect device according to this embodiment, the oxide layer 21 is provided in the spacer layer 16. Specifically, a lower metal layer 15 that constitutes the spacer layer 16 is provided on the pinned layer 14, and the oxide layer 21 is provided thereon. Moreover, an upper metal layer 17 that constitutes the spacer layer 16 is provided on the oxide layer 21. Other aspects of the configuration, with the exception of the thickness of the free layer being 4 nm, are, as described below, the same as in the magneto-resistive effect device 10 according to the first embodiment.

Base material layer 12: Ta [1 nm]/Ru [2 nm]

Pinning layer 13: $Ir_{22}Mn_{78}$ [7 nm]

Pinned layer 14: $Co_{90}Fe_{10}$ [4.4 nm]/Ru [0.9 nm]/$Fe_{50}Co_{50}$ [4 nm]

Lower metal layer 15: Cu [0.5 nm]

Oxide layer 21: Zn—Fe—O [1.5 nm]

Upper metal layer 17: Cu [0.5 nm]

Free layer 18: $Fe_{50}Co_{50}$ [4 nm]

In this embodiment, just as with the first embodiment, as a result of arduous investigation into the conditions for surface oxidizing the oxide layer 21, the inventors succeeded in fabricating oxide layers with differing crystalline structures and differing crystalline orientations.

Table 3 shows the MR rate of change and the resistance area of the magneto-resistive effect device according to the third embodiment where the forming process of the oxide layer 21 and the structure of the oxide layer were changed.

TABLE 3

| | Oxide layer forming process | Crystalline structure | MR [%] | RA [Ωμm²] |
|---|---|---|---|---|
| Comparative Example 3-1 | None | = | 1.5 | 0.05 |
| Comparative Example 3-2 | Fe10A/Zn6A sputter-formed → Low acceleration IAO (Vb = 60 b, Ib = 60 mA) | Spinel structure γ-$(Fe_{85}Zn_{15})_2O_3$ | 3.5 | 0.22 |
| Working Example 3-1 | Fe10A/Zn6A sputter-formed → Low acceleration IAO (Vb = 60 b, Ib = 60 mA) → Then, Ar plasma irradiation (60 W) | NaCl structure $(Fe_{85}Zn_{15})O_x$ (Wustit) | 17 | 0.2 |
| Working Example 3-2 | Fe10A/Zn6A sputter-formed → High acceleration IAO (Vb = 80b, Ib = 60 mA) | NaCl structure $(Fe_{85}Zn_{15})O_x$ (Wustit) | 16.5 | 0.2 |
| Working Example 3-3 | Fe10A/Zn6A sputter-formed → Low acceleration IAO (Vb = 60 b, Ib = 60 mA) → Then, Ar plasma irradiation (20 W) | Spinel structure $(Fe_{85}Zn_{15})_3O_4$ | 10.5 | 0.21 |

As shown in Table 3, Comparative Example 3-1 is an example of a magneto-resistive effect device in which the oxide layer 21 is not formed. Comparative Example 3-2 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. The formed oxide layer 21 had a spinel structure and formed a γ-$(Fe_{85}Zn_{15})_2O_3$ layer.

Working Example 3-1 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. Furthermore, after the ion beam assisted oxidation, input power of the Ar plasma when irradiating was set to high acceleration conditions. The formed oxide layer 21 had a NaCl structure and formed a $(Fe_{85}Zn_{15})O_x$ layer or, rather, a Wustit iron oxide layer.

Working Example 3-2 is an example of a magneto-resistive effect device in which the oxide layer 21 is formed by depositing, by a sputtering method, 1.0 nm of iron and 0.6 nm of zinc, and then performing ion beam assisted oxidation under high acceleration IAO beam conditions. The formed oxide layer 21 had a NaCl structure and formed a $(Fe_{85}Zn_{15})O_x$ layer or, rather, a Wustit iron oxide layer.

Working Example 3-3 is an example of a magneto-resistive effect device in which the oxide layer 21 is formed by depositing, by a sputtering method, 1.0 nm of iron and 0.6 nm of zinc, and then performing ion beam assisted oxidation low acceleration IAO beam conditions. Furthermore, after the ion beam assisted oxidation, input power of the Ar plasma when irradiating was set to low acceleration conditions. The formed oxide layer 21 had a spinel structure and formed a $(Fe_{85}Zn_{15})_3O_4$ layer.

In the third embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 3. Moreover, all of the crystalline orientations of Working Examples 3-1 to 3-3 and Comparative Example 3-2 were identified as being (111) orientations of a cubic system.

Each of the magneto-resistive effect devices of Working Examples 3-1 to 3-3 and Comparative Example 3-2, wherein the Zn—Fe—O oxide layer was inserted as a spin filtering layer, displayed a higher MR rate of change than Comparative Example 3-1, wherein the device was not provided with a spin filtering layer. The NaCl structures or, rather, the magneto-resistive effect devices provided with the Zn—Fe—O oxide layer with the $(Zn—Fe)_3O_4$ type spinel structure illustrated in Working Examples 3-1 to 3-3 displayed a higher MR rate of change than the γ-$(Zn—Fe)_2O_3$ type spinel structure illustrated in Comparative Example 3-2. Furthermore, the devices of Working Example 3-1 and 3-2, wherein the Zn—Fe—O oxide layer with the NaCl structure was provided displayed higher MR rates of change than the device of Working Example 3-3 wherein the Zn—Fe—O oxide layer with the $(Zn—Fe)_3O_4$ type spinel structure was provided.

From the results described above, it was confirmed that, even when the oxide layer is provided in the spacer layer, the MR rate of change is enhanced profoundly by inserting, in the magneto-resistive effect device, an oxide layer with a NaCl structure or a $Me_XO_Y$ type spinel structure (where $Y/X \leq 4/3$) as the spin filtering layer.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 3-1, it was confirmed that the diffraction pattern corresponded to the (111) plane orientation of a NaCl structure.

Additionally, the crystalline orientation dispersion angle of the oxide layer of Working Example 3-1 was 5°. A smaller crystalline orientation dispersion angle is preferable because a high MR rate of change can be obtained. The crystalline orientation dispersion angle is preferably not more than 10°, and more preferably not more than 5°, as in Working Example 3-1.

It was confirmed from the cross-section TEM observation results of the magneto-resistive effect device 10 of Working Example 3-1 that the oxide layer 21 was formed uniformly between the lower metal layer 15 and the upper metal layer 17. Additionally, from the results of the EDX line analysis, if was found that Zn, Fe, and O peaks matched at a location corresponding to the oxide layer 21. Thus, it is clear that, when forming the film having a stacked structure such as Fe [1 nm]/Zn [0.6 nm], an oxide layer is produced in which the Zn and the Fe are completely blended as a result of providing the energy assistance during surface oxidation.

The spacer layer 16 functions to split the magnetic coupling of the pinned layer 14 and the free layer 18. Normally, the spacer layer 16 is formed using a common metal magnetic material such as iron, cobalt, nickel, or the like. In such cases, the magnetic coupling of the pinned layer 14 and the free layer 18 cannot be split, but in this embodiment, the oxide layer provided within the spacer layer 16 is formed using a material which, compared to metal magnetic materials such as iron, cobalt, nickel, or the like, has extremely low magnetization or, rather is a nonmagnetic material. Therefore, the spacer layer 16 can function to split the magnetic coupling of the pinned layer 14 and the free layer 18. In order to sufficiently split the magnetic coupling of the pinned layer 14 and the free layer 18, preferably the lower metal layer 15 and the upper metal layer 17 are provided and the thickness between the pinned layer 14 and the free layer 18 is configured as in this embodiment.

Fourth Embodiment

Next, a magneto-resistive effect device according to a fourth embodiment will be described.

Figure 13:
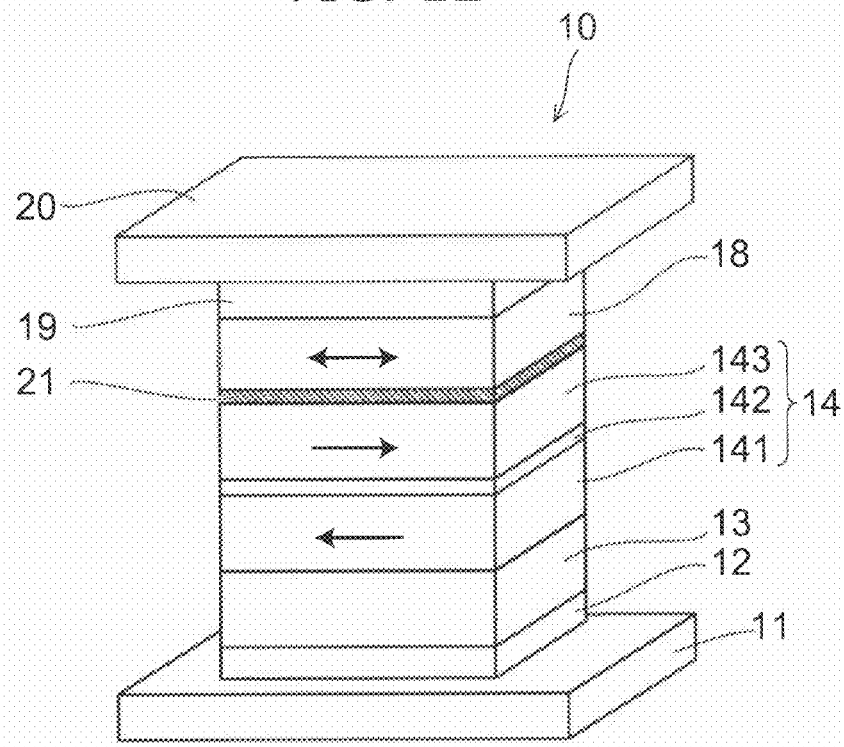
FIG. 13 is a perspective view illustrating a magneto-resistive effect device according to a fourth embodiment.

FIG. 13 is a perspective view illustrating the magneto-resistive effect device according to the fourth embodiment.

As illustrated in FIG. 13, in the magneto-resistive effect device according to this embodiment, the oxide layer 21 constitutes an entirety of the spacer layer. In other words, the spacer layer is formed from only the oxide layer 21. Other aspects of the configuration, with the exception of the thickness of the oxide layer being 2 nm, are, as described below, the same as in the magneto-resistive effect device according to the first embodiment.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Oxide layer 21: Zn—Fe—O [2 nm]
Free layer 18: $Fe_{50}Co_{50}$ [4 nm]

In this embodiment, just as with the first embodiment, as a result of arduous investigation into the conditions for surface oxidizing the oxide layer 21, the inventors succeeded in fabricating oxide layers with differing crystalline structures and differing crystalline orientations.

Table 4 shows the MR rate of change and the resistance area of the magneto-resistive effect device according to the fourth embodiment where the forming process of the oxide layer 21 and the structure of the oxide layer were changed.

TABLE 4

| | Oxide layer forming process | Crystalline structure | MR [%] | RA [Ωμm²] |
|---|---|---|---|---|
| Comparative Example 4-1 | None | = | 1.5 | 0.05 |
| Comparative Example 4-2 | Fe15A/Zn8A sputter-formed → Low acceleration IAO (Vb = 60 b, Ib = 60 mA) | Spinel structure γ-$(Fe_{85}Zn_{15})_2O_3$ | 2.1 | 0.21 |
| Working Example 4-1 | Fe15A/Zn8A sputter-formed → Low acceleration IAO (Vb = 60 b, Ib = 60 mA) → Then, Ar plasma irradiation (60 W) | NaCl structure $(Fe_{85}Zn_{15})O_x$ (Wustit) | 12 | 0.2 |
| Working Example 4-2 | Fe15A/Zn8A sputter-formed → High acceleration IAO (Vb = 80b, Ib = 60 mA) | NaCl structure $(Fe_{85}Zn_{15})O_x$ (Wustit) | 10.5 | 0.22 |
| Working Example 4-3 | Fe15A/Zn8A sputter-formed → Low acceleration | Spinel structure $(Fe_{85}Zn_{15})_3O_4$ | 7 | 0.21 |

TABLE 4-continued

| Oxide layer forming process | Crystalline structure | MR [%] | RA [Ωμm²] |
|---|---|---|---|
| IAO (Vb = 60 b, Ib = 60 mA) → Then, Ar plasma irradiation (20 W) | | | |

As shown in Table 4, Comparative Example 4-1 is an example of a magneto-resistive effect device in which the oxide layer 21 is not formed. Comparative Example 4-2 is an example of a magneto-resistive effect device in which the oxide layer 21 is formed by depositing, by a sputtering method, 1.5 nm of iron and 0.8 nm of zinc, and then performing ion beam assisted oxidation under low acceleration IAO beam conditions. The formed oxide layer 21 had a spinel structure and formed a γ-$(Fe_{85}Zn_{15})_2O_3$ layer.

Working Example 4-1 is an example of a magneto-resistive effect device in which the oxide layer 21 is formed by depositing, by a sputtering method, 1.5 nm of iron and 0.8 nm of zinc, and then performing ion beam assisted oxidation under low acceleration IAO beam conditions. Furthermore, after the ion beam assisted oxidation, input power of the Ar plasma when irradiating was set to high acceleration conditions. The formed oxide layer 21 had a NaCl structure and formed a $(Fe_{85}Zn_{15})O_x$ layer or, rather, a Wustit iron oxide layer.

Working Example 4-2 is an example of a magneto-resistive effect device in which the oxide layer 21 is formed by depositing, by a sputtering method, 1.5 nm of iron and 0.8 nm of zinc, and then performing ion beam assisted oxidation under high acceleration IAO beam conditions. The formed oxide layer 21 had a NaCl structure and formed a $(Fe_{85}Zn_{15})O_x$ layer or, rather, a Wustit iron oxide layer.

Working Example 4-3 is an example of a magneto-resistive effect device in which the oxide layer 21 is formed by depositing, by a sputtering method, 1.5 nm of iron and 0.8 nm of zinc, and then performing ion beam assisted oxidation under low acceleration IAO beam conditions. Furthermore, after the ion beam assisted oxidation, input power of the Ar plasma when irradiating was set to high acceleration conditions. The formed oxide layer 21 had a spinel structure and formed a $(Fe_{85}Zn_{15})_3O_4$ layer.

In the fourth embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 4. Moreover, all of the crystalline orientations of Working Examples 4-1 to 4-3 and Comparative Example 4-2 were identified as being (111) orientations of a cubic system.

Each of the magneto-resistive effect devices of Working Examples 4-1 to 4-3 and Comparative Example 4-2, wherein the Zn—Fe—O oxide layer was inserted as a spin filtering layer, displayed a higher MR rate of change than Comparative Example 4-1, wherein the device was not provided with a spin filtering layer. The NaCl structures or, rather, the magneto-resistive effect devices provided with the Zn—Fe—O oxide layer with the $(Zn—Fe)_3O_4$ type spinel structure illustrated in Working Examples 4-1 to 4-3 displayed a higher MR rate of change than the γ-$(Zn—Fe)_2O_3$ type spinel structure illustrated in Comparative Example 4-2. Furthermore, the devices of Working Example 4-1 and 4-2, wherein the Zn—Fe—O oxide layer with the NaCl structure was provided displayed higher MR rates of change than the device of Working Example 4-3 wherein the Zn—Fe—O oxide layer with the $(Zn—Fe)_3O_4$ type spinel structure was provided.

From the results described above, it was confirmed that, even when the oxide layer is provided as the spacer layer and the pinning layer, the MR rate of change is enhanced profoundly by inserting, in the magneto-resistive effect device, an oxide layer with a NaCl structure or a $Me_XO_Y$ type spinel structure (where Y/X≤4/3) as the spin filtering layer.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 4-1, it was confirmed that the diffraction pattern corresponded to the (111) plane orientation of a NaCl structure.

Additionally, the crystalline orientation dispersion angle of the oxide layer of Working Example 4-1 was 5°. A smaller crystalline orientation dispersion angle is preferable because a high MR rate of change can be obtained. The crystalline orientation dispersion angle is preferably not more than 10°, and more preferably not more than 5°, as in Working Example 4-1.

It was confirmed from the cross-section TEM observation results of the magneto-resistive effect device 10 of Working Example 4-1 that the oxide layer 21 was formed uniformly between the pinned layer 14 and the free layer 18. Additionally, from the results of the EDX line analysis, if was found that Zn, Fe, and O peaks matched at a location corresponding to the oxide layer 21. Thus, it is clear that, when forming the film having a stacked structure such as Fe [1.5 nm]/Zn [0.8 nm], an oxide layer is produced in which the Zn and the Fe are completely blended as a result of providing the energy assistance during surface oxidation.

The spacer layer 16 functions to split the magnetic coupling of the pinned layer 14 and the free layer 18. Normally, the spacer layer 16 is formed using a common metal magnetic material such as iron, cobalt, nickel, or the like. In such cases, the magnetic coupling of the pinned layer 14 and the free layer 18 cannot be split, but in this embodiment, the oxide layer provided within the spacer layer 16 is formed using a material which, compared to metal magnetic materials such as iron, cobalt, nickel, or the like, has extremely low magnetization or, rather is a nonmagnetic material. Therefore, the spacer layer 16 can function to split the magnetic coupling of the pinned layer 14 and the free layer 18.

Fifth Embodiment

Next, a magneto-resistive effect device according to a fifth embodiment will be described.

Figure 14:
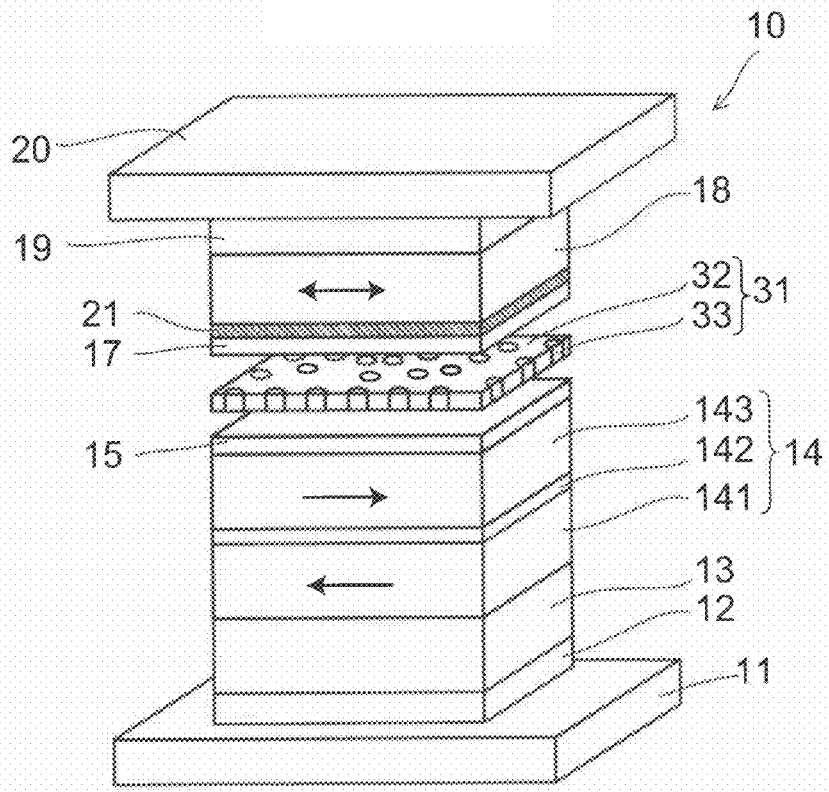
FIG. 14 is a schematic perspective view illustrating a magneto-resistive effect device according to a fifth embodiment.

FIG. 14 is a schematic perspective view illustrating the magneto-resistive effect device according to the fifth embodiment.

As illustrated in FIG. 14, in the magneto-resistive effect device according to this embodiment, in addition to the oxide layer 21 being provided between the spacer layer 16 and the free layer 18, a current-confined-path layer 41 is provided on the spacer layer. Specifically, a lower metal layer 15 that constitutes the spacer layer is provided on the pinned layer 14, and the current-confined-path layer 41 is provided on the lower metal layer 15. The current-confined-path layer 41 is an insulating material in which through-holes have been formed. A metal member is embedded in the through-holes. An upper metal layer 17 that constitutes the spacer layer is provided on the current-confined-path layer 41, and the oxide layer 21 is provided on the upper metal layer 17. In this embodiment, the spacer layer is formed from the lower metal layer 15, the current-confined-path layer 41, and the upper metal layer 17. Other aspects of the configuration, with the exception of the thickness of the free layer being 4 nm, are, as described below, the same as in the magneto-resistive effect device according to the first embodiment.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Lower metal layer 15: Cu [0.6 nm]
Current-confined-path layer 41: Structure [2 nm] wherein a Cu metal path vertically penetrates the $Al_2O_3$ insulating layer
Upper metal layer 17: Zn [0.5 nm]
Oxide layer 21: Zn—Fe—O [1.5 nm]
Free layer 18: $Fe_{50}Co_{50}$ [4 nm]

In this embodiment, just as with the first embodiment, as a result of arduous investigation into the conditions for surface oxidizing the oxide layer 21, the inventors succeeded in fabricating oxide layers with differing crystalline structures and differing crystalline orientations.

Table 5 shows the MR rate of change and the resistance area of the magneto-resistive effect device according to the third embodiment where the forming process of the oxide layer 21 and the structure of the oxide layer were changed.

TABLE 5

| | Oxide layer forming process | Crystalline structure | MR [%] | RA [Ωμm²] |
|---|---|---|---|---|
| Comparative Example 5-1 | None | = | 15 | 0.24 |
| Comparative Example 5-2 | Fe10A/Zn6A sputter-formed → Low acceleration IAO (Vb = 60 b, Ib = 60 mA) | Spinel structure γ-$(Fe_{85}Zn_{15})_2O_3$ | 15.5 | 0.29 |
| Working Example 5-1 | Fe10A/Zn6A sputter-formed → Low acceleration IAO (Vb = 60 b, Ib = 60 mA) → Then, Ar plasma irradiation (60 W) | NaCl structure $(Fe_{85}Zn_{15})O_x$ (Wustit) | 19 | 0.28 |
| Working Example 5-2 | Fe10A/Zn6A sputter-formed → High acceleration IAO (Vb = 80b, Ib = 60 mA) | NaCl structure $(Fe_{85}Zn_{15})O_x$ (Wustit) | 18.2 | 0.29 |
| Working Example 5-3 | Fe10A/Zn6A sputter-formed → Low acceleration IAO (Vb = 60 b, Ib = 60 mA) → Then, Ar plasma irradiation (20 W) | Spinel structure $(Fe_{85}Zn_{15})_3O_4$ | 17 | 0.27 |

As shown in Table 5, Comparative Example 5-1 is an example of a magneto-resistive effect device in which the oxide layer 21 is not formed. Comparative Example 5-2 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. The formed oxide layer 21 had a spinel structure and formed a γ-$(Fe_{85}Zn_{15})_2O_3$ layer.

Working Example 5-1 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. Furthermore, after the ion beam assisted oxidation, input power of the Ar plasma when irradiating was set to high acceleration conditions. The formed oxide layer 21 had a NaCl structure and formed a $(Fe_{85}Zn_{15})O_x$ layer or, rather, a Wustit iron oxide layer.

Working Example 5-2 is an example of a magneto-resistive effect device in which the oxide layer 21 is formed by depositing, by a sputtering method, 1.0 nm of iron and 0.6 nm of zinc, and then performing ion beam assisted oxidation under high acceleration IAO beam conditions. The formed oxide layer 21 had a NaCl structure and formed a $(Fe_{85}Zn_{15})O_x$ layer or, rather, a Wustit iron oxide layer.

Working Example 5-3 is an example of a magneto-resistive effect device in which the oxide layer 21 is formed by depositing, by a sputtering method, 1.0 nm of iron and 0.6 nm of zinc, and then performing ion beam assisted oxidation under low acceleration IAO beam conditions. Furthermore, after the ion beam assisted oxidation, input power of the Ar plasma when irradiating was set to high acceleration conditions. The formed oxide layer 21 had a spinel structure and formed a $(Fe_{85}Zn_{15})_3O_4$ layer.

In the fifth embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 5. Moreover, all of the crystalline orientations of Working Examples 5-1 to 5-3 and Comparative Example 5-2 were identified as being (111) orientations of a cubic system.

Each of the magneto-resistive effect devices of Working Examples 5-1 to 5-3 and Comparative Example 5-2, wherein the Zn—Fe—O oxide layer was inserted as a spin filtering layer, displayed a higher MR rate of change than Comparative Example 5-1, wherein the device was not provided with a spin filtering layer. The NaCl structures or, rather, the magneto-resistive effect devices provided with the Zn—Fe—O oxide layer with the $(Zn—Fe)_3O_4$ type spinel structure illustrated in Working Examples 5-1 to 5-3 displayed a higher MR rate of change than the γ-$(Zn—Fe)_2O_3$ type spinel structure illustrated in Comparative Example 5-2. Furthermore, the devices of Working Example 5-1 and 5-2, wherein the Zn—Fe—O oxide layer with the NaCl structure was provided displayed higher MR rates of change than the device of Working Example 5-3 wherein the Zn—Fe—O oxide layer with the $(Zn—Fe)_3O_4$ type spinel structure was provided.

From the results described above, it was confirmed that, even when the oxide layer is provided in the spacer layer, the MR rate of change is enhanced profoundly by inserting, in the magneto-resistive effect device, an oxide layer with a NaCl structure or a $Me_XO_Y$ type spinel structure (where Y/X≤4/3) as the spin filtering layer.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 5-1, it was confirmed that the diffraction pattern corresponded to the (111) plane orientation of a NaCl structure.

Additionally, the crystalline orientation dispersion angle of the oxide layer of Working Example 5-1 was 5°. A smaller crystalline orientation dispersion angle is preferable because a high MR rate of change can be obtained. The crystalline orientation dispersion angle is preferably not more than 10°, and more preferably not more than 5°, as in Working Example 5-1.

It was confirmed from the cross-section TEM observation results of the magneto-resistive effect device 10 of Working Example 5-1 that the oxide layer 21 was formed uniformly between the upper metal layer 17 and the free layer 18. Additionally, from the results of the EDX line analysis, it was found that Zn, Fe, and O peaks matched at a location corresponding to the oxide layer 21. Thus, it is clear that, when forming the film having a stacked structure such as Fe [1.0 nm]/Zn [0.6 nm], an oxide layer is produced in which the Zn and the Fe are completely blended as a result of providing the energy assistance during surface oxidation.

Sixth Embodiment

Next, a magneto-resistive effect device according to a sixth embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 6 shows the MR rate of change and the resistance area of the magneto-resistive effect device according to the sixth embodiment where the material of the oxide layer 21 was changed.

TABLE 6

|  | Crystalline structure | MR [%] | RA [Ωμm$^2$] |
| --- | --- | --- | --- |
| Comparative Example 6-1 | — | 1.5 | 0.05 |
| Working Example 6-1 | NaCl structure; $FeO_x$ (Wustit) | 8.5 | 0.2 |
| Working Example 6-2 | NaCl structure; $CoO_x$ | 6 | 0.23 |
| Working Example 6-3 | NaCl structure; $NiO_x$ | 5 | 0.2 |
| Working Example 6-4 | NaCl structure; $(Fe_{50}Co_{50})O_x$ (Wustit) | 7.5 | 0.2 |
| Working Example 6-5 | NaCl structure; $(Fe_{50}Ni_{50})O_x$ (Wustit) | 7 | 0.23 |
| Working Example 6-6 | NaCl structure; $(Co_{50}Ni_{50})O_x$ | 6.2 | 0.2 |
| Working Example 6-7 | NaCl structure; $TiO_x$ | 4 | 0.22 |
| Working Example 6-8 | NaCl structure; $VO_x$ | 3.8 | 0.2 |
| Working Example 6-9 | NaCl structure; $MnO_x$ | 5.5 | 0.22 |
| Working Example 6-10 | NaCl structure; $ZnO_x$ | 4.2 | 0.2 |
| Working Example 6-11 | NaCl structure; $PdO_x$ | 3.8 | 0.2 |
| Working Example 6-12 | NaCl structure; $PtO_x$ | 3.2 | 0.22 |
| Working Example 6-13 | NaCl structure; $SmO_x$ | 3 | 0.2 |
| Working Example 6-14 | NaCl structure; $AgO_x$ | 3.3 | 0.22 |

TABLE 6-continued

| | Crystalline structure | MR [%] | RA [Ωμm²] |
|---|---|---|---|
| Working Example 6-15 | NaCl structure; $CdO_x$ | 4 | 0.2 |
| Working Example 6-16 | NaCl structure; $RuO_x$ | 3.1 | 0.22 |

As shown in Table 6, Comparative Example 6-1 is an example of a magneto-resistive effect device in which the oxide layer 21 is not formed. Working Examples 6-1 to 6-16 are examples of magneto-resistive effect devices in which the oxide layer 21 had a NaCl structure. Specifically, Working Example 6-1 is an example of a magneto-resistive effect device in which $FeO_x$(Wustit) is the material of the oxide layer 21, Working Example 6-2 is an example of a magneto-resistive effect device in which $CoO_x$ is the material of the oxide layer 21, Working Example 6-3 is an example of a magneto-resistive effect device in which $NiO_x$ is the material of the oxide layer 21, Working Example 6-4 is an example of a magneto-resistive effect device in which $(Fe_{50}Co_{50})O_x$ (Wustit) is the material of the oxide layer 21, Working Example 6-5 is an example of a magneto-resistive effect device in which $(Fe_{50}Ni_{50})O_x$(Wustit) is the material of the oxide layer 21, Working Example 6-6 is an example of a magneto-resistive effect device in which $(Co_{50}Ni_{50})O_x$ is the material of the oxide layer 21, Working Example 6-7 is an example of a magneto-resistive effect device in which $TiO_x$ is the material of the oxide layer 21, Working Example 6-8 is an example of a magneto-resistive effect device in which $VO_x$ is the material of the oxide layer 21, Working Example 6-9 is an example of a magneto-resistive effect device in which $MnO_x$ is the material of the oxide layer 21, Working Example 6-10 is an example of a magneto-resistive effect device in which $ZnO_x$ is the material of the oxide layer 21, Working Example 6-11 is an example of a magneto-resistive effect device in which $PdO_x$ is the material of the oxide layer 21, Working Example 6-12 is an example of a magneto-resistive effect device in which $PtO_x$ is the material of the oxide layer 21, Working Example 6-13 is an example of a magneto-resistive effect device in which $SmO_x$ is the material of the oxide layer 21, Working Example 6-14 is an example of a magneto-resistive effect device in which $AgO_x$ is the material of the oxide layer 21, Working Example 6-15 is an example of a magneto-resistive effect device in which $CdO_x$ is the material of the oxide layer 21, and Working Example 6-16 is an example of a magneto-resistive effect device in which $RuO_x$ is the material of the oxide layer 21.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 6
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 6. As a result of arduous investigation into the conditions for surface oxidizing the oxide layer 21, the inventors succeeded in fabricating a (111) oriented film with a NaCl structure from the material shown in Table 6.

As shown in Table 6, the magneto-resistive effect devices wherein various oxide materials with NaCl structures were inserted as spin filtering layers displayed higher MR rates of change than Comparative Example 6-1 wherein the device was not provided with a spin filtering layer.

From the results described above, it was confirmed that the MR rate of change is enhanced profoundly by inserting, in the magneto-resistive effect device, an oxide layer formed from various materials with NaCl structures as the spin filtering layer. Regarding materials not listed in Table 6, as long as the material is an oxide layer with a NaCl structure, profound enhancement of the MR rate of change can be confirmed as a result of insertion into the magneto-resistive effect device.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 6-1 to 6-15, it was confirmed that the diffraction patterns corresponded to the (111) plane orientation of a NaCl structure.

Additionally, the crystalline orientation dispersion angle of the oxide layer of Working Example 6-1 was 5°. A smaller crystalline orientation dispersion angle is preferable because a high MR rate of change can be obtained. The crystalline orientation dispersion angle is preferably not more than 10°, and more preferably not more than 5°, as in Working Example 6-1.

It was confirmed from the cross-section TEM observation results of the magneto-resistive effect devices 10 of Working Examples 6-1 to 6-15 that the oxide layer 21 was formed uniformly between the spacer layer 16 and the free layer 18.

Seventh Embodiment

Next, a magneto-resistive effect device according to a seventh embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 7 shows the MR rate of change and the resistance area of the magneto-resistive effect device according to the seventh embodiment where the material of the oxide layer 21 was changed.

TABLE 7

| | Crystalline structure | MR [%] | RA [Ωμm²] |
|---|---|---|---|
| Comparative Example 7-1 | — | 1.5 | 0.05 |
| Working Example 7-1 | NaCl structure; $FeO_x$ (Wustit) | 8.5 | 0.2 |
| Working Example 7-2 | NaCl structure; $(Fe_{85}Zn_{15})O_x$ (Wustit) | 18 | 0.23 |
| Working Example 7-3 | NaCl structure; $(Fe_{42.5}Co_{42.5}Zn_{15})O_x$ (Wustit) | 18.9 | 0.2 |
| Working Example 7-4 | NaCl structure; $(Fe_{42.5}Ni_{42.5}Zn_{15})O_x$ (Wustit) | 14 | 0.23 |

TABLE 7-continued

| | Crystalline structure | MR [%] | RA [Ωμm²] |
|---|---|---|---|
| Working Example 7-5 | NaCl structure; $(Fe_{85}In_{15})O_x$ (Wustit) | 13 | 0.23 |
| Working Example 7-6 | NaCl structure; $(Fe_{85}Sn_{15})O_x$ (Wustit) | 12.2 | 0.2 |
| Working Example 7-7 | NaCl structure; $(Fe_{85}Cd_{15})O_x$ (Wustit) | 11 | 0.23 |
| Working Example 7-8 | NaCl structure; $(Fe_{85}Co_{15})O_x$ (Wustit) | 8.5 | 0.23 |
| Working Example 7-9 | NaCl structure; $(Fe_{85}Ni_{15})O_x$ (Wustit) | 8.8 | 0.2 |
| Working Example 7-10 | NaCl structure; $(Fe_{85}Cu_{15})O_x$ (Wustit) | 8.6 | 0.23 |
| Working Example 7-11 | NaCl structure; $(Fe_{85}Ti_{15})O_x$ (Wustit) | 8.6 | 0.23 |
| Working Example 7-12 | NaCl structure; $(Fe_{85}V_{15})O_x$ (Wustit) | 8.7 | 0.2 |
| Working Example 7-13 | NaCl structure; $(Fe_{85}Cr_{15})O_x$ (Wustit) | 8.7 | 0.23 |
| Working Example 7-14 | NaCl structure; $(Fe_{85}Mn_{15})O_x$ (Wustit) | 8.5 | 0.2 |
| Working Example 7-15 | NaCl structure; $(Fe_{85}Al_{15})O_x$ (Wustit) | 8.6 | 0.35 |
| Working Example 7-16 | NaCl structure; $(Fe_{85}Si_{15})O_x$ (Wustit) | 8.5 | 0.38 |
| Working Example 7-17 | NaCl structure; $(Fe_{85}Mg_{15})O_x$ (Wustit) | 8.5 | 0.34 |
| Working Example 7-18 | NaCl structure; $(Fe_{85}Pt_{15})O_x$ (Wustit) | 8.9 | 0.2 |
| Working Example 7-19 | NaCl structure; $(Fe_{85}Pd_{15})O_x$ (Wustit) | 9 | 0.23 |
| Working Example 7-20 | NaCl structure; $(Fe_{85}Ag_{15})O_x$ (Wustit) | 8.7 | 0.23 |
| Working Example 7-21 | NaCl structure; $(Fe_{85}Zr_{15})O_x$ (Wustit) | 8.8 | 0.23 |
| Working Example 7-22 | NaCl structure; $(Fe_{85}Hf_{15})O_x$ (Wustit) | 8.6 | 0.2 |
| Working Example 7-23 | NaCl structure; $(Fe_{85}Ta_{15})O_x$ (Wustit) | 8.7 | 0.33 |

As shown in Table 7, Comparative Example 7-1 is an example of a magneto-resistive effect device in which the oxide layer 21 is not formed. Working Examples 7-1 to 7-23 are examples of magneto-resistive effect devices in which the oxide layer 21 had a NaCl structure. In this embodiment, results of investigation into cases where another element is added to an oxide layer 21 containing Fe are shown. Specifically, Working Example 7-1 is an example of a magneto-resistive effect device in which $FeO_x$ (Wustit) is the material of the oxide layer 21, Working Example 7-2 is an example of a magneto-resistive effect device in which $(Fe_{85}Zn_{15})O_x$ (Wustit) is the material of the oxide layer 21, Working Example 7-3 is an example of a magneto-resistive effect device in which $(Fe_{42.5}Co_{42.5}Zn_{15})O_x$ (Wustit) is the material of the oxide layer 21, Working Example 7-4 is an example of a magneto-resistive effect device in which $(Fe_{42.5}Ni_{42.5}Zn_{15})O_x$ (Wustit) is the material of the oxide layer 21, Working Example 7-5 is an example of a magneto-resistive effect device in which $(Fe_{85}In_{15})O_x$ (Wustit) is the material of the oxide layer 21, Working Example 7-6 is an example of a magneto-resistive effect device in which $(Fe_{85}Sn_{15})O_x$ (Wustit) is the material of the oxide layer 21, Working Example 7-7 is an example of a magneto-resistive effect device in which $(Fe_{85}Cd_{15})O_x$ (Wustit) is the material of the oxide layer 21, Working Example 7-8 is an example of a magneto-resistive effect device in which $(Fe_{85}Co_{15})O_x$ (Wustit) is the material of the oxide layer 21, Working Example 7-9 is an example of a magneto-resistive effect device in which $(Fe_{85}Ni_{15})O_x$ (Wustit) is the material of the oxide layer 21, Working Example 7-10 is an example of a magneto-resistive effect device in which $(Fe_{85}Cu_{15})O_x$ (Wustit) is the material of the oxide layer 21, Working Example 7-11 is an example of a magneto-resistive effect device in which $(Fe_{85}Ti_{15})O_x$ (Wustit) is the material of the oxide layer 21, Working Example 7-12 is an example of a magneto-resistive effect device in which $(Fe_{85}V_{15})O_x$ (Wustit) is the material of the oxide layer 21, Working Example 7-13 is an example of a magneto-resistive effect device in which $(Fe_{85}Cr_{15})O_x$ (Wustit) is the material of the oxide layer 21, Working Example 7-14 is an example of a magneto-resistive effect device in which $(Fe_{85}Mn_{15})O_x$ (Wustit) is the material of the oxide layer 21, Working Example 7-15 is an example of a magneto-resistive effect device in which $(Fe_{85}Al_{15})O_x$ (Wustit) is the material of the oxide layer 21, Working Example 7-16 is an example of a magneto-resistive effect device in which $(Fe_{85}Si_{15})O_x$ (Wustit) is the material of the oxide layer 21, Working Example 7-17 is an example of a magneto-resistive effect device in which $(Fe_{85}Mg_{15})O_x$ (Wustit) is the material of the oxide layer 21, Working Example 7-18 is an example of a magneto-resistive effect device in which $(Fe_{85}Pt_{15})O_x$ (Wustit) is the material of the oxide layer 21, Working Example 7-19 is an example of a magneto-resistive effect device in which $(Fe_{85}Pd_{15})O_x$ (Wustit) is the material of the oxide layer 21, Working Example 7-20 is an example of a magneto-resistive effect device in which $(Fe_{85}Ag_{15})O_x$ (Wustit) is the material of the oxide layer 21, Working Example 7-21 is an example of a magneto-resistive effect device in which $(Fe_{85}Zr_{15})O_x$ (Wustit) is the material of the oxide layer 21, Working Example 7-22 is an example of a magneto-resistive effect device in which $(Fe_{85}Zr_{15})O_x$ (Wustit) is the material of the oxide layer 21, and Working Example 7-23 is an example of a magneto-resistive effect device in which $(Fe_{85}Ta_{15})O_x$ (Wustit) is the material of the oxide layer 21.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 7
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 7. As a result of arduous investigation into the conditions for surface oxidizing the oxide layer 21, the inventors succeeded in fabricating a (111) oriented film with a NaCl structure from the material shown in Table 7.

As shown in Table 7, the magneto-resistive effect devices wherein various oxide materials with NaCl structures were inserted as spin filtering layers displayed higher MR rates of change than Comparative Example 7-1 wherein the device was not provided with a spin filtering layer. As shown in Table 7, when Fe is used as the metal Me of the oxide layer 21, even when various other elements such as Zn, In, Sn, Cd, Co, Ni, Cu, Ti, V, Cr, Mn, Al, Si, Mg, Pt, Pd, Ag, Zr, Hf, or Ta are added, a high MR rate of change can be obtained. In Table 7, cases in which 15 at. % of the other element was added are shown as representative examples, but a higher MR rate of change than in Comparative Example 7-1, in which the device was not provided with the spin filtering layer, was also confirmed when the added amount was in a range from 0.5 at. % to 50 at. %.

An exceptionally high MR rate of change was confirmed when Zn, In, Sn, or Cd was added as the other element when Fe was used as the metal Me of the oxide layer 21.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 7-1 to 7-23, it was confirmed that the diffraction patterns corresponded to the (111) plane orientation of a NaCl structure.

Additionally, the crystalline orientation dispersion angle of the oxide layer of Working Example 7-1 was 5°. A smaller crystalline orientation dispersion angle is preferable because a high MR rate of change can be obtained. The crystalline orientation dispersion angle is preferably not more than 10°, and more preferably not more than 5°, as in Working Example 7-1.

It was confirmed from the cross-section TEM observation results of the magneto-resistive effect devices 10 of Working Examples 7-1 to 7-23 that the oxide layer 21 was formed uniformly between the spacer layer 16 and the free layer 18.

Eighth Embodiment

Next, a magneto-resistive effect device according to an eighth embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 8 shows the MR rate of change and the resistance area of the magneto-resistive effect device according to the eighth embodiment where the material of the oxide layer 21 was changed.

TABLE 8

|  | Crystalline structure | MR [%] | RA [$\Omega\mu m^2$] |
| --- | --- | --- | --- |
| Comparative Example 8-1 | — | 1.5 | 0.05 |
| Working Example 8-1 | NaCl structure; $(Fe_{50}Co_{50})O_x$ (Wustit) | 7.5 | 0.2 |
| Working Example 8-2 | NaCl structure; $((Fe_{50}Co_{50})_{85}Zn_{15})O_x$ (Wustit) | 18.9 | 0.2 |
| Working Example 8-3 | NaCl structure; $((Fe_{50}Co_{50})_{85}In_{15})O_x$ (Wustit) | 13 | 0.23 |
| Working Example 8-4 | NaCl structure; $((Fe_{50}Co_{50})_{85}Sn_{15})O_x$ (Wustit) | 12.2 | 0.2 |

TABLE 8-continued

|  | Crystalline structure | MR [%] | RA [$\Omega\mu m^2$] |
| --- | --- | --- | --- |
| Working Example 8-5 | NaCl structure; $((Fe_{50}Co_{50})_{85}Cd_{15})O_x$ (Wustit) | 11 | 0.23 |
| Working Example 8-6 | NaCl structure; $((Fe_{50}Co_{50})_{85}Ni_{15})O_x$ (Wustit) | 8.8 | 0.2 |
| Working Example 8-7 | NaCl structure; $((Fe_{50}Co_{50})_{85}Cu_{15})O_x$ (Wustit) | 8.6 | 0.23 |
| Working Example 8-8 | NaCl structure; $((Fe_{50}Co_{50})_{85}Ti_{15})O_x$ (Wustit) | 8.6 | 0.23 |
| Working Example 8-9 | NaCl structure; $((Fe_{50}Co_{50})_{85}V_{15})O_x$ (Wustit) | 8.7 | 0.2 |
| Working Example 8-10 | NaCl structure; $((Fe_{50}Co_{50})_{85}Cr_{15})O_x$ (Wustit) | 8.7 | 0.23 |
| Working Example 8-11 | NaCl structure; $((Fe_{50}Co_{50})_{85}Mn_{15})O_x$ (Wustit) | 8.5 | 0.2 |
| Working Example 8-12 | NaCl structure; $((Fe_{50}Co_{50})_{85}Al_{15})O_x$ (Wustit) | 8.6 | 0.35 |
| Working Example 8-13 | NaCl structure; $((Fe_{50}Co_{50})_{85}Si_{15})O_x$ (Wustit) | 8.5 | 0.38 |
| Working Example 8-14 | NaCl structure; $((Fe_{50}Co_{50})_{85}Mg_{15})O_x$ (Wustit) | 8.5 | 0.34 |
| Working Example 8-15 | NaCl structure; $((Fe_{50}Co_{50})_{85}Pt_{15})O_x$ (Wustit) | 8.9 | 0.2 |
| Working Example 8-16 | NaCl structure; $((Fe_{50}Co_{50})_{85}Pd_{15})O_x$ (Wustit) | 9 | 0.23 |
| Working Example 8-17 | NaCl structure; $((Fe_{50}Co_{50})_{85}Ag_{15})O_x$ (Wustit) | 8.7 | 0.23 |
| Working Example 8-18 | NaCl structure; $((Fe_{50}Co_{50})_{85}Zr_{15})O_x$ (Wustit) | 8.8 | 0.23 |
| Working Example 8-19 | NaCl structure; $((Fe_{50}Co_{50})_{85}Hf_{15})O_x$ (Wustit) | 8.6 | 0.2 |
| Working Example 8-20 | NaCl structure; $((Fe_{50}Co_{50})_{85}Ta_{15})O_x$ (Wustit) | 8.7 | 0.33 |

As shown in Table 8, Comparative Example 8-1 is an example of a magneto-resistive effect device in which the oxide layer 21 is not formed. Working Examples 8-1 to 8-20 are examples of magneto-resistive effect devices in which the oxide layer 21 had a NaCl structure. In this embodiment, results of investigation into cases where another element is added to an oxide layer 21 containing $Fe_{50}Co_{50}$ are shown. Specifically, Working Example 8-1 is an example of a magneto-resistive effect device in which $((Fe_{50}Co_{50})O_x$ (Wustit) is the material of the oxide layer 21 is the material of the oxide layer 21, Working Example 8-2 is an example of a magneto-resistive effect device in which $((Fe_{50}Co_{50})_{85}Zn_{15})O_x$ (Wustit) is the material of the oxide layer 21, Working Example 8-3 is an example of a magneto-resistive effect device in which $((Fe_{50}Co_{50})_{85}In_{15})O_x$ (Wustit) is the material of the oxide layer 21, Working Example 8-4 is an example of a magneto-resistive effect device in which $((Fe_{50}Co_{50})_{85}Sn_{15})O_x$ (Wustit) is the material of the oxide layer 21, Working Example 8-5 is an example of a magneto-resistive effect device in which $((Fe_{50}Co_{50})_{85}Cd_{15})O_x$ (Wustit) is the material of the oxide layer 21, Working Example 8-6 is an example of a magneto-resistive effect device in which $((Fe_{50}Co_{50})_{85}Ni_{15})O_x$ (Wustit) is the material of the oxide layer 21, Working Example 8-7 is an example of a magneto-resistive effect device in which $((Fe_{50}Co_{50})_{85}Cu_{15})O_x$ (Wustit) is the material of the oxide layer 21, Working Example 8-8 is an example of a magneto-resistive effect device in which $((Fe_{50}Co_{50})_{85}Ti_{15})O_x$ (Wustit) is the material of the oxide layer 21, Working Example 8-9 is an example of a magneto-resistive effect device in which $((Fe_{50}Co_{50})_{85}V_{15})O_x$ (Wustit) is the material of the oxide layer 21, Working Example 8-10 is an example of a magneto-resistive effect device in which $((Fe_{50}Co_{50})_{85}Cr_{15})O_x$ (Wustit) is the material of the oxide layer 21, Working Example 8-11 is an example of a magneto-resistive effect device in which $((Fe_{50}Co_{50})_{85}Mn_{15})O_x$ (Wustit) is the material of the oxide layer 21, Working Example 8-12 is an example of a magneto-resistive effect device in which $((Fe_{50}Co_{50})_{85}Al_{15})O_x$ (Wustit) is the material of the oxide layer 21, Working Example 8-13 is an example of a magneto-resistive effect device in which $((Fe_{50}Co_{50})_{85}Al_{15})O_x$ (Wustit) is the material of the oxide layer 21, Working Example 8-14 is an example of a magneto-resistive effect device in which $((Fe_{50}Co_{50})_{85}Si_{15})O_x$ (Wustit) is the material of the oxide layer 21, Working Example 8-15 is an example of a magneto-resistive effect device in which $((Fe_{50}Co_{50})_{85}Pt_{15})O_x$ (Wustit) is the material of the oxide layer 21, Working Example 8-16 is an example of a magneto-resistive effect device in which $((Fe_{50}Co_{50})_{85}Pd_{15})O_x$ (Wustit) is the material of the oxide layer 21, Working Example 8-17 is an example of a magneto-resistive effect device in which $((Fe_{50}Co_{50})_{85}Ag_{15})O_x$ (Wustit) is the material of the oxide layer 21, Working Example 8-18 is an example of a magneto-resistive effect device in which $((Fe_{50}Co_{50})_{85}Zr_{15})O_x$ (Wustit) is the material of the oxide layer 21, Working Example 8-19 is an example of a magneto-resistive effect device in which $((Fe_{50}Co_{50})_{85}Hf_{15})O_x$ (Wustit) is the material of the oxide layer 21, and Working Example 8-20 is an example of a magneto-resistive effect device in which $((Fe_{50}Co_{50})_{85}Ta_{15})O_x$ (Wustit).

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 8
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 8. As a result of arduous investigation into the conditions for surface oxidizing the oxide layer 21, the inventors succeeded in fabricating a (111) oriented film with a NaCl structure from the material shown in Table 8.

As shown in Table 8, the magneto-resistive effect devices wherein various oxide materials with NaCl structures were inserted as spin filtering layers displayed higher MR rates of change than Comparative Example 8-1 wherein the device was not provided with a spin filtering layer. As shown in Table 8, when $Fe_{50}Co_{50}$ is used as the metal Me of the oxide layer 21, even when various other elements such as Zn, In, Sn, Cd, Ni, Cu, Ti, V, Cr, Mn, Al, Si, Mg, Pt, Pd, Ag, Zr, Hf, or Ta are added, a high MR rate of change can be obtained. In Table 8, cases in which 15 at. % of the other element was added are shown as representative examples, but a higher MR rate of change than in Comparative Example 8-1, in which the device was not provided with the spin filtering layer, was also confirmed when the added amount was in a range from 0.5 at. % to 50 at. %. An exceptionally high MR rate of change was confirmed when Zn, In, Sn, or Cd was added as the other element when $Fe_{50}Co_{50}$ was used as the metal Me of the oxide layer 21.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 8-1 to 8-20, it was confirmed that the diffraction patterns corresponded to the (111) plane orientation of a NaCl structure.

Additionally, the crystalline orientation dispersion angle of the oxide layer of Working Example 8-1 was 5°. A smaller crystalline orientation dispersion angle is preferable because a high MR rate of change can be obtained. The crystalline orientation dispersion angle is preferably not more than 10°, and more preferably not more than 5°, as in Working Example 8-1.

It was confirmed from the cross-section TEM observation results of the magneto-resistive effect devices 10 of Working Examples 8-1 to 8-20 that the oxide layer 21 was formed uniformly between the spacer layer 16 and the free layer 18.

Ninth Embodiment

Next, a magneto-resistive effect device according to a ninth embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 9 shows the MR rate of change and the resistance area of the magneto-resistive effect device according to the ninth embodiment where the material of the oxide layer 21 was changed.

TABLE 9

|  | Crystalline structure | MR [%] | RA [$\Omega\mu m^2$] |
| --- | --- | --- | --- |
| Comparative Example 9-1 | — | 1.5 | 0.05 |
| Working Example 9-1 | NaCl structure; $CoO_x$ | 6 | 0.23 |
| Working Example 9-2 | NaCl structure; $(Co_{85}Zn_{15})O_x$ | 8.8 | 0.22 |
| Working Example 9-3 | NaCl structure; $(Co_{85}In_{15})O_x$ | 7.6 | 0.25 |
| Working Example 9-4 | NaCl structure; $(Co_{85}Sn_{15})O_x$ | 7.2 | 0.27 |
| Working Example 9-5 | NaCl structure; $(Co_{85}Cd_{15})O_x$ | 7.4 | 0.24 |
| Working Example 9-6 | NaCl structure; $NiO_x$ | 5 | 0.22 |
| Working Example 9-7 | NaCl structure; $(Ni_{85}Zn_{15})O_x$ | 8.5 | 0.25 |
| Working Example 9-8 | NaCl structure; $(Ni_{85}In_{15})O_x$ | 8.3 | 0.24 |
| Working Example 9-9 | NaCl structure; $(Ni_{85}Sn_{15})O_x$ | 8.9 | 0.22 |
| Working Example 9-10 | NaCl structure; $(Ni_{85}Cd_{15})O_x$ | 7.4 | 0.21 |

TABLE 9-continued

| | Crystalline structure | MR [%] | RA [Ωμm²] |
|---|---|---|---|
| Working Example 9-11 | NaCl structure; $((Co_{50}Ni_{50})_{85}Zn_{15})O_x$ | 9 | 0.22 |

As shown in Table 9, Comparative Example 9-1 is an example of a magneto-resistive effect device in which the oxide layer 21 is not formed. Working Examples 9-1 to 9-20 are examples of magneto-resistive effect devices in which the oxide layer 21 had a NaCl structure. In this embodiment, results of investigation into cases where another element is added to an oxide layer 21 containing Co, Ni, or $Co_{50}Ni_{50}$ are shown. Specifically, Working Example 9-1 is an example of a magneto-resistive effect device in which $CoO_x$ is the material of the oxide layer 21, Working Example 9-2 is an example of a magneto-resistive effect device in which $(Co_{85}Zn_{15})O_x$ is the material of the oxide layer 21, Working Example 9-3 is an example of a magneto-resistive effect device in which $(Co_{85}In_{15})O_x$ is the material of the oxide layer 21, Working Example 9-4 is an example of a magneto-resistive effect device in which $(Co_{85}Sn_{15})O_x$ is the material of the oxide layer 21, Working Example 9-5 is an example of a magneto-resistive effect device in which $(Co_{85}Cd_{15})O_x$ is the material of the oxide layer 21, Working Example 9-6 is an example of a magneto-resistive effect device in which $NiO_x$ is the material of the oxide layer 21, Working Example 9-7 is an example of a magneto-resistive effect device in which $(Ni_{85}Zn_{15})O_x$ is the material of the oxide layer 21, Working Example 9-8 is an example of a magneto-resistive effect device in which $(Ni_{85}In_{15})O_x$ is the material of the oxide layer 21, Working Example 9-9 is an example of a magneto-resistive effect device in which $(Ni_{85}Sn_{15})O_x$ is the material of the oxide layer 21, Working Example 9-10 is an example of a magneto-resistive effect device in which $(Ni_{85}Cd_{15})O_x$ is the material of the oxide layer 21, and Working Example 9-11 is an example of a magneto-resistive effect device in which $((Co_{50}Ni_{50})_{85}Zn_{15})O_x$ is the material of the oxide layer 21.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 9
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 9. As a result of arduous investigation into the conditions for surface oxidizing the oxide layer 21, the inventors succeeded in fabricating a (111) oriented film with a NaCl structure from the material shown in Table 9.

As shown in Table 9, the magneto-resistive effect devices wherein various oxide materials with NaCl structures were inserted as spin filtering layers displayed higher MR rates of change than Comparative Example 9-1 wherein the device was not provided with a spin filtering layer. As shown in Table 9, when Co, Ni, or $Co_{50}Ni_{50}$ is used as the metal Me of the oxide layer 21, even when various other elements such as Zn, In, Sn, Cd, or the like are added, a high MR rate of change can be obtained. Aside from Zn, In, Sn, and Cd, a high MR rate of change can be obtained when Cu, Ti, V, Cr, Mn, Al, Si, Mg, Pt, Pd, Ag, Zr, Hf, Ta, or the like is used as the other element. In Table 9, cases in which 15 at. % of the other element was added are shown as representative examples, but a higher MR rate of change than in Comparative Example 9-1, in which the device was not provided with the spin filtering layer, was also confirmed when the added amount was in a range from 0.5 at. % to 50 at. %. An exceptionally high MR rate of change was confirmed when Zn, In, Sn, or Cd was added as the other element when Co, Ni, or $Co_{50}Ni_{50}$ was used as the metal Me of the oxide layer 21.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 9-1 to 9-11, it was confirmed that the diffraction patterns corresponded to the (111) plane orientation of a NaCl structure.

Additionally, the crystalline orientation dispersion angle of the oxide layer of Working Example 9-1 was 5°. A smaller crystalline orientation dispersion angle is preferable because a high MR rate of change can be obtained. The crystalline orientation dispersion angle is preferably not more than 10°, and more preferably not more than 5°, as in Working Example 9-1.

It was confirmed from the cross-section TEM observation results of the magneto-resistive effect devices 10 of Working Examples 9-1 to 9-11 that the oxide layer 21 was formed uniformly between the spacer layer 16 and the free layer 18.

Tenth Embodiment

Next, a magneto-resistive effect device according to a tenth embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 10 shows the MR rate of change and the resistance area of the magneto-resistive effect device according to the sixth embodiment where the material of the oxide layer 21 was changed.

TABLE 10

| | Crystalline structure | MR [%] | RA [Ωμm²] |
|---|---|---|---|
| Comparative Example 10-1 | = | 1.5 | 0.05 |
| Working Example 10-1 | NaCl structure; $Fe_{85}Zn_{15}$—$O_x$ (Wustit) | 18 | 0.23 |
| Working Example 10-2 | NaCl structure; $((Fe_{80}Co_{20})_{85}Zn_{15})O_x$ (Wustit) | 18.5 | 0.21 |
| Working Example 10-3 | NaCl structure; $((Fe_{50}Co_{50})_{85}Zn_{15})O_x$ (Wustit) | 18.9 | 0.2 |
| Working Example 10-4 | NaCl structure; $((Fe_{25}Co_{75})_{85}Zn_{15})O_x$ (Wustit) | 13.3 | 0.23 |
| Working Example | NaCl structure; $((Fe_{10}Co_{90})_{85}Zn_{15})O_x$ | 11.5 | 0.22 |

TABLE 10-continued

|  | Crystalline structure | MR [%] | RA [Ωμm²] |
|---|---|---|---|
| 10-5 Working Example 10-6 | (Wustit) NaCl structure; $(Co_{85}Zn_{15})O_x$ | 8.8 | 0.22 |

As shown in Table 10, Comparative Example 10-1 is an example of a magneto-resistive effect device in which the oxide layer 21 is not formed. Working Examples 10-1 to 10-6 are examples of magneto-resistive effect devices in which the oxide layer 21 had a NaCl structure. In this embodiment, results of investigation into cases where compositions of Co and Fe were varied in an oxide layer 21 expressed by $((Co-Fe)_{85}Zn_{15})O_x$ are shown. Specifically, Working Example 10-1 is an example of a magneto-resistive effect device in which $(Fe_{85}Zn_{15})O_x$ is the material of the oxide layer 21, Working Example 10-2 is an example of a magneto-resistive effect device in which $((Fe_{80}Co_{20})_{85}Zn_{15})O_x$ is the material of the oxide layer 21, Working Example 10-3 is an example of a magneto-resistive effect device in which $((Fe_{50}Co_{50})_{85}Zn_{15})O_x$ is the material of the oxide layer 21, Working Example 10-4 is an example of a magneto-resistive effect device in which $((Fe_{25}Co_{75})_{85}Zn_{15})O_x$ is the material of the oxide layer 21, Working Example 10-5 is an example of a magneto-resistive effect device in which $((Fe_{25}Co_{90})_{85}Zn_{15})O_x$ is the material of the oxide layer 21, and Working Example 10-6 is an example of a magneto-resistive effect device in which $(Co_{85}Zn_{15})O_x$ is the material of the oxide layer 21.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 10
Free layer 18: $Fe_{50}Co[50$ 3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 10. As a result of arduous investigation into the conditions for surface oxidizing the oxide layer 21, the inventors succeeded in fabricating a (111) oriented film with a NaCl structure from the material shown in Table 10.

As shown in Table 10, the magneto-resistive effect devices wherein various oxide materials with NaCl structures were inserted as spin filtering layers displayed higher MR rates of change than Comparative Example 10-1 wherein the device was not provided with a spin filtering layer. As shown in Table 10, a high MR rate of change was confirmed when the Fe concentration with respect to Co was from 0 at. % to 100 at. % in an oxide layer 21 in which the metal Me of the oxide layer 21 was expressed $((Co-Fe)_{85}Zn_{15})O_x$. Of these, a particularly high MR rate of change was confirmed when the Fe concentration with respect to Co was from 25 at. % to 100 at. %. In Table 10, cases in which 15 at. % of Zn was added as the other element are shown as representative examples, but a higher MR rate of change than in Comparative Example 10-1, in which the device was not provided with the spin filtering layer, was also confirmed when the added amount was in a range from 0.5 at. % to 50 at. %. Aside from Zn, a high MR rate of change can be obtained when In, Sn, Cd, Cu, Ti, V, Cr, Mn, Al, Si, Mg, Pt, Pd, Ag, Zr, Hf, Ta, or the like is used as the other element. Of these, a particularly high MR rate of change can be obtained when Zn, In, Sn, or Cd is used as the other element.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 10-1 to 10-6, it was confirmed that the diffraction patterns corresponded to the (111) plane orientation of a NaCl structure.

Additionally, the crystalline orientation dispersion angle of the oxide layer of Working Example 10-3 was 5°. A smaller crystalline orientation dispersion angle is preferable because a high MR rate of change can be obtained. The crystalline orientation dispersion angle is preferably not more than 10°, and more preferably not more than 5°, as in Working Example 10-3.

It was confirmed from the cross-section TEM observation results of the magneto-resistive effect devices 10 of Working Examples 10-1 to 10-6 that the oxide layer 21 was formed uniformly between the spacer layer 16 and the free layer 18.

Eleventh Embodiment

Next, a magneto-resistive effect device according to an eleventh embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 11 shows the MR rate of change and the resistance area of the magneto-resistive effect device according to the eleventh embodiment where the material of the oxide layer 21 was changed.

TABLE 11

|  | Crystalline structure | MR [%] | RA [Ωμm²] |
|---|---|---|---|
| Comparative Example 11-1 | — | 1.5 | 0.05 |
| Working Example 11-1 | NaCl structure; $Fe_{85}Zn_{15}$—$O_x$ (Wustit) | 18 | 0.23 |
| Working Example 11-2 | NaCl structure; $((Fe_{80}Ni_{20})_{85}Zn_{15})O_x$ (Wustit) | 16 | 0.22 |
| Working Example 11-3 | NaCl structure; $((Fe_{50}Ni_{50})_{85}Zn_{15})O_x$ (Wustit) | 14 | 0.22 |
| Working Example 11-4 | NaCl structure; $((Fe_{25}Ni_{75})_{85}Zn_{15})O_x$ (Wustit) | 12 | 0.24 |
| Working Example 11-5 | NaCl structure; $((Fe_{10}Ni_{90})_{85}Zn_{15})O_x$ (Wustit) | 10.2 | 0.22 |
| Working Example 11-6 | NaCl structure; $(Ni_{85}Zn_{15})O_x$ | 8.5 | 0.25 |

As shown in Table 11, Comparative Example 11-1 is an example of a magneto-resistive effect device in which the oxide layer 21 is not formed. Working Examples 11-1 to 11-6 are examples of magneto-resistive effect devices in which the oxide layer 21 had a NaCl structure. In this embodiment, results of investigation into cases where compositions of Fe and Ni were varied in an oxide layer 21 expressed by $((Fe-Ni)_{85}Zn_{15})O_x$ are shown. Specifically, Working Example 11-1 is an example of a magneto-resistive effect device in which $(Fe_{85}Zn_{15})O_x$ is the material of the oxide layer 21, Working Example 11-2 is an example of a magneto-resistive effect device in which $((Fe_{80}Ni_{20})_{85}Zn_{15})O_x$ is the material of the oxide layer 21, Working Example 11-3 is an example of a magneto-resistive effect device in which $((Fe_{50}Ni_{50})_{85}Zn_{15})O_x$ is the material of the oxide layer 21, Working Example 11-4 is an example of a magneto-resistive effect device in which $((Fe_{25}Ni_{75})_{85}Zn_{15})O_x$ is the material of the oxide layer, Working Example 11-5 is an example of a magneto-resistive effect device in which $((Fe_{10}Ni_{90})_{85}Zn_{15})O_x$ is the material of the oxide layer, and Working Example 11-6 is an example of a magneto-resistive effect device in which $(Ni_{85}Zn_{15})O_x$ is the material of the oxide layer.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 11
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 11. As a result of arduous investigation into the conditions for surface oxidizing the oxide layer 21, the inventors succeeded in fabricating a (111) oriented film with a NaCl structure from the material shown in Table 11.

As shown in Table 11, the magneto-resistive effect devices wherein various oxide materials with NaCl structures were inserted as spin filtering layers displayed higher MR rates of change than Comparative Example 11-1 wherein the device was not provided with a spin filtering layer. As shown in Table 11, a high MR rate of change was confirmed when the Fe concentration with respect to Ni was from 0 at. % to 100 at. % in an oxide layer 21 in which the metal Me of the oxide layer 21 was expressed $((Fe-Ni)_{85}Zn_{15})O_x$. Of these, a particularly high MR rate of change was confirmed when the Fe concentration with respect to Ni was from 25 at. % to 100 at. %. In Table 11, cases in which 15 at. % of Zn was added as the other element are shown as representative examples, but a higher MR rate of change than in Comparative Example 11-1, in which the device was not provided with the spin filtering layer, was also confirmed when the added amount was in a range from 0.5 at. % to 50 at. %. Aside from Zn, a high MR rate of change can be obtained when In, Sn, Cd, Cu, Ti, V, Cr, Mn, Al, Si, Mg, Pt, Pd, Ag, Zr, Hf, Ta, or the like is used as the other element. Of these, a particularly high MR rate of change can be obtained when Zn, In, Sn, or Cd is used as the other element.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 11-1 to 11-6, it was confirmed that the diffraction patterns corresponded to the (111) plane orientation of a NaCl structure.

Additionally, the crystalline orientation dispersion angle of the oxide layer of Working Example 11-3 was 5°. A smaller crystalline orientation dispersion angle is preferable because a high MR rate of change can be obtained. The crystalline orientation dispersion angle is preferably not more than 10°, and more preferably not more than 5°, as in Working Example 11-3.

It was confirmed from the cross-section TEM observation results of the magneto-resistive effect devices 10 of Working Examples 11-1 to 11-6 that the oxide layer 21 was formed uniformly between the spacer layer 16 and the free layer 18.

Twelfth Embodiment

Next, a magneto-resistive effect device according to a twelfth embodiment will be described.

Aside from changing the material of the oxide layer 21, the configuration of the magneto-resistive effect device according to this embodiment was the same as that of the magneto-resistive effect device according to the first embodiment illustrated in FIG. 5.

Table 12 shows the MR rate of change and the resistance area of the magneto-resistive effect device according to the twelfth embodiment where the material of the oxide layer 21 was changed.

TABLE 12

| | Crystalline structure | MR [%] | RA [$\Omega\mu m^2$] |
|---|---|---|---|
| Comparative Example 12-1 | — | 1.5 | 0.05 |
| Working Example 12-1 | Spinel structure; $(Fe_{85}Zn_{15})_3O_4$ | 11 | 0.23 |
| Working Example 12-2 | Spinel structure; $(Fe_{42.5}Co_{42.5}Zn_{15})_3O_4$ | 11.5 | 0.2 |
| Working Example 12-3 | Spinel structure; $(Fe_{42.5}Ni_{42.5}Zn_{15})_3O_4$ | 11.5 | 0.2 |
| Working Example 12-4 | Spinel structure; $(Co_{42.5}Ni_{42.5}Zn_{15})_3O_4$ | 8 | 0.2 |
| Working Example 12-5 | Spinel structure; $(Co_{85}Zn_{15})_3O_4$ | 8 | 0.23 |
| Working Example 12-6 | Spinel structure; $(Ni_{85}Zn_{15})_3O_4$ | 5.5 | 0.2 |
| Working Example 12-7 | Spinel structure; $(Fe_{85}In_{15})_3O_4$ | 8.3 | 0.23 |
| Working Example 12-8 | Spinel structure; $(Fe_{85}Sn_{15})_3O_4$ | 8.1 | 0.2 |
| Working Example 12-9 | Spinel structure; $(Fe_{85}Cd_{15})_3O_4$ | 7 | 0.23 |

As shown in Table 12, Comparative Example 12-1 is an example of a magneto-resistive effect device in which the oxide layer 21 is not formed. Working Examples 12-1 to 12-9 are examples of magneto-resistive effect devices in which the oxide layer 21 had a spinel structure. Specifically, Working Example 12-1 is an example of a magneto-resistive effect device in which $(Fe_{85}Zn_{15})_3O_4$ is the material of the oxide layer 21, Working Example 12-2 is an example of a magneto-resistive effect device in which $(Fe_{42.5}Co_{42.5}Zn_{15})_3O_4$ is the material of the oxide layer 21, Working Example 12-3 is an example of a magneto-resistive effect device in which $(Fe_{42.5}Ni_{42.5}Zn_{15})_3O_4$ is the material of the oxide layer 21, Working Example 12-4 is an example of a magneto-resistive effect device in which $(Co_{42.5}Ni_{42.5}Zn_{15})_3O_4$ is the material of the oxide layer 21, Working Example 12-5 is an example of a magneto-resistive effect device in which $(Co_{85}Zn_{15})_3O_4$ is the material of the oxide layer 21, Working Example 12-6 is an example of a magneto-resistive effect device in which $(Ni_{85}Zn_{15})_3O_4$ is the material of the oxide layer 21, Working Example 12-7 is an example of a magneto-resistive effect device in which $(Fe_{85}Zn_{15})_3O_4$ is the material of the oxide layer 21, Working Example 12-8 is an example of a magneto-resistive effect device in which $(Fe_{85}Sn_{15})_3O_4$ is the material of the oxide layer 21, and Working Example 12-9 is an example of a magneto-resistive effect device in which $(Fe_{85}Cd_{15})_3O_4$ is the material of the oxide layer 21.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 12
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 12. As a result of arduous investigation into the conditions for surface oxidizing the oxide layer 21, the inventors succeeded in fabricating a $Me_XO_Y$ type (111) oriented film with a spinel structure containing a divalent metal ion (where $Y/X \leq 4/3$) from the material shown in Table 12.

As shown in Table 12, the magneto-resistive effect devices of Working Examples 12-1 to 12-9 wherein various oxide materials with $Me_XO_Y$ type spinel structures (where $Y/X \leq 4/3$) were inserted as spin filtering layers displayed higher MR rates of change than Comparative Example 12-1 wherein the device was not provided with a spin filtering layer. As shown in Table 12, it was confirmed that a high MR rate of change can be realized when an oxide material including at least one metal selected from Fe, Co, and Ni, and at least one material selected from the group consisting of Zn, Cd, Sn, and In is used.

From the results described above, it was confirmed that the MR rate of change is enhanced profoundly by inserting, in the magneto-resistive effect device, an oxide layer, formed from various materials, with a $Me_XO_Y$ type spinel structure (where $Y/X \leq 4/3$) as the spin filtering layer.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction patterns of the test materials of Working Examples 12-1 to 12-9, it was confirmed that the diffraction patterns corresponded to the (111) plane orientation of a spinel structure.

Additionally, the crystalline orientation dispersion angle of the oxide layer of Working Example 12-1 was 5°. A smaller crystalline orientation dispersion angle is preferable because a high MR rate of change can be obtained. The crystalline orientation dispersion angle is preferably not more than 10°, and more preferably not more than 5°, as in Working Example 12-1.

It was confirmed from the cross-section TEM observation results of the magneto-resistive effect devices 10 of Working Examples 12-1 to 12-9 that the oxide layer 21 was formed uniformly between the spacer layer 16 and the free layer 18.

Thirteenth Embodiment

Next, a magneto-resistive effect device according to a thirteenth embodiment will be described.

Aside from changing the thickness of the oxide layer 21, the configuration of the magneto-resistive effect device according to this embodiment was the same as that of the magneto-resistive effect device according to the first embodiment illustrated in FIG. 5.

Table 13 shows the MR rate of change and the resistance area of the magneto-resistive effect device according to the thirteenth embodiment where the thickness of the oxide layer 21 having a NaCl structure (Fe—Zn)$O_x$ (Wustit) as a constituent was changed.

TABLE 13

| | Crystalline structure | Oxide layer thickness [nm] | MR [%] | RA [$\Omega\mu m^2$] |
|---|---|---|---|---|
| Comparative Example 13-1 | — | 0 | 1.5 | 0.05 |
| Working Example 13-1 | NaCl structure; $(Fe_{85}Zn_{15})O_x$ (Wustit) | 0.2 | 3.7 | 0.16 |
| Working Example 13-2 | NaCl structure; $(Fe_{85}Zn_{15})O_x$ (Wustit) | 0.5 | 10.2 | 0.17 |
| Working Example 13-3 | NaCl structure; $(Fe_{85}Zn_{15})O_x$ (Wustit) | 1 | 18.5 | 0.2 |
| Working Example 13-4 | NaCl structure; $(Fe_{85}Zn_{15})O_x$ (Wustit) | 1.5 | 18.5 | 0.2 |
| Working Example 13-5 | NaCl structure; $(Fe_{85}Zn_{15})O_x$ (Wustit) | 2 | 16.4 | 0.22 |
| Working Example 13-6 | NaCl structure; $(Fe_{85}Zn_{15})O_x$ (Wustit) | 2.5 | 13.2 | 0.3 |
| Working Example 13-7 | NaCl structure; $(Fe_{85}Zn_{15})O_x$ (Wustit) | 3 | 11.2 | 0.32 |
| Working Example 13-8 | NaCl structure; $(Fe_{85}Zn_{15})O_x$ (Wustit) | 3.5 | 9.5 | 0.4 |
| Working Example 13-9 | NaCl structure; $(Fe_{85}Zn_{15})O_x$ (Wustit) | 4 | 8.5 | 0.55 |
| Working Example 13-10 | NaCl structure; $(Fe_{85}Zn_{15})O_x$ (Wustit) | 5 | 5 | 0.67 |

As shown in Table 13, Comparative Example 13-1 is an example of a magneto-resistive effect device in which the oxide layer 21 is not formed. Working Examples 13-1 to 13-10 are examples of magneto-resistive effect devices in which the thicknesses of the oxide layers 21 are 0.2, 0.5, 1, 1.5, 2, 2.5, 3, 3.5, 4, and 5 nm, respectively.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Zn—Fe—O [thickness is shown in Table 13]
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 13. As a result of arduous investigation into the conditions for surface oxidizing the oxide layer 21, the inventors succeeded in fabricating a (111) oriented film with a NaCl structure that is a Zn—Fe—O film.

As shown in Table 13, the devices of Working Examples 13-1 to 13-10 in which the Zn—Fe—O films with NaCl structures were inserted as spin filtering layers displayed higher MR rates of change than Comparative Example 13-1 wherein the device was not provided with a spin filtering layer for all thicknesses from 0.2 nm to 5 nm. Particularly, when the thickness was from 0.5 nm to 4 nm, extremely high MR rates of change were displayed. Such dependency of the MR rate of change on the thickness was likewise confirmed for the materials of the oxide layers 21 shown in the sixth embodiment, the seventh embodiment, the eighth embodiment, the ninth embodiment, the tenth embodiment, and the eleventh embodiment.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 13-3, it was confirmed that the diffraction pattern corresponded to the (111) plane orientation of a NaCl structure.

Additionally, the crystalline orientation dispersion angle of the oxide layer of Working Example 13-3 was 5°. A smaller crystalline orientation dispersion angle is preferable because a high MR rate of change can be obtained. The crystalline orientation dispersion angle is preferably not more than 10°, and more preferably not more than 5°, as in Working Example 13-3.

It was confirmed from the cross-section TEM observation results of the magneto-resistive effect device 10 of Working Example 13-3 that the oxide layer 21 was formed uniformly between the spacer layer 16 and the free layer 18.

Fourteenth Embodiment

Next, a magneto-resistive effect device according to a fourteenth embodiment will be described.

Aside from changing the thickness of the oxide layer 21, the configuration of the magneto-resistive effect device according to this embodiment was the same as that of the magneto-resistive effect device according to the first embodiment illustrated in FIG. 5.

Table 14 shows the MR rate of change and the resistance area of the magneto-resistive effect device according to the fourteenth embodiment where the thickness of the $Me_XO_Y$ type oxide layer 21 with a spinel structure; (where $Y/X \le 4/3$) was changed.

TABLE 14

| | Crystalline structure | Oxide layer thickness [nm] | MR [%] | RA [Ωμm²] |
|---|---|---|---|---|
| Comparative Example 14-1 | — | 0 | 1.5 | 0.05 |
| Working Example 14-1 | Spinel structure; $(Fe_{85}Zn_{15})_3O_4$ | 0.2 | 3.4 | 0.16 |
| Working Example 14-2 | Spinel structure; $(Fe_{85}Zn_{15})_3O_4$ | 0.5 | 8.4 | 0.17 |
| Working Example 14-3 | Spinel structure; $(Fe_{85}Zn_{15})_3O_4$ | 1 | 10.2 | 0.2 |
| Working Example 14-4 | Spinel structure; $(Fe_{85}Zn_{15})_3O_4$ | 1.5 | 11 | 0.2 |
| Working Example 14-5 | Spinel structure; $(Fe_{85}Zn_{15})_3O_4$ | 2 | 10.3 | 0.22 |
| Working Example 14-6 | Spinel structure; $(Fe_{85}Zn_{15})_3O_4$ | 2.5 | 9 | 0.3 |
| Working Example 14-7 | Spinel structure; $(Fe_{85}Zn_{15})_3O_4$ | 3 | 8.2 | 0.32 |
| Working Example 14-8 | Spinel structure; $(Fe_{85}Zn_{15})_3O_4$ | 3.5 | 7.4 | 0.4 |
| Working Example 14-9 | Spinel structure; $(Fe_{85}Zn_{15})_3O_4$ | 4 | 5.5 | 0.55 |
| Working Example 14-10 | Spinel structure; $(Fe_{85}Zn_{15})_3O_4$ | 5 | 3.2 | 0.67 |

As shown in Table 14, Comparative Example 14-1 is an example of a magneto-resistive effect device in which the oxide layer 21 is not formed. Working Examples 14-1 to 14-10 are examples of magneto-resistive effect devices in which the thicknesses of the oxide layers 21 are 0.2, 0.5, 1, 1.5, 2, 2.5, 3, 3.5, 4, and 5 nm, respectively.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Zn—Fe—O [thickness is shown in Table 14]
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 14. As a result of arduous investigation into the conditions for surface oxidizing the oxide layer 21, the inventors succeeded in fabricating a $Me_XO_Y$ type (111) oriented Zn—Fe—O film with a spinel structure (where $Y/X \le 4/3$).

As shown in Table 14, the devices of Working Examples 14-1 to 14-10 in which the $Me_XO_Y$ type Zn—Fe—O films with spinel structures (where $Y/X \le 4/3$) were inserted as spin filtering layers displayed higher MR rates of change than Comparative Example 14-1 wherein the device was not provided with a spin filtering layer for all thicknesses from 0.2 nm to 5 nm. Such dependency of the MR rate of change on the thickness was likewise confirmed for the material of the oxide layer 21 shown in the twelfth embodiment.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 14-3, it was confirmed that the diffraction patterns corresponded to the (111) plane orientation of a spinel structure.

Additionally, the crystalline orientation dispersion angle of the oxide layer of Working Example 14-3 was 5°. A smaller crystalline orientation dispersion angle is preferable because a high MR rate of change can be obtained. The crystalline orientation dispersion angle is preferably not more than 10°, and more preferably not more than 5°, as in Working Example 14-3.

It was confirmed from the cross-section TEM observation results of the magneto-resistive effect device 10 of Working Example 14-3 that the oxide layer 21 was formed uniformly between the spacer layer 16 and the free layer 18.

Fifteenth Embodiment

Next, a magneto-resistive effect device according to a fifteenth embodiment will be described.

Aside from changing the Zn concentration X in $Zn_XFe_{1-X}$, the metal in the Zn—Fe—O film used for the oxide layer 21, the configuration of the magneto-resistive effect device according to this embodiment was the same as that of the magneto-resistive effect device according to the first embodiment illustrated in FIG. 5.

Table 15 shows the MR rate of change and the resistance area of the magneto-resistive effect device according to the fifteenth embodiment where the Zn concentration X in $Zn_XFe_{1-X}$ was changed.

TABLE 15

| | Oxide layer structure | Zn composition in the metal [at. %] | MR [%] | RA [$\Omega\mu m^2$] |
|---|---|---|---|---|
| Comparative Example 15-1 | = | = | 1.5 | 0.05 |
| Working Example 15-1 | NaCl structure; $FeO_x$ (Wustit) | 0 | 8.5 | 0.21 |
| Working Example 15-2 | NaCl structure; $(Fe-Zn)O_x$ (Wustit) | 0.5 | 11.5 | 0.21 |
| Working Example 15-3 | NaCl structure; $(Fe-Zn)O_x$ (Wustit) | 2 | 13.2 | 0.24 |
| Working Example 15-4 | NaCl structure; $(Fe-Zn)O_x$ (Wustit) | 5 | 15 | 0.2 |
| Working Example 15-5 | NaCl structure; $(Fe-Zn)O_x$ (Wustit) | 10 | 18 | 0.21 |
| Working Example 15-6 | NaCl structure; $(Fe-Zn)O_x$ (Wustit) | 15 | 18.5 | 0.24 |
| Working Example 15-7 | NaCl structure; $(Fe-Zn)O_x$ (Wustit) | 20 | 17 | 0.2 |
| Working Example 15-8 | NaCl structure; $(Fe-Zn)O_x$ (Wustit) | 30 | 16.8 | 0.2 |
| Working Example 15-9 | NaCl structure; $(Fe-Zn)O_x$ (Wustit) | 50 | 13.5 | 0.22 |
| Working Example 15-10 | NaCl structure; $(Fe-Zn)O_x$ (Wustit) | 70 | 8.2 | 0.21 |

As shown in Table 15, Comparative Example 15-1 is an example of a magneto-resistive effect device in which the oxide layer 21 is not formed. Working Example 15-1 is an example of a magneto-resistive effect device in which the Zn concentration X in $Zn_XFe_{1-X}$ is 0 or, rather $FeO_x$ (Wustit) is used as the oxide layer 21. Working Examples 15-2 to 15-10 are examples of magneto-resistive effect devices in which the Zn concentrations X in $Zn_XFe_{1-X}$ are 0.5, 2, 5, 10, 15, 20, 30, 50, and 70 at. %, respectively.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Zn—Fe—O [1.5 nm]
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 15. As a result of arduous investigation into the conditions for surface oxidizing the oxide layer 21, the inventors succeeded in fabricating a (111) oriented film with a NaCl structure that is a Zn—Fe—O film. Additionally, the Zn concentration X in the $Zn_XFe_{1-X}$ in the oxide layer 21 was measured using inductively coupled plasma mass spectrometry (ICP-MS).

As shown in Table 15, the devices of Working Examples 15-1 to 15-10 in which the Zn—Fe—O films with NaCl structures were inserted as spin filtering layers displayed higher MR rates of change than Comparative Example 15-1 wherein the device was not provided with a spin filtering layer when the Zn concentration X in $Zn_XFe_{1-X}$, the metal in the Zn—Fe—O film, was in a range from 0% to 70%. Additionally, a particularly high MR rate of change was confirmed when the Zn concentration X was in a range from 0.5% to 50%.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 15-6, it was confirmed that the diffraction pattern corresponded to the (111) plane orientation of a NaCl structure.

Additionally, the crystalline orientation dispersion angle of the oxide layer of Working Example 15-6 was 5°. A smaller crystalline orientation dispersion angle is preferable because a high MR rate of change can be obtained. The crystalline orientation dispersion angle is preferably not more than 10°, and more preferably not more than 5°, as in Working Example 15-6.

It was confirmed from the cross-section TEM observation results of the magneto-resistive effect device 10 of Working Example 15-6 that the oxide layer 21 was formed uniformly between the spacer layer 16 and the free layer 18.

Sixteenth Embodiment

Next, a magneto-resistive effect device according to a sixteenth embodiment will be described.

Aside from changing the Zn concentration X in $Zn_X(Fe_{50}Co_{50})_{1-X}$, the metal in the Zn—Fe—Co—O film used for the oxide layer 21, the configuration of the magneto-resistive effect device according to this embodiment was the same as that of the magneto-resistive effect device according to the first embodiment illustrated in FIG. 5.

Table 16 shows the MR rate of change and the resistance area of the magneto-resistive effect device according to the sixteenth embodiment where the Zn concentration X in $Zn_X(Fe_{50}Co_{50})_{1-X}$ was changed.

TABLE 16

| | Oxide layer structure | Zn composition in the metal [at. %] | MR [%] | RA [Ωμm²] |
|---|---|---|---|---|
| Comparative Example 16-1 | — | — | 1.5 | 0.05 |
| Working Example 16-1 | NaCl structure; $(Fe_{50}Co_{50})O_x$ (Wustit) | 0 | 7.5 | 0.2 |
| Working Example 16-2 | NaCl structure; $((Fe_{50}Co_{50})-Zn)O_x$ (Wustit) | 0.5 | 12 | 0.21 |
| Working Example 16-3 | NaCl structure; $((Fe_{50}Co_{50})-Zn)O_x$ (Wustit) | 2 | 13.5 | 0.21 |
| Working Example 16-4 | NaCl structure; $((Fe_{50}Co_{50})-Zn)O_x$ (Wustit) | 5 | 16 | 0.2 |
| Working Example 16-5 | NaCl structure; $((Fe_{50}Co_{50})-Zn)O_x$ (Wustit) | 10 | 18.6 | 0.21 |
| Working Example 16-6 | NaCl structure; $((Fe_{50}Co_{50})-Zn)O_x$ (Wustit) | 15 | 18.9 | 0.23 |
| Working Example 16-7 | NaCl structure; $((Fe_{50}Co_{50})-Zn)O_x$ (Wustit) | 20 | 17.5 | 0.22 |
| Working Example 16-8 | NaCl structure; $((Fe_{50}Co_{50})-Zn)O_x$ (Wustit) | 30 | 17.4 | 0.22 |
| Working Example 16-9 | NaCl structure; $((Fe_{50}Co_{50})-Zn)O_x$ (Wustit) | 50 | 14 | 0.22 |
| Working Example 16-10 | NaCl structure; $((Fe_{50}Co_{50})-Zn)O_x$ (Wustit) | 70 | 7.2 | 0.23 |

As shown in Table 16, Comparative Example 16-1 is an example of a magneto-resistive effect device in which the oxide layer 21 is not formed. Working Example 16-1 is an example of a magneto-resistive effect device in which the Zn concentration X in $Zn_X(Fe_{50}Co_{50})_{1-X}$ is 0 or, rather, $(Fe_{50}Co_{50})O_x$ (Wustit) is used as the oxide layer 21. Working Examples 16-2 to 16-10 are examples of magneto-resistive effect devices in which the Zn concentrations X in $Zn_X(Fe_{50}Co_{50})_{1-X}$ are 0.5, 2, 5, 10, 15, 20, 30, 50, and 70 at. %, respectively.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Zn—Fe—O [1.5 nm]
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 16. As a result of arduous investigation into the conditions for surface oxidizing the oxide layer 21, the inventors succeeded in fabricating a (111) oriented film with a NaCl structure that is a Zn—Fe—Co—O film. Additionally, the Zn concentration X in the $Zn_X(Fe_{50}Co_{50})_{1-X}$ in the oxide layer 21 was measured using inductively coupled plasma mass spectrometry (ICP-MS).

As shown in Table 16, the devices of Working Examples 16-1 to 16-10 in which the Zn—Fe—Co—O films with NaCl structures were inserted as spin filtering layers displayed higher MR rates of change than Comparative Example 16-1 wherein the device was not provided with a spin filtering layer when the Zn concentration X in $Zn_X(Fe_{50}Co_{50})_{1-X}$, the metal in the Zn—Fe—Co—O film, was in a range from 0% to 70%. Additionally, a particularly high MR rate of change was confirmed when the Zn concentration X was in a range from 0.5% to 50%.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 16-6, it was confirmed that the diffraction pattern corresponded to the (111) plane orientation of a NaCl structure.

Additionally, the crystalline orientation dispersion angle of the oxide layer of Working Example 16-6 was 5°. A smaller crystalline orientation dispersion angle is preferable because a high MR rate of change can be obtained. The crystalline orientation dispersion angle is preferably not more than 10°, and more preferably not more than 5°, as in Working Example 16-6.

It was confirmed from the cross-section TEM observation results of the magneto-resistive effect device 10 of Working Example 16-6 that the oxide layer 21 was formed uniformly between the spacer layer 16 and the free layer 18.

Seventeenth Embodiment

Next, a magneto-resistive effect device according to a seventeenth embodiment will be described.

Aside from changing the Zn concentration X in $Zn_XFe_{1-X}$, the metal in the Zn—Fe—O film used for the oxide layer 21, the configuration of the magneto-resistive effect device according to this embodiment was the same as that of the magneto-resistive effect device according to the first embodiment illustrated in FIG. 5.

Table 17 shows the MR rate of change and the resistance area of the magneto-resistive effect device according to the seventeenth embodiment where the Zn concentration X in $Zn_XFe_{1-X}$ was changed.

TABLE 17

| | Crystalline structure | Zn composition in the metal [at. %] | MR [%] | RA [Ωμm²] |
|---|---|---|---|---|
| Comparative Example 17-1 | = | = | 1.5 | 0.05 |
| Comparative Example 17-2 | = | = | 3.2 | 0.23 |
| Working Example 17-1 | Spinel structure; (Fe—Zn)$_3$O$_4$ | 0.5 | 7 | 0.22 |
| Working Example 17-2 | Spinel structure; (Fe—Zn)$_3$O$_4$ | 2 | 8.8 | 0.22 |
| Working Example 17-3 | Spinel structure; (Fe—Zn)$_3$O$_4$ | 5 | 9 | 0.21 |
| Working Example 17-4 | Spinel structure; (Fe—Zn)$_3$O$_4$ | 10 | 11 | 0.24 |
| Working Example 17-5 | Spinel structure; (Fe—Zn)$_3$O$_4$ | 15 | 11 | 0.2 |
| Working Example 17-6 | Spinel structure; (Fe—Zn)$_3$O$_4$ | 20 | 10.5 | 0.2 |
| Working Example 17-7 | Spinel structure; (Fe—Zn)$_3$O$_4$ | 30 | 9 | 0.22 |
| Working Example 17-8 | Spinel structure; (Fe—Zn)$_3$O$_4$ | 50 | 8.8 | 0.3 |
| Working Example 17-9 | Spinel structure; (Fe—Zn)$_3$O$_4$ | 70 | 3.8 | 0.32 |

As shown in Table 17, Comparative Example 17-1 is an example of a magneto-resistive effect device in which the oxide layer 21 is not formed. Comparative Example 17-2 is an example of a magneto-resistive effect device in which the Zn concentration X in $Zn_XFe_{1-X}$ is 0 or, rather, $Fe_3O_4$ is used as the oxide layer 21. Working Examples 17-1 to 17-9 are examples of magneto-resistive effect devices in which the Zn concentrations X in $Zn_XFe_{1-X}$ are 0.5, 2, 5, 10, 15, 20, 30, 50, and 70 at. %, respectively.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Zn—Fe—O [1.5 nm]
Free layer 18: $Fe_{50}Co_{50}$ [3 nm]

In this embodiment, an analysis of the crystalline structure of the oxide layer 21 was performed through X-ray diffraction and XPS analysis just as in the first embodiment. Analysis results of the crystalline structure and device characteristics of the magneto-resistive effect devices 10 are both shown in Table 17. As a result of arduous investigation into the conditions for surface oxidizing the oxide layer 21, the inventors succeeded in fabricating a $Me_XO_Y$ type (111) oriented Zn—Fe—O film with a spinel structure (where Y/X≤4/3). Additionally, the Zn concentration X in the $Zn_XFe_{1-X}$ in the oxide layer 21 was measured using inductively coupled plasma mass spectrometry (ICP-MS).

As shown in Table 17, the devices of Working Examples 17-1 to 17-9 in which the $Me_XO_Y$ type (111) oriented Zn—Fe—O films with spinel structures (where Y/X≤4/3) were inserted as spin filtering layers displayed higher MR rates of change than Comparative Example 17-1 wherein the device was not provided with a spin filtering layer when the Zn concentration X in $Zn_XFe_{1-X}$, the metal in the Zn—Fe—O film, was in a range from 0.5% to 70%. Additionally, a particularly high MR rate of change was confirmed when the Zn concentration X was in a range from 0.5% to 50%.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Example 17-5, it was confirmed that the diffraction patterns corresponded to the (111) plane orientation of a spinel structure.

Additionally, the crystalline orientation dispersion angle of the oxide layer of Working Example 17-5 was 5°. A smaller crystalline orientation dispersion angle is preferable because a high MR rate of change can be obtained. The crystalline orientation dispersion angle is preferably not more than 10°, and more preferably not more than 5°, as in Working Example 17-5.

It was confirmed from the cross-section TEM observation results of the magneto-resistive effect device 10 of Working Example 17-5 that the oxide layer 21 was formed uniformly between the spacer layer 16 and the free layer 18.

Eighteenth Embodiment

Next, a magneto-resistive effect device according to an eighteenth embodiment will be described.

Aside from changing the interplanar spacing in the direction perpendicular to the film face of the Zn—Fe—O film used for the oxide layer 21, the configuration of the magneto-resistive effect device according to this embodiment was the same as that of the magneto-resistive effect device according to the first embodiment illustrated in FIG. 5. As a result of arduous investigation into the conditions for surface oxidizing the oxide layer 21, the inventors succeeded in fabricating oxide layers with differing interplanar spacings.

Table 18 shows variations in the interplanar spacing in the direction perpendicular to the film face caused by the differences in the fabrication process of the Zn—Fe—O film, and the MR rate of change and the resistance area of the magneto-resistive effect device according to the eighteenth embodiment where the interplanar spacing was changed. Here, the interplanar spacing of the oxide layer 21 was confirmed by directly measuring the oxide layer 21 observed using a bright field image of a cross-section TEM of the magneto-resistive effect device 10.

TABLE 18

| | Oxide layer forming process | Crystal interplanar spacing in the direction perpendicular to the film face of the oxide layer [nm] | MR [%] | RA [Ωμm²] |
|---|---|---|---|---|
| Comparative Example 18-1 | None | = | 1.5 | 0.05 |
| Comparative Example 18-2 | Fe10A/Zn6A sputter-formed → Low | 0.241 | 3.5 | 0.22 |

TABLE 18-continued

| Oxide layer forming process | Crystal interplanar spacing in the direction perpendicular to the film face of the oxide layer [nm] | MR [%] | RA [Ωμm²] |
|---|---|---|---|
| Working Example 18-1 | Fe10A/Zn6A sputter-formed → Low acceleration IAO (Vb = 60 b, Ib = 60 mA) → Then, Ar plasma irradiation (5 W) | 0.242 | 10.5 | 0.21 |
| Working Example 18-2 | Fe10A/Zn6A sputter-formed → Low acceleration IAO (Vb = 60 b, Ib = 60 mA) → Then, Ar plasma irradiation (10 W) | 0.245 | 13 | 0.24 |
| Working Example 18-3 | Fe10A/Zn6A sputter-formed → Low acceleration IAO (Vb = 60 b, Ib = 60 mA) → Then, Ar plasma irradiation (20 W) | 0.247 | 15 | 0.24 |
| Working Example 18-4 | Fe10A/Zn6A sputter-formed → Low acceleration IAO (Vb = 60 b, Ib = 60 mA) → Then, Ar plasma irradiation (40 W) | 0.249 | 18 | 0.21 |
| Working Example 18-5 | Fe10A/Zn6A sputter-formed → Low acceleration IAO (Vb = 60 b, Ib = 60 mA) → Then, Ar plasma irradiation (60 W) | 0.252 | 18.5 | 0.24 |
| Working Example 18-6 | Fe10A/Zn6A sputter-formed → Low acceleration IAO (Vb = 60 b, Ib = 60 mA) → Then, Ar plasma irradiation (80 W) | 0.255 | 16.2 | 0.2 |
| Working Example 18-7 | Fe10A/Zn6A sputter-formed → Low acceleration IAO (Vb = 60 b, Ib = 60 mA) → Then, Ar plasma irradiation (100 W) | 0.26 | 14.4 | 0.21 |
| Working Example 18-8 | Fe10A/Zn6A sputter-formed → Low acceleration IAO (Vb = 60 b, Ib = 60 mA) → Then, Ar plasma irradiation (120 W) | 0.261 | 7.5 | 0.18 |

As shown in Table 18, Comparative Example 18-1 is an example of a magneto-resistive effect device in which the oxide layer 21 is not formed. Comparative Example 18-2 is an example of a magneto-resistive effect device in which the oxide layer 21 is formed by depositing, by a sputtering method, 1.0 nm of iron and 0.6 nm of zinc (Zn), and then performing ion beam assisted oxidation under low acceleration IAO beam conditions (acceleration voltage Vb=60 V, beam current Ib=60 mA). The interplanar spacing in the direction perpendicular to the film face of the formed oxide layer 21 was 0.241 nm.

Working Examples 18-1 to 18-8 are examples of magneto-resistive effect devices in which the oxide layer 21 is formed by depositing, by a sputtering method, 1.0 nm of iron and 0.6 nm of zinc, and then performing ion beam assisted oxidation under low acceleration IAO beam conditions (acceleration voltage Vb=60 V, beam current Ib=60 mA). Furthermore, after the ion beam assisted oxidation, argon (Ar) plasma irradiation was performed. In Working Examples 18-1 to 18-8, by changing the input power of the Ar plasma when irradiating to high acceleration conditions of 5, 10, 20, 40, 60, 80, 100, and 120 W, respectively, oxide layers 21 having interplanar spacings of 0.242, 0.245, 0.247, 0.249, 0.252, 0.255, 0.26, and 0.261 nm, respectively, were successfully fabricated as shown in Table 18.

Other configurations aspects are the same as for the magneto-resistive effect device according to the first embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$ [4 nm]
Spacer layer 16: Cu [1.5 nm]
Oxide layer 21: Shown in Table 18 [1.5 nm]
Free layer 18: $Fe_{50}Co_{50}$ [3 nm]

As shown in Table 18, the devices of Working Examples 18-1 to 18-8 and Comparative Example 18-2 in which the Zn—Fe—O film is provided displayed a higher MR rate of change than the device of Comparative Example 18-1 in which the spin filtering layer was not provided. Additionally, a particularly high MR rate of change was confirmed when the interplanar spacing in the direction perpendicular to the film face of the oxide layer 21 was in a range from 0.242 nm to 0.26 nm.

Regarding the dependence of the MR rate of change on the interplanar spacing in the direction perpendicular to the film face of the oxide layer 21, a high MR rate of change was confirmed not only in the cases shown in Table 18 where the Zn content in the $(Zn_{15}Fe_{85})$—O film was 15 at. %, but also when the amount of Zn in the $(Zn_XFe_{1-X})$—O film was in a range from 0.5 at. % 50 at. %. In both cases, a high MR rate of change, in a range of from 0.242 nm to 0.26 nm, was realized. Additionally, in addition to the $(Zn_{15}Fe_{85})$—O film shown in Table 18, a high MR rate of change, in the range of from 0.242 nm to 0.26 nm, was likewise confirmed for oxide layers 21 in which a Fe—O film or a Fe—O film to which from 0.5 at. % to 50 at. % of another element (other than Zn) such as In, Sn, Cd, Co, Ni, Cu, Ti, V, Cr, Mn, Al, Si, Mg, Pt, Pd, Ag, Zr, Hf, or Ta was added was included.

In addition to confirming by directly measuring the interplanar spacing of the oxide layer observed using a bright field image of a cross-section TEM, the interplanar spacing of the oxide layer can also be measured by taking a nanodiffraction pattern by irradiating the oxide layer portion of the cross-section TEM material of the magneto-resistive effect device 10 with an electron beam narrowed to a diameter of about 1 nm. Additionally, measurement is possible by performing a fast fourier transformation (FFT) analysis on the oxide layer portion of the bright field image of the cross-section TEM of the magneto-resistive effect device 10.

The crystalline structure of the oxide layer 21 described above can be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Examples 18-1 to 18-8, it was confirmed that the diffraction pattern corresponded to the (111) plane orientation of a NaCl structure or the (111) plane orientation of a spinel structure. Therefore, a particularly high MR rate of change was confirmed when the crystalline orientation of the metal oxide included in the oxide layer was a (111) plane orientation, and the interplanar spacing of the (111) plane was not less than 0.242 nm and not more than 0.26 nm.

Additionally, the crystalline orientation dispersion angle of the oxide layer of Working Example 18-5 was 5°. A smaller crystalline orientation dispersion is preferable because a high MR rate of change can be obtained. The crystalline orientation dispersion angle is preferably not more than 10°, and more preferably not more than 5°, as in Working Example 18-5.

It was confirmed from the cross-section TEM observation results of the magneto-resistive effect device 10 of Working Example 18-5 that the oxide layer 21 was formed uniformly between the spacer layer 16 and the free layer 18.

Nineteenth Embodiment

Next, a magneto-resistive effect device according to a nineteenth embodiment will be described.

Aside from changing the material used for the oxide layer 21 from the Zn—Fe—O film to a Zn—FeCo—O film, the configuration of the magneto-resistive effect device according to this embodiment was the same as that of the magneto-resistive effect device according to the first embodiment illustrated in FIG. 5. As a result of arduous investigation into the conditions for surface oxidizing the oxide layer 21, the inventors succeeded in fabricating oxide layers with differing interplanar spacings in Zn—FeCo—O films as well.

Table 19 shows variations in the interplanar spacing in the direction perpendicular to the film face caused by the differences in the fabrication process of the Zn—FeCo—O film, and the MR rate of change and the resistance area of the magneto-resistive effect device according to the nineteenth embodiment where the interplanar spacing was changed. Here, the interplanar spacing of the oxide layer 21 was confirmed by directly measuring the oxide layer 21 observed using a bright field image of a cross-section TEM of the magneto-resistive effect device 10.

TABLE 19

| | Oxide layer forming process | Crystal interplanar spacing in the direction perpendicular to the film face of the oxide layer [nm] | MR [%] | RA [Ωμm²] |
|---|---|---|---|---|
| Comparative Example 19-1 | None | = | 1.5 | 0.05 |
| Comparative Example 19-2 | $Fe_{50}Co_{50}10A/Zn6A$ sputter-formed → Low acceleration IAO (Vb = 60 b, Ib = 60 mA) | 0.241 | 3.3 | 0.22 |
| Working Example 19-1 | $Fe_{50}Co_{50}10A/Zn6A$ sputter-formed → Low acceleration IAO (Vb = 60 b, Ib = 60 mA) → Then, Ar plasma irradiation (5 W) | 0.242 | 12 | 0.21 |
| Working Example 19-2 | $Fe_{50}Co_{50}10A/Zn6A$ sputter-formed → Low acceleration IAO (Vb = 60 b, Ib = 60 mA) → Then, Ar plasma irradiation (10 W) | 0.245 | 14.5 | 0.21 |
| Working Example 19-3 | $Fe_{50}Co_{50}10A/Zn6A$ sputter-formed → Low acceleration IAO (Vb = 60 b, Ib = 60 mA) → Then, Ar plasma irradiation (20 W) | 0.247 | 16 | 0.23 |
| Working Example 19-4 | $Fe_{50}Co_{50}10A/Zn6A$ sputter-formed → Low acceleration IAO (Vb = 60 b, Ib = 60 mA) → Then, Ar plasma irradiation (40 W) | 0.249 | 18.9 | 0.21 |
| Working Example 19-5 | $Fe_{50}Co_{50}10A/Zn6A$ sputter-formed → Low acceleration IAO (Vb = 60 b, Ib = 60 mA) → Then, Ar plasma irradiation (60 W) | 0.252 | 18.9 | 0.22 |
| Working Example 19-6 | $Fe_{50}Co_{50}10A/Zn6A$ sputter-formed → Low acceleration IAO(Vb = 60 b, Ib = 60 mA) → Then, Ar plasma irradiation (80 W) | 0.255 | 17 | 0.2 |
| Working Example 19-7 | $Fe_{50}Co_{50}10A/Zn6A$ sputter-formed → Low acceleration IAO (Vb = 60 b, Ib = 60 mA) → Then, Ar plasma irradiation (100 W) | 0.26 | 16.5 | 0.21 |
| Working Example 19-8 | $Fe_{50}Co_{50}10A/Zn6A$ sputter-formed → Low acceleration IAO (Vb = 60 b, Ib = 60 mA) → Then, Ar plasma irradiation (120 W) | 0.261 | 8 | 0.18 |

As shown in Table 19, Comparative Example 19-1 is an example of a magneto-resistive effect device in which the oxide layer 21 is not formed. Comparative Example 19-2 is an example of a magneto-resistive effect device in which the oxide layer 21 is formed by depositing, by a sputtering method, 1.0 nm of $Fe_{50}Co_{50}$ and 0.6 nm of zinc, and then performing ion beam assisted oxidation under low acceleration IAO beam conditions (acceleration voltage Vb=60 V, beam current Ib=60 mA). The interplanar spacing in the direction perpendicular to the film face of the formed oxide layer 21 was 0.241 nm.

Working Examples 19-1 to 19-8 are examples of magneto-resistive effect devices in which the oxide layer 21 is formed by depositing, by a sputtering method, 1.0 nm of $Fe_{50}Co_{50}$ and 0.6 nm of zinc, and then performing ion beam assisted oxidation under low acceleration IAO beam conditions (acceleration voltage Vb=60 V, beam current Ib=60 mA). Furthermore, after the ion beam assisted oxidation, argon (Ar) plasma irradiation was performed. In Working Examples 19-1 to 19-8, by changing the input power of the Ar plasma when irradiating to high acceleration conditions of 5, 10, 20, 40, 60, 80, 100, and 120 W, respectively, oxide layers 21 having interplanar spacings of 0.242, 0.245, 0.247, 0.249, 0.252, 0.255, 0.26, and 0.261 nm, respectively, were successfully fabricated.

Other configurations aspects are the same as for the magneto-resistive effect device according to the nineteenth embodiment, as described below.

Base material layer 12: Ta [1 nm]/Ru [2 nm]
Pinning layer 13: $Ir_{22}Mn_{78}$ [7 nm]
Pinned layer 14: $Co_{90}Fe_{10}$ [4.4 nm]/Ru [0.9 nm]/$Fe_{50}Co_{50}$[4 nm]
Spacer layer 16: Cu [1.5 nm]
Oxide layer 21: Shown in Table 19 [1.5 nm]
Free layer 18: $Fe_{50}Co_{50}$ [3 nm]

As shown in Table 19, the devices of Working Examples 19-1 to 19-18 and Comparative Example 19-2 in which the Zn—FeCo—O film is provided displayed a higher MR rate of change than the device of Comparative Example 19-1 in which the spin filtering layer was not provided. Additionally, a particularly high MR rate of change was confirmed when the interplanar spacing in the direction perpendicular to the film face of the oxide layer 21 was in a range from 0.242 nm to 0.26 nm.

Regarding the dependence of the MR rate of change on the interplanar spacing in the direction perpendicular to the film face of the oxide layer 21, a high MR rate of change was confirmed not only in the cases shown in Table 18 where the Zn content in the $(Zn_{15}(Fe_{50}Co_{50})_{85})$—O film was 15 at. %, but also when the amount of Zn in the $(Zn_X(Fe_{50}Co_{50})_{1-X})$—O film was in a range from 0.5 at. % 50 at. %. In both cases, a high MR rate of change, in a range of from 0.242 nm to 0.26 nm, was realized.

Additionally, in addition to the $(Zn_{15}(Fe_{50}Co_{50})_{85})$—O film shown in Table 18, a high MR rate of change, in the range of from 0.242 nm to 0.26 nm, was likewise confirmed for oxide layers 21 in which a $(Fe_{50}Co_{50})$—O film or a $(Fe_{50}Co_{50})$—O film to which from 0.5 at. % to 50 at. % of another element (other than Zn) such as In, Sn, Cd, Co, Ni, Cu, Ti, V, Cr, Mn, Al, Si, Mg, Pt, Pd, Ag, Zr, Hf, or Ta was added was included. Additionally, a high MR rate of change, in the range from 0.242 nm to 0.26 nm, was confirmed when a composition X of the $Fe_XCo_{1-X}$ alloy included in the oxide layer 21 expressed by the $(Fe_XCo_{1-X})$—O film was in a range from 10 at. % to 100 at. %.

Additionally, a high MR rate of change, likewise in the range from 0.242 nm to 0.26 nm, was confirmed for the oxide layer 21 expressed by a $(Fe_XCo_{1-X})_YM_{1-Y}$-O film (where X is from 10 at. % to 100 at. %), wherein another element M such as In, Sn, Cd, Co, Ni, Cu, Ti, V, Cr, Mn, Al, Si, Mg, Pt, Pd, Ag, Zr, Hf, or Ta was added to the oxide layer 21 (where Y is from 0.5 at. % to 50 at. %).

In addition to confirming by directly measuring the interplanar spacing of the oxide layer observed using a bright field image of a cross-section TEM, the interplanar spacing of the oxide layer can also be measured by taking a nanodiffraction pattern by irradiating the oxide layer portion of the cross-section TEM material of the magneto-resistive effect device 10 with an electron beam narrowed to a diameter of about 1 nm. Additionally, measurement is possible by performing a fast fourier transformation FFT analysis on the oxide layer portion of the bright field image of the cross-section TEM of the magneto-resistive effect device 10.

The crystalline structure of the oxide layer 21 described above can also be analyzed by taking a nanodiffraction pattern by irradiating the oxide layer portion of the cross-section TEM material of the magneto-resistive effect device 10 with an electron beam narrowed to a diameter of about 1 nm. As a result of measuring the nanodiffraction pattern of the test material of Working Examples 19-1 to 19-8, it was confirmed that the diffraction pattern corresponded to the (111) plane orientation of a NaCl structure or the (111) plane orientation of a spinel structure. Therefore, a particularly high MR rate of change was confirmed when the crystalline orientation of the metal oxide included in the oxide layer was a (111) plane orientation, and the interplanar spacing of the (111) plane was not less than 0.242 nm and not more than 0.26 nm.

Additionally, the crystalline orientation dispersion angle of the oxide layer of Working Example 19-5 was 5°. A smaller crystalline orientation dispersion angle is preferable because a high MR rate of change can be obtained. The crystalline orientation dispersion angle is preferably not more than 10°, and more preferably not more than 5°, as in Working Example 19-5.

It was confirmed from the cross-section TEM observation results of the magneto-resistive effect device 10 of Working Example 19-5 that the oxide layer 21 was formed uniformly between the spacer layer 16 and the free layer 18.

Twentieth Embodiment

Next, a magneto-resistive effect device according to a twentieth embodiment will be described.

Figure 15:
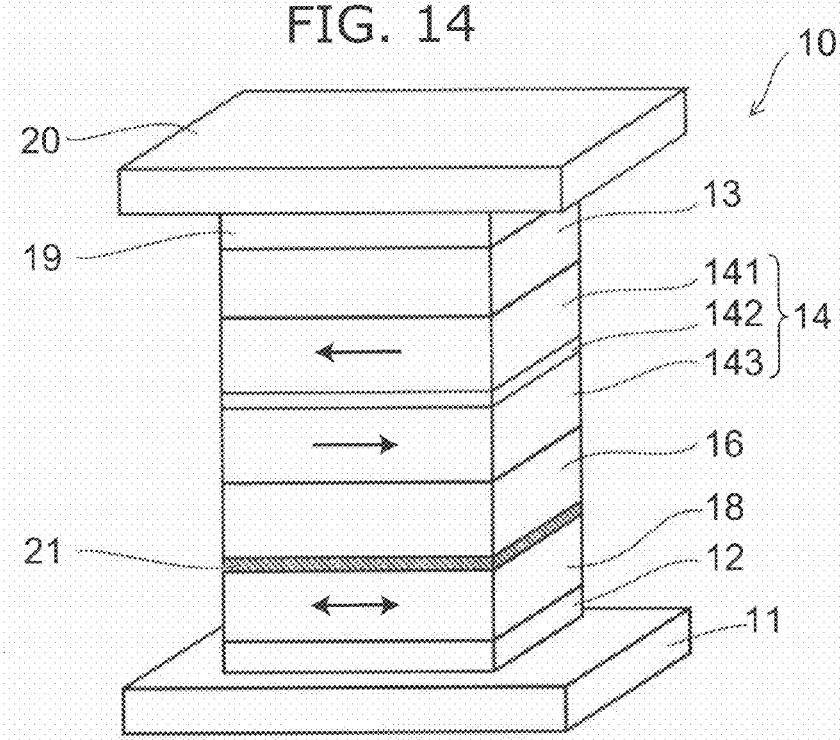
FIG. 15 is a perspective view illustrating a magneto-resistive effect device according to a twentieth embodiment.

FIG. 15 is a perspective view illustrating the magneto-resistive effect device according to the twentieth embodiment.

As shown in FIG. 15, the magneto-resistive effect device according to this embodiment differs from that of the first embodiment in that the pinned layer 14 is provided on top of the free layer 18, thus forming a top spin-valve structure.

When using the top spin-valve structure described above, high spin-dependent interfacial scattering can be displayed and MR rate of change can be greatly enhanced by providing an oxide layer with a NaCl structure or a spinel structure expressed by $Me_XO_Y$ (where Y/X≤4/3). The same materials as the materials shown in the embodiments 1 to 19 can be used for the oxide layer 21, the free layer 18, the pinned layer 14, the spacer layer, the antiferromagnetic layer 13 in the embodiment.

Therefore, a highly integrated magneto-resistive effect device can be provided.

Twenty First Embodiment

Next, a magneto-resistive effect device according to a twenty first embodiment will be described.

Figure 16:
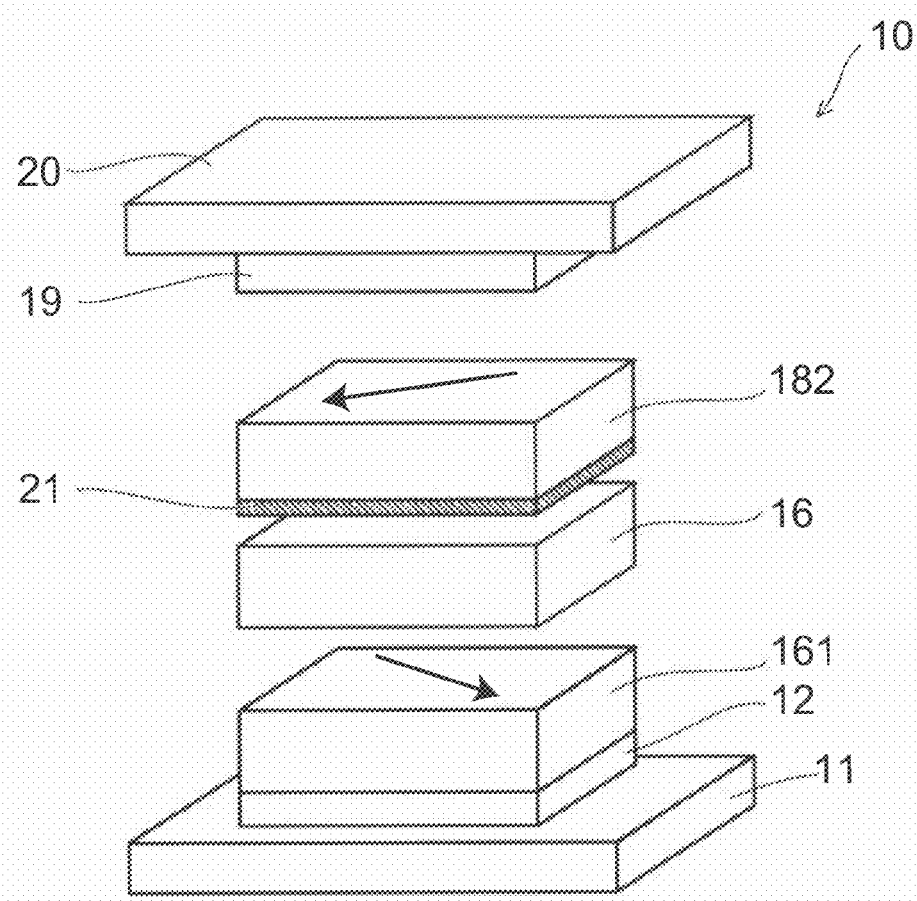
FIG. 16 is a schematic perspective view illustrating a magneto-resistive effect device according to a twenty first embodiment.

FIG. 16 is a schematic perspective view illustrating the magneto-resistive effect device according to the twenty first embodiment.

As illustrated in FIG. 16, in the magneto-resistive effect device according to this embodiment, the spacer layer 16 is provided on a free layer 181, and the oxide layer 21 is provided on the spacer layer 16. Also, another free layer 182 is provided in the oxide layer 21. In other words, the magneto-resistive effect device according to this embodiment differs from that of the first embodiment in that a pinned layer is not included and two free layers are formed.

In the magneto-resistive effect device described above, the magnetizations of the free layer 181 and the free layer 182 are biased so as to be at an angle of 90° in a state where a magnetic field from a magnetic disk is not applied. Such a magneto-resistive effect device can be used as a reproduction head due to the changing of the relative angles of the two free layers caused by the magnetic field of the magnetic disk. The 90° magnetization alignment described above can be obtained through combinations of magnetic coupling via the spacer layer 16 and hard basing, or the like.

Here, the oxide layer 21 is provided on top of the spacer layer 16 and under the free layer 182.

When using the magneto-resistive effect device formed with two free layers described above, high spin-dependent interfacial scattering can be displayed and MR rate of change can be greatly enhanced by providing an oxide layer with a NaCl structure or a spinel structure expressed by $Me_xO_Y$ (where $Y/X \leq 4/3$). The same materials as the materials shown in the embodiments 1 to 19 can be used for the oxide layer 21, the free layer 18, the pinned layer 14, the spacer layer, the antiferromagnetic layer 13 in the embodiment.

Therefore, a highly integrated magneto-resistive effect device can be provided.

Twenty Second Embodiment

Next, a magneto-resistive effect device according to a twenty second embodiment will be described.

Figure 17:
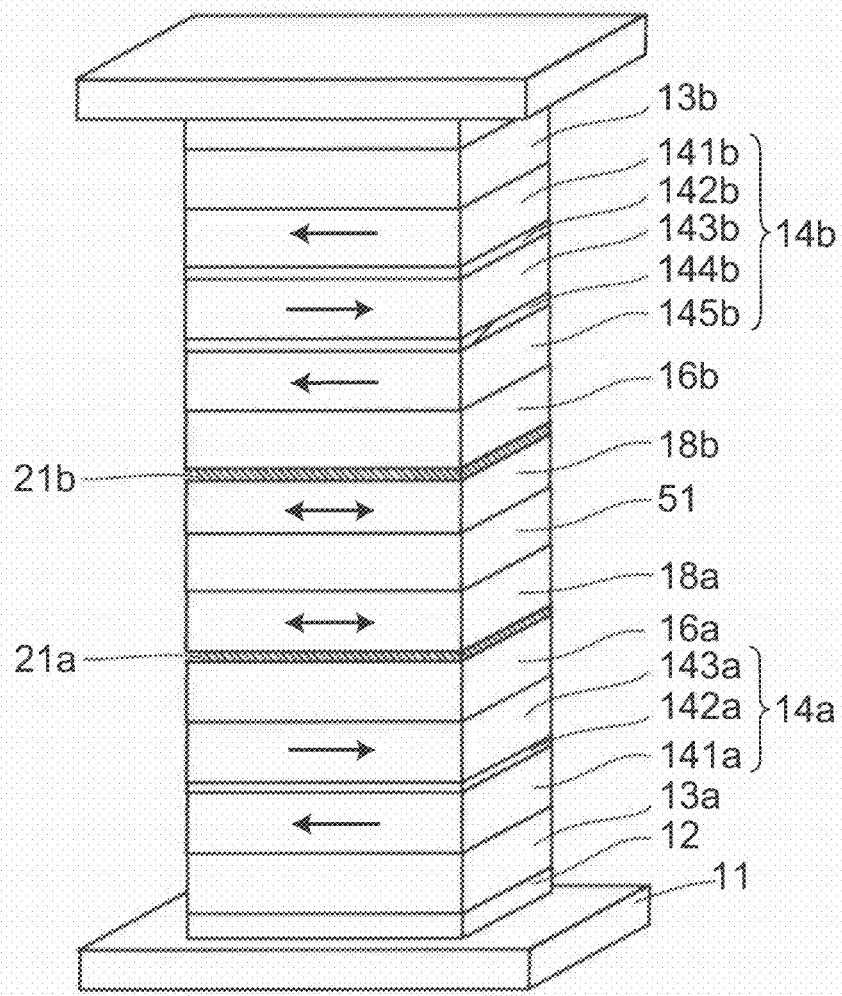
FIG. 17 is a perspective view illustrating a magneto-resistive effect device according to a twenty second embodiment.

FIG. 17 is a perspective view illustrating the magneto-resistive effect device according to the twenty second embodiment.

As illustrated in FIG. 17, in the magneto-resistive effect device according to this embodiment, a spacer layer 16a is provided on a pinned layer 14a, and a free layer 18a is provided on the spacer layer 16a. An oxide layer 21a is provided on top of the spacer layer 16a or under the free layer 18a. To this point, the magneto-resistive effect device according to this embodiment is the same as that of the first embodiment. However, an intermediate layer 51 is provided on the free layer 18a, and a free layer 18b, a spacer layer 16b, and a pinned layer 14b are subsequently provided on the intermediate layer in a configuration opposite that of the first embodiment. Also, an oxide layer 21b is provided on top of the free layer 18b or under the spacer layer 16b.

Thus, the magneto-resistive effect device according to this embodiment differs from that of the first embodiment in that it has a differential construction consisting of two magneto-resistive effect devices that are connected in a series, wherein the magnetization directions the pinned layers that contact the spacer layers are fixed in opposite directions. In the magneto-resistive effect device described above, the resistance changes of the two connected magneto-resistive effect devices display reverse polarity with respect to the external magnetic field. As a result, output in a magnetization transition region, wherein upward and downward directions of magnetizations in a vertical magnetic recording media are juxtaposed, can be obtained. In other words, differential media magnetic field detection can be performed.

A copper film with a thickness of, for example, 5 nm can be used as the intermediate layer 51. Additionally, nonmagnetic metals such as gold, silver, ruthenium, iridium, osmium, rhenium, rhodium, tantalum, and the like may be used as the intermediate layer 51. Moreover, the intermediate layer 51 may be formed from a stacked body including a layer of a ferromagnetic metal selected from the group consisting of cobalt, iron, and nickel; a layer of a nonmagnetic metal selected from the group consisting of ruthenium, iridium, osmium, rhenium, and rhodium; and a layer of a metal that produces antiferromagnetic coupling when disposed between the ferromagnetic and the nonmagnetic layers. In this case, the magnetization directions of the free layer 18a and the free layer 18b can be configured so as to be in a state of antiparallel coupling.

When using the differential-type magneto-resistive effect device described above, high spin-dependent interfacial scattering can be displayed and MR rate of change can be greatly enhanced by providing an oxide layer with a NaCl structure or a spinel structure expressed by $Me_xO_Y$ (where $Y/X \leq 4/3$). The same materials as the materials shown in the embodiments 1 to 19 can be used for the oxide layer 21, the free layer 18, the pinned layer 14, the spacer layer, the antiferromagnetic layer 13 in the embodiment.

Therefore, a highly integrated magneto-resistive effect device can be provided.

Twenty Third Embodiment

Next, a magneto-resistive effect device according to a twenty third embodiment will be described.

Figure 18:
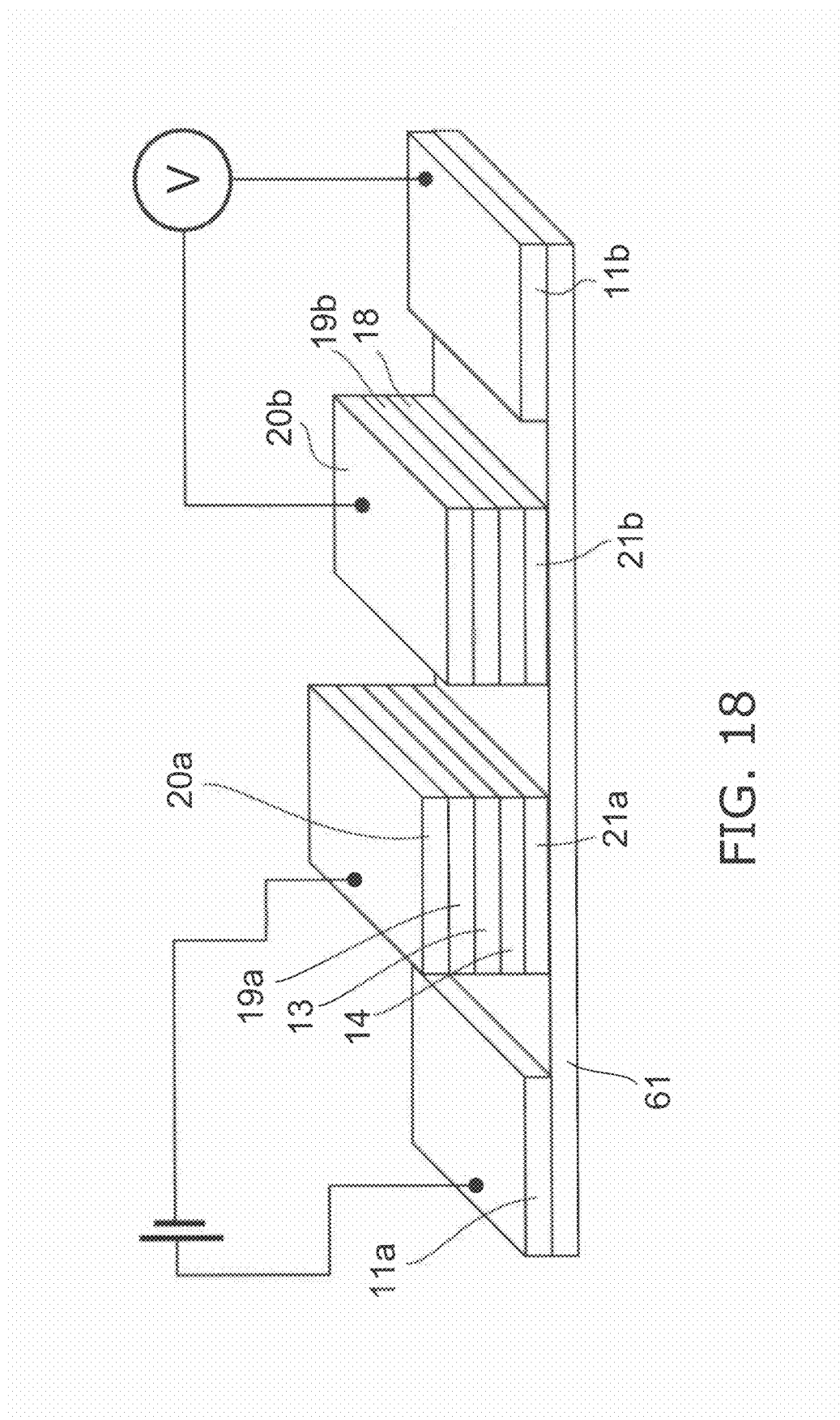
FIG. 18 is a perspective view illustrating a magneto-resistive effect device according to a twenty third embodiment.

FIG. 18 is a perspective view illustrating the magneto-resistive effect device according to the twenty third embodiment.

As illustrated in FIG. 18, the magneto-resistive effect device according to the embodiment includes a non-magnetic layer 61, a first stacked body A provided on a first region of the non-magnetic layer 61, and a second stacked body B provided on a second region of the no-magnetic layer 61. The stacked body A includes a pinned layer 14 in which the magnetization direction is fixed, and the second stacked body B includes a free layer 18 in which the magentization dirtection responses to the external magnetic field. The non-magnetic layer 61 is line shape, and its both ends are connected to an electrode 11a and an electrode 11b, respectively. An electrode 20a is connected to an opposite side to a side of the stacked body A being in contact with the non-magnetic layer 61. An electrode 20b is connected to an opposite side to a side of the stacked body B being in contact with the non-magnetic layer 61.

In FIG. 18, the electrode 11a, the electrode 11b, the stacked body A, the stacked body B, the electrode 20a and the electrode 20b are formed on the non-magnetic layer 61, however the vertical position of these may be reverse.

The magneto-resistive effect device shown in FIG. 18 is called as a spin accumulation type magneto-resistive effect device, and a current flowing path is different from a path for voltage measurement. When a current is passed between the electrodes 11a, 20a from a current source, a voltage generated between the electrodes 11b, 20b is read as an output.

When the current is passed between the electrodes 11a, 20a, a spin flow is generated in the pinned layer 14. The electrons passing through the pinned layer 14 from the electrode 20a flow to the electrode 11a through the non-magnetic layer 61 as a path. On this occasion, since the electrons do not flow into the second region having the free layer 18 formed, the current is zero in the non-magnetic layer 61 between the first region having the pinned layer formed and the second region having the free layer formed. However, the spin accumulation occurs near the interface between the pinned layer 14 and the non-magnetic layer 61. Spin diffuses from the first region accumulated with spin to form the spin current, and the spin current is absorbed by the free layer 18 in the second region. At this time, a potential of the free layer 18 changes depending on a relative angle between the free layer 18 and the pinned layer 14, and a voltage change occurs between the non-magnetic layer 61 and the free layer 18. This voltage change is detected as the output. This is an operating principle of the spin accumulation type magneto-resistive effect device.

FIG. 18 illustrates the case where the current is passed between the electrode 11a and the electrode 20a and the voltage between the electrode 11b and the electrode 20b is measured, however reversely the current is passed between the electrode 11b and the electrode 20b and the voltage between the electrode 11a and the electrode 20a may be measured.

Furthermore, a copper film of a thickness of 30 nm, for example, can be used for the non-magnetic layer 61. The non-magnetic layer 61 may include non-magnetic metal such as gold, silver, ruthenium, iridium, osmium, rhenium, rhodium, tantalum other than copper. Here, copper, silver, gold are particularly desired due to relatively long spin diffusion length.

Higher output can be obtained with a shorter distance between the first region having the first stacked body A including the pinned layer formed and the second region having the second stacked body B including the free layer 18 formed. Specifically, 1000 nm or less is desired and 200 nm or less is further desired.

Also in this spin accumulation type magneto-resistive effect device, it is possible to increase the detected output by providing an oxide layer having a NaCl structure or a spinel structure expressed by $Me_XO_Y$ ($Y/X \leq 4/3$) inside the pinned layer 14, at the interface between the pinned layer 14 and the non-magnetic layer 61, inside the free layer 18 and at the interface between the free layer 18 and the non-magnetic layer 18. FIG. 18 illustrates the case where an oxide layer 21a and an oxide layer 21b are inserted at both interface between the pinned layer 14 and the non-magnetic layer 61 and the interface between the free layer 18 and the non-magnetic layer 61, respectively, however output increasing effect can be obtained also in the case of inserting only at one interface. The same materials as the materials shown in the embodiments 1 to 19 can be used for the oxide layer 21, the free layer 18, the pinned layer 14, the spacer layer, the antiferromagnetic layer 13 in the embodiment. Therefore, a highly integrated magneto-resistive effect device can be provided.

Twenty Fourth Embodiment

Next, a magneto-resistive effect device according to a twenty fourth embodiment will be described. This embodiment pertains to a method of manufacturing the magneto-resistive effect device according to the first embodiment.

Figure 19:
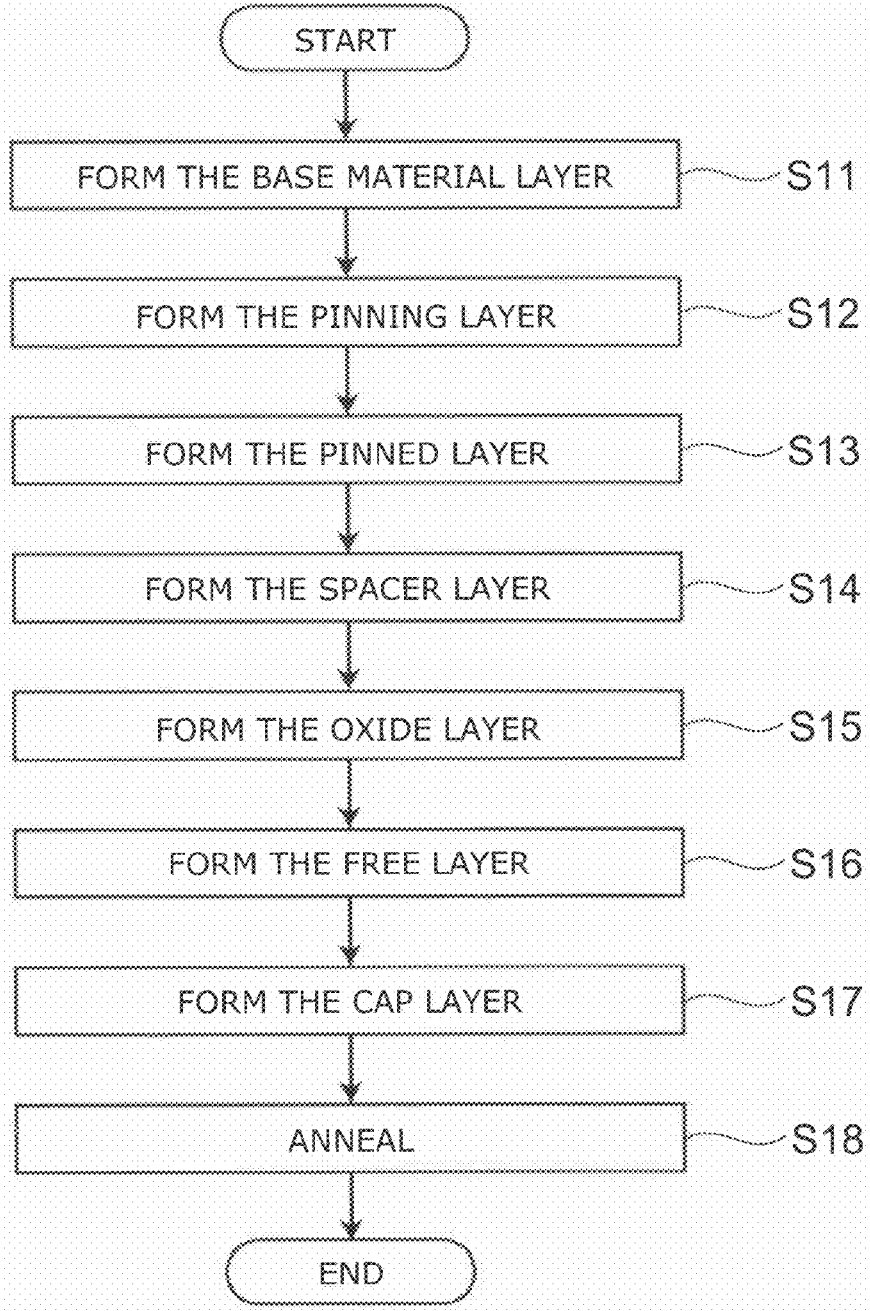
FIG. 19 is a flowchart illustrating the method of manufacturing a magneto-resistive effect device according to a twenty fourth embodiment.

FIG. 19 is a flowchart illustrating the method of manufacturing a magneto-resistive effect device according to the twenty fourth embodiment. Hereinafter, a method of manufacturing the magneto-resistive effect device 10 according to the first embodiment will be described. In this embodiment, methods used to form each of the layers include sputtering methods such as DC magnetron sputtering, RF magnetron sputtering, and the like; ion beam sputtering methods, deposition methods, chemical vapor deposition (CVD) methods, molecular beam epitaxy (MBE) methods, and the like.

As illustrated in FIG. 19, in step S11, an electrode 11 is pre-formed on a substrate (not illustrated) via a microfabrication process. Next, for example, Ta [1 nm]/Ru [2 nm] is formed on the electrode 11 as the base material layer 12. The Ta corresponds to a buffer layer that mitigates the roughness of the lower electrode. The Ru corresponds to a seed layer that controls the crystalline orientation and the crystal grain size of the spin-valve film formed thereon.

In step S12, the pinning layer 13 is formed on the base material layer 12. Examples of materials that can be used for the pinning layer 13 include antiferromagnetic materials such as IrMn, PtMn, PdPtMn, RuRhMn, and the like.

In step S13, the pinned layer 14 is formed on the pinning layer 13. The pinned layer 14 can be configured as a synthetic pinning layer, formed from, for example, the lower pinned layer 141 ($Co_{75}Fe_{25}$ [4.4 nm]), the magnetic coupling layer 142 (Ru), and the upper pinned layer 143 ($Fe_{50}Co_{50}$ [4 nm]).

In step S14, a first magnetic layer is formed on the pinned layer 14. The first metal layer is formed using a metal selected from Au, Ag, Cu, and Zn.

In step S15, the oxide layer 21 is formed on the spacer layer 16. In one example, a metal layer including Fe and Zn is formed on the spacer layer 16. Here, the metal layer including Fe and Zn may be a stacked body of a Fe layer and a Zn layer in an arrangement such as Fe/Zn, Zn/Fe, or (Fe/Zn)×2, or may be a single layer of an alloy such as $Zn_{50}Fe_{50}$. A metal layer including one material selected from the group consisting of Zn, In, Sn, and Cd; and one metal selected from Fe, Co, and Ni, can be used as the base material of the oxide layer.

Next in step S15, the metal material including Zn and Fe is subjected to oxidation treatment. Examples of the oxidation treatment that can be used include ion assisted oxidation (IAO) wherein oxidation is performed by supplying oxygen while irradiating the metal material layer with an ion beam of an inert gas or the like, or plasma. Additionally, in the ion assisted oxidation process described above, oxygen gas may be ionized or plasmatized. As a result of the energy assistance to the metal material layer via the ion beam irradiation, a stable, uniform oxide layer 21 can be formed. Additionally, the metal material layer forming and oxidation treatment described above may be repeated multiple times when forming a layer of the oxide layer 21.

In this case, an oxide layer 21 having a given thickness is not fabricated by a single process of forming and oxidizing, rather the thickness is preferably divided and thin metal material layers are subjected to the oxidation treatment.

Additionally, the metal material layer including Zn and Fe may be naturally oxidized through exposure to an oxygen atmosphere. However, a method of oxidation using energy assistance is preferable from the perspective of forming a stable oxide.

Furthermore, when the metal material including Zn and Fe is arranged as a stacked body, oxidation is preferably performed while irradiating with an ion beam as such leads to the forming of an oxide layer 21 wherein Zn and Fe are blended evenly. Additionally, an oxide target of $(Zn_{15}Fe_{85})_{0.95}O_1$ having a NaCl structure, or $(Zn_{15}Fe_{85})_3O_4$ having a spinel structure may be formed by sputtering.

After forming by sputtering using the oxide target described above, combinations of additional oxidation treatment and/or reduction treatment may be performed. By performing such additional treatments, the oxygen concentration of the Fe—Zn mixed oxide can be adjusted so that the highest spin-dependent scattering effect is displayed.

When using an ion beam of an inert gas or the like, or plasma, a gas including at least one selected from the group consisting of, for example, argon, xenon, helium, neon, and krypton can be used as the inert gas.

Note that aside from ion beam irradiation, heat treatment or the like may be performed as the method of energy assistance. In this case, for example, oxygen may be supplied while heating the metal material layer, after forming, at a temperature of from 100° C. to 300° C.

Hereinafter, beam conditions when using ion beam irradiation as the energy assistance method in the oxidation treatment for forming the oxide layer 21 are described. With the oxidation treatment, in cases of ionizing or plasmatizing the inert gas described above and irradiating therewith when forming the oxide layer 21, an acceleration voltage V thereof is preferably set to from 30 V to 130 V and a beam current Ib is preferably set to from 20 mA to 200 mA. These conditions are markedly weaker than conditions used when performing ion beam etching. The oxide layer 21 can be formed in the same manner even when using a plasma such as RF plasma or the like in place of the ion beam.

An angle of incidence is defined as 0° when the ion beam is irradiated perpendicular to the film face, and 90° when irradiated parallel to the film face. Thus, the angle of incidence varies arbitrarily in a range from 0° to 80°. A treatment time by this process is preferably from 15 seconds to 1,200 seconds, and from the perspectives of controllability and the like, is more preferably not less than 30 seconds. It is not preferable that the treatment time is excessively long because such leads to inferior productivity of the magneto-resistive effect device. From these perspectives, the treatment time is preferably from 30 seconds to 600 seconds.

When oxidation treating using ions or plasma, an amount of oxygen exposure in cases of IAO is preferably from $1\times10^3$ to $1\times10^4$ L (Langmiur; 1 L=$1\times10^{-6}$ Torr×sec). In cases of natural oxidation the amount of oxygen exposure is preferably from $3\times10^3$ L to $3\times10^4$ L.

Next in step S15, reduction treatment using a reducing gas may be performed. Examples of the reducing gas that can be used include gases that contain at least one of ions, plasma, or radicals of argon, helium, neon, krypton, or xenon; or molecules, ions, or plasma of hydrogen or nitrogen. Particularly, a gas that contains at least one of ions or plasma of argon, helium, neon, krypton, or xenon; or ions or plasma of hydrogen or nitrogen is preferably used as the reducing gas.

Furthermore, a gas containing at least one of ions or plasma of argon is preferably used as the reducing gas. The oxygen concentration of the film formed from the oxidation treated base material can be adjusted through the reduction treatment, and can be adjusted to have an oxygen concentration that at which the strongest spin-filtering effect is displayed.

The reduction treatment can be performed while heating the film formed from the oxidation treated base material. For example, reduction treatment can be performed on a base material that has been heated to from 100° C. to 300° C. The heating enhances the effectiveness of the reduction treatment. Here, the reduction treated film can be further subjected to a moisture removal treatment selected from the group consisting of argon ion irradiation, argon plasma irradiation, and heating. Thereby, moisture that is produced at reduction treatment can be removed.

Additionally, in the fabrication of the oxide layer 21, after the process described above is completed, the oxidation treatment and the reduction treatment may be repeated. By alternating the produced moisture removal and the reduction treatment, the film can be more effectively reduced.

Beam conditions for the reduction treatment, particularly when performing Ar ion beam irradiation, are described below. With the reduction treatment, in cases of ionizing or plasmatizing the inert gas described above and irradiating therewith when forming the oxide layer 21, the acceleration voltage V thereof is preferably set to from 30 V to 130 V and the beam current Ib is preferably set to from 20 mA to 200 mA. These conditions are markedly weaker than conditions used when performing ion beam etching. The oxide layer 21 can be formed in the same manner even when using a plasma such as RF plasma or the like in place of the ion beam. An angle of incidence is defined as 0° when the ion beam is irradiated perpendicular to the film face, and 90° when irradiated parallel to the film face. Thus, the angle of incidence varies arbitrarily in a range from 0° to 80°. A treatment time by this process is preferably from 15 seconds to 1,200 seconds, and from the perspectives of controllability and the like, is more preferably not less than 30 seconds. It is not preferable that the treatment time is excessively long because such leads to inferior productivity of the magneto-resistive effect device. From these perspectives, the treatment time is preferably from 30 seconds to 600 seconds.

In step S16, the free layer 18 is formed into a second magnetic layer. The free layer 18 includes, for example, $Fe_{50}Co_{50}$ [1 nm]/$Ni_{90}Fe_{10}$ [3 nm].

In step S17, the cap layer 19 is formed on the free layer 18. The cap layer 19 includes, for example, Cu [1 nm]/Ru [10 nm].

In step S18, annealing is performed.

Thereafter, an electrode 20 for allowing perpendicular current flow to the magneto-resistive effect device 10 is formed on the cap layer 19.

According to this embodiment, the MR rate of change can be enhanced and a highly integrated magneto-resistive effect device can be provided.

Twenty Fifth Embodiment

Next, a twenty fifth embodiment will be described. This embodiment is an embodiment of a magnetic head.

Figure 20:
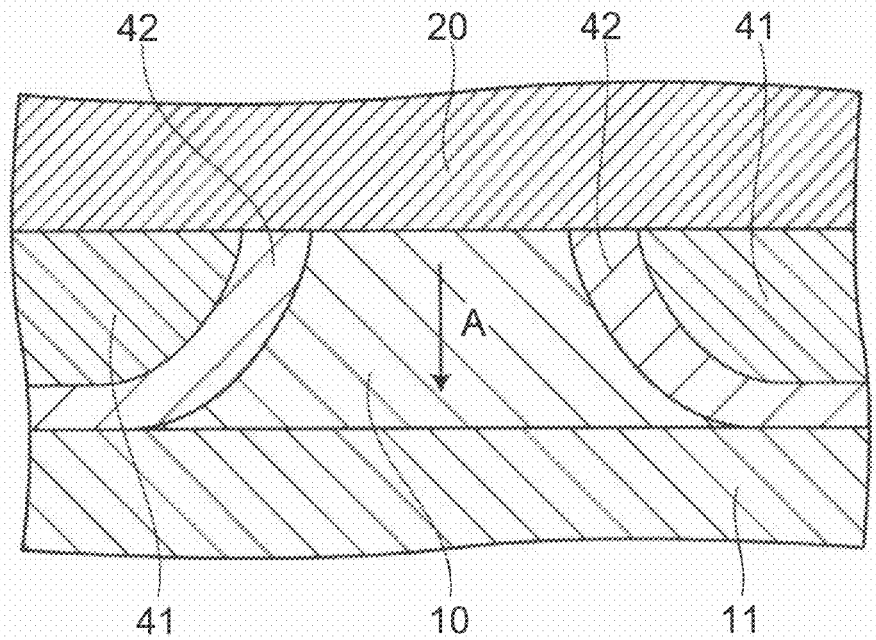
FIG. 20 is a cross-sectional view illustrating a magnetic head according to a twenty fifth embodiment.
Figure 21:
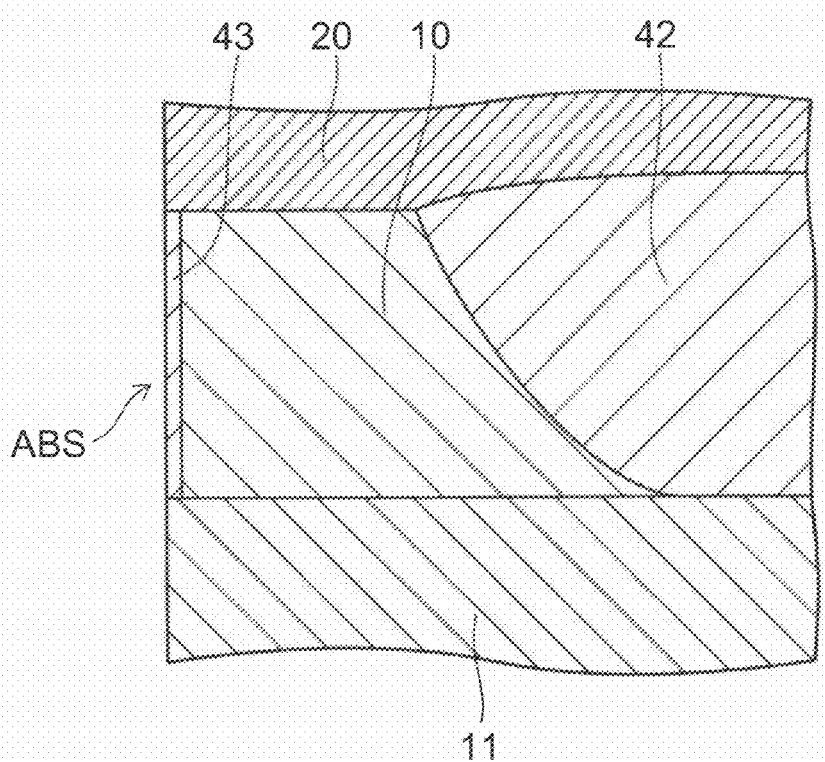
FIG. 21 is a cross-sectional view illustrating the magnetic head according to the twenty fifth embodiment.

FIGS. 20 and 21 are cross-sectional views illustrating magnetic heads according to the twenty fifth embodiment.

FIG. 20 is a cross-sectional view in which the magneto-resistive effect device 10 has been cut along a direction substantially parallel to a media opposing face (ABS face) that opposes a magnetic recording media (not illustrated). FIG. 21 is a cross-sectional view in which the magneto-resistive effect device 10 has been cut along a direction perpendicular to the ABS face.

The recording heads illustrated in FIGS. 20 and 21 have what is called a "hard abutted" structure. The bottom electrode 11 and the top electrode 20 are provided on top of and under the magneto-resistive effect device 10. In FIG. 20, a bias magnetic field application film 41 and an insulating film 42 are provided on both sides of the magneto-resistive effect device 10. As illustrated in FIG. 21, a protective layer 43 is provided on the ABS face of the magneto-resistive effect device 10.

Sense current to the magneto-resistive effect device 10 is supplied, as indicated by the arrow A, in a substantially perpendicular direction to the film face via the bottom electrode 11 and the top electrode 20 that are disposed on top of and under the magneto-resistive effect device 10. Additionally, a bias magnetic field is applied to the magneto-resistive effect device 10 by the pair of bias magnetic field application films 41 provided on both sides (left and right sides) of the magneto-resistive effect device 10. This bias magnetic field stabilizes the magnetic domain structure of the free layer 18 of the magneto-resistive effect device 10 by rendering the domain structure thereof as a single domain structure through controlling the magnetic anisotropy; and Barkhausen noise caused by magnetic-wall shifts in the magneto-resistive effect device 10 can be suppressed.

Since the S/N ratio of the magneto-resistive effect device 10 is enhanced, high sensitive magnetic reproduction is possible when used as a magnetic head.

Therefore, a magnetic head can be provided that enhances the MR rate of change.

Twenty Sixth Embodiment

Next, a twenty sixth embodiment will be described. This embodiment pertains to a magnetic recording/reproduction device.

Figure 22:
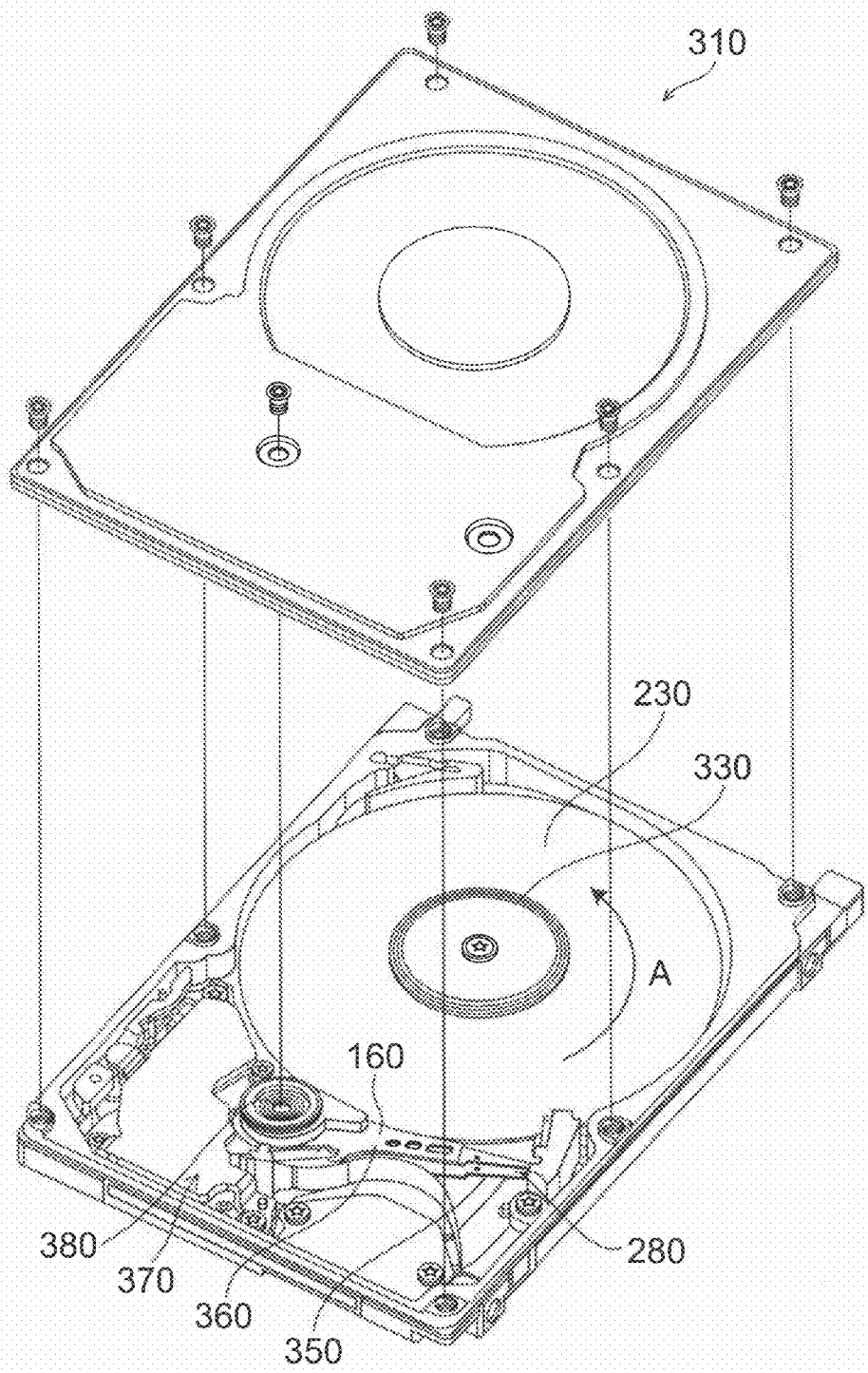
FIG. 22 is a perspective view illustrating a magnetic recording/reproduction device according to a twenty sixth embodiment.

FIG. 22 is a perspective view illustrating the magnetic recording/reproduction device according to the twenty sixth embodiment.

As illustrated in FIG. 22, a magnetic recording/reproduction device 310 according to this embodiment is a rotary actuator-type device. A magnetic recording media 230 is provided with a spindle motor 330, and is rotated in a media movement direction A by a motor (not illustrated) that responds to control signals from a drive control unit (not illustrated). The magnetic recording/reproduction device 310 may include a plurality of the magnetic recording media 230.

Figure 23:
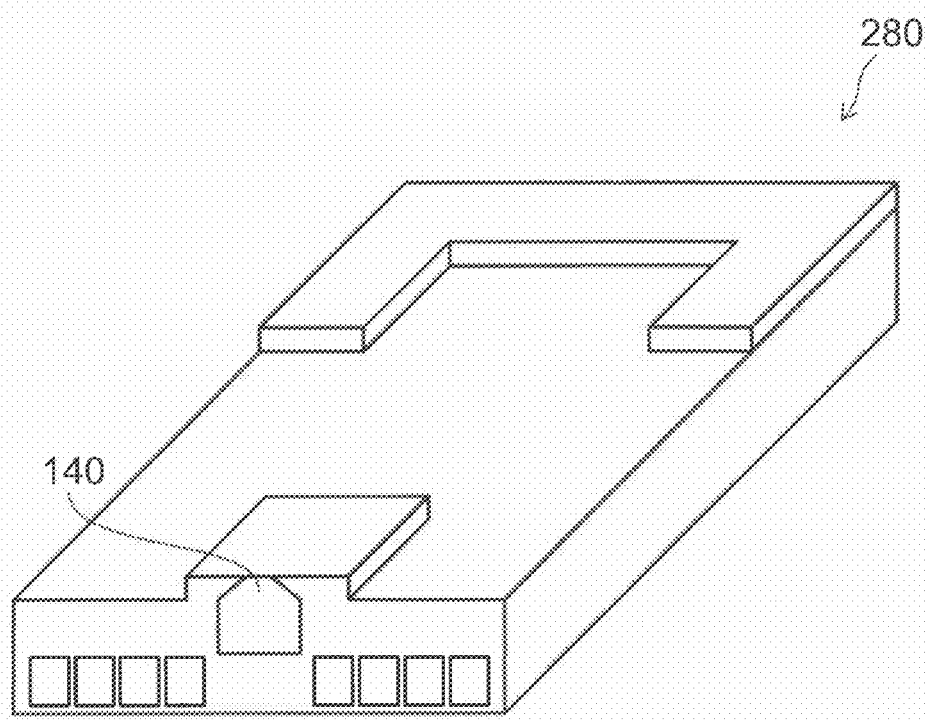
FIG. 23 is a perspective view illustrating a head slider on which the magnetic head is provided, according to a twenty sixth embodiment.

FIG. 23 is a perspective view illustrating a head slider on which the magnetic head is provided, according to the twenty sixth embodiment.

As illustrated in FIG. 23, a head slider 280 that records/reproduces the data stored on the magnetic recording media 230 is provided with a magnetic head 140 including the magneto-resistive effect device 10. The head slider 280 is formed from $Al_2O_3$/TiC or the like, and is designed so as to be able to move relatively while floating over or contacting the magnetic recording media 230 (e.g. a magnetic disk or the like).

The head slider 280 is mounted on a tip of a thin-film suspension 350. The magnetic head 140 is provided near the tip of the head slider 280.

When the magnetic recording media 230 rotates, downward pressure from the suspension 350 and pressure generated at the media opposing face (ABS face) of the head slider 280 balance each other out. The media opposing face of the head slider 280 is supported at a predetermined floating height from the surface of the magnetic recording media 230. The head slider 280 may have a "contact running" configuration where the head slider 280 contacts the magnetic recording media 230.

The suspension 350 is connected to a first end of an actuator arm 360 have has a bobbin portion or the like for supporting a drive coil (not illustrated). A voice coil motor 370, which is a type of linear motor, is provided on a second end of the actuator arm 360. The voice coil motor 370 is constituted from a drive coil (not illustrated) that is wound around the bobbin portion of the actuator arm 360, and a magnetic circuit with a permanent magnet and a counter yoke which are disposed opposite to one another so as to sandwich the drive coil.

The actuator arm 360 is supported by ball bearings (not illustrated) provided at two locations, at the top and bottom of a bearing part 380. Thereby, the actuator arm 360 can be rotated and slid freely by the voice coil motor 370. As a result, it is possible to move the magnetic head 140 to any position on the magnetic recording media 230.

A highly integrated magnetic head can be provided through the configuration described above.

Twenty Seventh Embodiment

Next, a twenty seventh embodiment will be described. This embodiment is an embodiment of a magnetic head assembly.

Figure 24A:
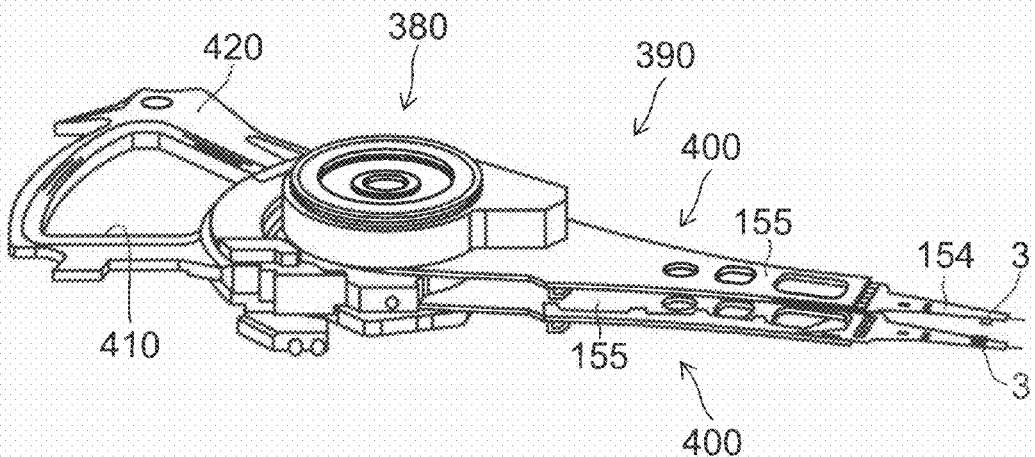
FIG. 24A is a perspective view illustrating a head stack assembly in which a magnetic head assembly according to a twenty seventh embodiment.
Figure 24B:
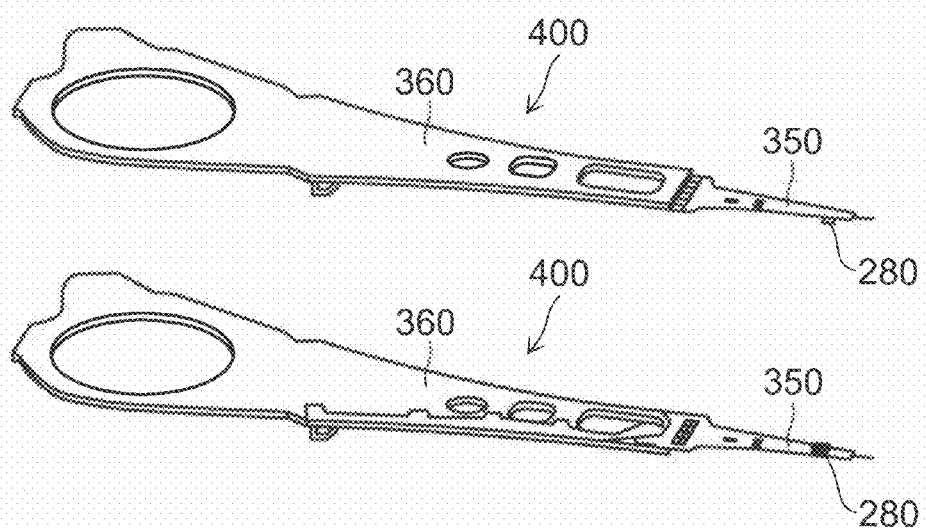
FIG. 24B is a perspective view illustrating the magnetic head assembly according to the twenty seventh embodiment.

FIG. 24A is a perspective view illustrating a head stack assembly in which a magnetic head assembly according to the twenty seventh embodiment is incorporated. FIG. 24B is a perspective view illustrating the magnetic head assembly according to the twenty seventh embodiment.

As illustrated in FIG. 24A, a head stack assembly 390 includes a bearing part 380, a head gimbal assembly 400 extending from the bearing part 380, and a support frame 420 extending from the bearing part 380 in a direction opposite that of the head gimbal assembly 400 and that supports a coil 410 of the voice coil motor.

As illustrated in FIG. 24B, the head gimbal assembly 400 includes the actuator arm 360 extending from the bearing part 380, and the suspension 350 extending from the actuator arm 360.

The head slider 280 having the magnetic recording head 140 according to these embodiments is provided on the tip of the suspension 350.

The magnetic head assembly (head gimbal assembly (HGA)) 400 according to these embodiments includes the magnetic recording head 140 of this embodiment, the head slider 280 provided with the magnetic recording head 140, the suspension 350 that has the head slider 280 mounted on the first end thereof, and the actuator arm 360 that is connected to the second end of the suspension 350.

The suspension 350 includes lead wires for reading/writing signals, heating so as to adjust the floating height, and for STO10 (not illustrated). The lead wires are in electrical connection with each of the electrodes of the magnetic recording head 140 incorporated in the head slider 280. Electrode pads (not illustrated) are provided in the head gimbal assembly 400. In this embodiment, eight of the electrode pads are provided. Two electrode pads for the main pole coil, two electrode pads for magnetic reproduction elements, two electrode pads for the dynamic flying height (DFH), and two electrode pads for the STO10 are provided.

A signal processing unit (not illustrated) is provided on a reverse side (of the drawing) of the magnetic recording/reproduction device 310 illustrated in FIG. 22. The signal processing unit reads/writes signals to/from the magnetic recording media 230 using the magnetic recording head 140. An I/O line of the signal processing unit is connected to the electrode pads of the head gimbal assembly 400, and is electrically attached to the magnetic recording head 140.

The magnetic recording/reproduction device 310 according to this embodiment includes a magnetic recording media 230, a magnetic recording head 140, a moving part that enables the magnetic recording media 230 and the magnetic recording head 140 to move relatively while in opposition in a separated or contacting state, a position controlling unit that aligns the magnetic recording head 140 to a predetermined recording position of the magnetic recording media 230, and the signal processing unit that reads/writes signals to/from the magnetic recording media 230 using the magnetic recording head 140.

The magnetic recording media 230 is used for the magnetic recording media 230 described above. The moving part can include the head slider 280. The position controlling unit described above can include the head gimbal assembly 400.

The magnetic recording/reproduction device 310 includes the magnetic recording media 230, the head gimbal assembly 400, and the signal processing unit that reads/writes signals to/from the magnetic recording media 230 using the magnetic recording head 140 mounted on the head gimbal assembly 400.

Having the magnetic head and the magnetic recording/reproduction device described above in these embodiments as a foundation, the magneto-resistive effect device according to the invention can be used in all magneto-resistive effect devices, magnetic heads, magnetic recording/reproduction devices, and magnetic memories that a person skilled in the art could find workable by applying arbitrary design changes.

In these embodiments, a bottom-type magneto-resistive effect device 10 was described, but the effects of this embodiment can also be obtained with a top-type magneto-resistive effect device 10 in which the pinned layer 14 is formed above the spacer layer 16.

Twenty Eighth Embodiment

Next, a twenty eighth embodiment will be described.

This embodiment pertains to a magnetic memory on which the magneto-resistive effect device according to the first embodiment is mounted. Specifically, in this embodiment, magnetic memory such as magnetic random access memory (MRAM) wherein, for example, memory cells are arranged in a matrix can be realized, using the magneto-resistive effect device according to the first embodiment.

Figure 25:
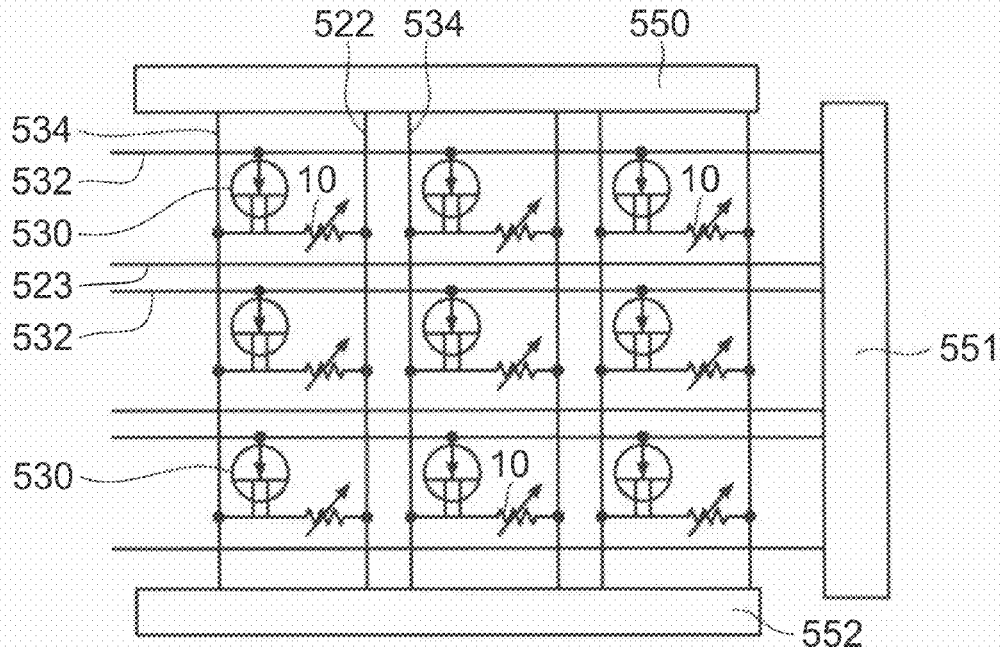
FIG. 25 is a circuit diagram illustrating a magnetic memory according to a twenty eighth embodiment.

FIG. 25 is a circuit diagram illustrating a magnetic memory according to the twenty eighth embodiment.

FIG. 25 illustrates a circuit configuration where the memory cells are arranged in an array. A column decoder 550 and a row decoder 551 are provided to select one bit in the array. The bit is uniquely selected by a switching transistor 530 being set to ON by a bit line 534 and a word line 532, and being detected by a sense amplifier 552. Thereby, bit data recorded on the magnetic recording layer (free layer) in the magneto-resistive effect device 10 can be read. In order to write bit data, a magnetic field generated when write current is supplied to a specific write word line 523 and bit line 522 is applied.

Figure 26:
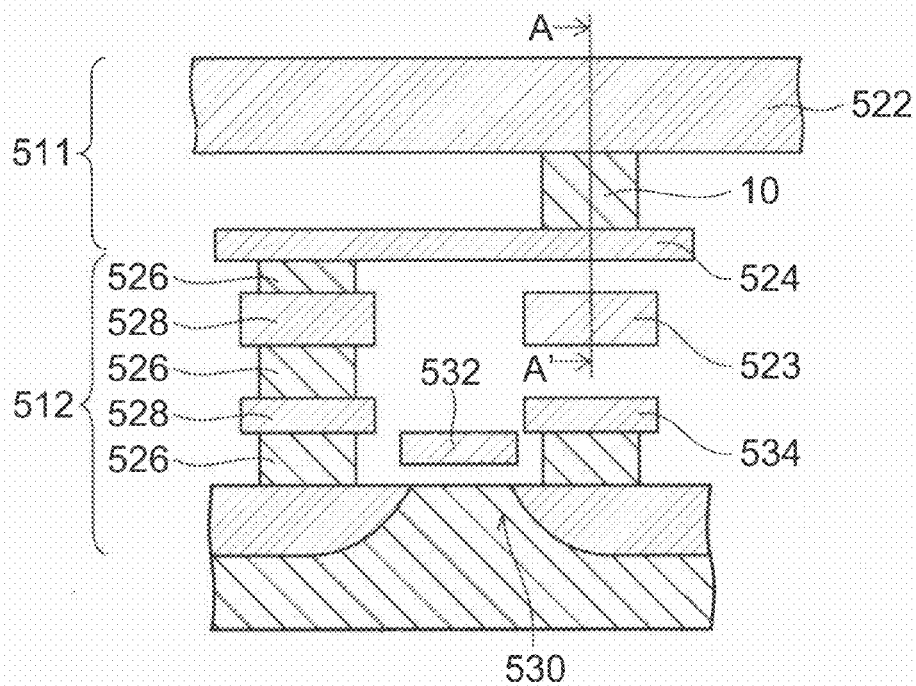
FIG. 26 is a cross-sectional view illustrating the main components of the magnetic memory according to the twenty eighth embodiment.

FIG. 26 is a cross-sectional view illustrating the main components of the magnetic memory according to the twenty eighth embodiment.

Figure 27:
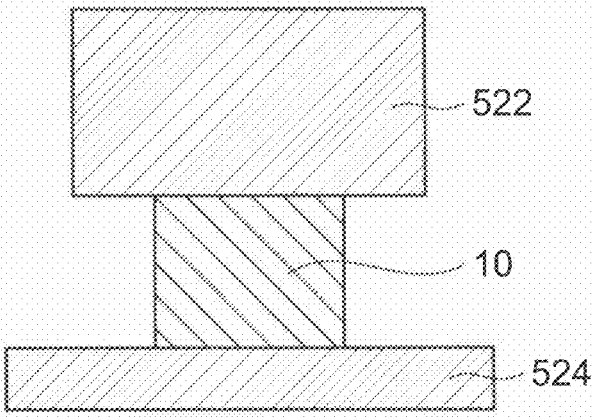
FIG. 27 is a cross-sectional view taken along line A-A' of FIG. 25.

FIG. 27 is a cross-sectional view taken along line A-A' of FIG. 26.

The structure illustrated in these drawings corresponds to a one-bit portion of the memory cells included in the magnetic memory illustrated in FIG. 25.

As illustrated in FIGS. 26 and 27, this memory cell includes a memory element portion 511 and a transistor portion for address selection 512.

The memory element portion 511 includes a magneto-resistive effect device 10 and a pair of interconnects 522, 524 connected to the magneto-resistive effect device 10. The magneto-resistive effect device 10 is a magneto-resistive effect device according to the embodiments described above.

On the other hand, the transistor portion for address selection 512 is provided with transistor 530 that is connected via a via 526 and an embedded interconnect 528. The transistor 530 performs switching operations in accordance with voltage applied to a gate 532, and controls the opening and closing of the current path between the magneto-resistive effect device 10 and the interconnect 524.

Additionally, a write interconnect 523 is provided substantially orthogonal to the interconnect 522 below the magneto-resistive effect device 10. The write interconnects 522, 523 can be formed from, for example, aluminum (Al), copper (Cu), tungsten (W), tantalum (Ta), or an alloy including any one of these elements.

In a memory cell having such a configuration, in order to write bit data to the magneto-resistive effect device 10, a write pulse current is supplied to the interconnects 522, 523, and a synthetic magnetic field induced by the write current is applied. Thereby, magnetizations on the recording layer of the magneto-resistive effect device are appropriately inverted.

Additionally, in order to read bit data, sense current is supplied through the interconnect 522, the magneto-resistive effect device 10 including the magnetic recording layer, and the bottom electrode 524; and a resistance value or a change in the resistance value of the magneto-resistive effect device 10 is measured.

By using the magneto-resistive effect device according to the embodiments described above, reliable reading and writing for the magnetic memory according to this embodiment can be ensured by reliably controlling the magnetic domain of the recording layer, even when the cell size is miniaturized Twenty Nineth Embodiment Next, a twenty nineth embodiment will be described.

This embodiment pertains to a magnetic memory on which the magneto-resistive effect device according to the first embodiment is mounted.

Figure 28:
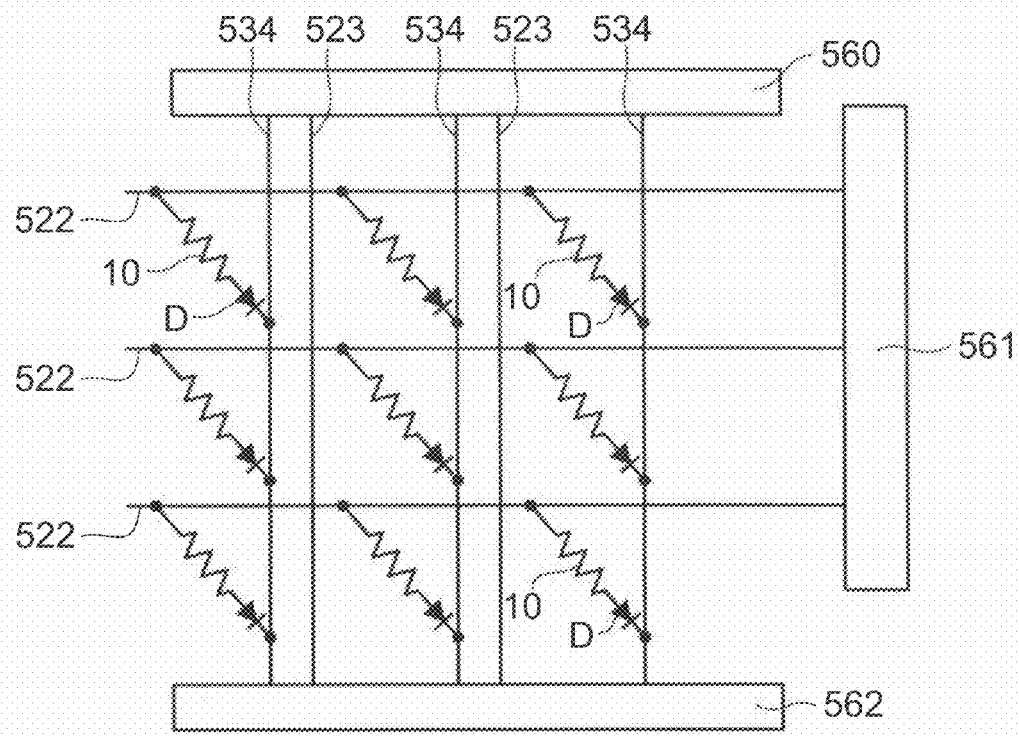
FIG. 28 is a circuit diagram illustrating a magnetic memory according to the twenty nineth embodiment.

FIG. 28 is a circuit diagram illustrating a magnetic memory according to the twenty nineth embodiment.

As illustrated in FIG. 28, in this embodiment, bit lines 522 and word lines 534 that are arranged in an array are selected by decoders 560, 561, respectively, in order to select a specific memory cell in the array. Each of the memory cells has a structure where the magneto-resistive effect device 10 and a diode D are connected in a series. The diode D has a role of preventing the sense current from being redirected to memory cells other than the selected magneto-resistive effect device 10. Writing is performed by applying a magnetic field generated by supplying write current to a specific bit line 522 and a specific write word line 523.

Configurations of the twenty nineth embodiment other than that described above are the same those according to the twenty eighth embodiment and, thus, descriptions thereof are omitted.

According to the embodiments described above, a magneto-resistive effect device, a magnetic head assembly, a magnetic recording device, and a magnetic memory device having high MR rates of change can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A magneto-resistive effect device comprising:
   a stacked body; and
   a pair of electrodes configured to supply current in a stacking direction of the stacked body,
   the stacked body including
      a first magnetic layer,
      a second magnetic layer, and
      a spacer layer disposed between the first magnetic layer and the second magnetic layer,
   at least one of the first magnetic layer, the second magnetic layer, and the spacer layer including an oxide layer composed of a metal oxide, a crystalline orientation of the metal oxide being a (111) plane orientation, and the metal oxide including Wustit being iron oxide, a crystalline structure of the metal oxide being a NaCl structure.

2. The device according to claim 1, wherein the metal oxide includes at least one selected from the group consisting of Zn (zinc), In (indium), Sn (tin), Cd (cadmium), Co (cobalt), Ni (nickel), Cu (copper), Ti (titanium), V (vanadium), Cr (chromium), Mn (manganese), Al (aluminum), Si (silicon), Mg (magnesium), Pt (platinum), Pd (palladium), Ag (silver), Zr (zirconium), Hf (hafnium), and Ta (tantalum).

3. The device according to claim 1, wherein a crystalline orientation dispersion angle of the oxide layer is not more than 5°.

4. The device according to claim 1, wherein a thickness of the oxide layer is not less than 0.5 nm and not more than 4 nm.

5. The device according to claim 1, wherein the spacer layer includes
an insulating member having through-holes provided in the insulating layer, and
conductive members provided in the through-holes.

6. The device according to claim 1, wherein the spacer layer includes
an upper metal layer, and
a lower metal layer, wherein
the oxide layer is disposed between the upper metal layer and the lower metal layer.

7. The device according to claim 6, wherein a magnetization direction of the first magnetic layer and a magnetization direction of the second magnetic layer are rotatable by an external magnetic field.

8. A magnetic head assembly comprising:
the magneto-resistive effect device according to claim 1;
a suspension having the magneto-resistive effect device mounted on a first end thereof; and
an actuator arm connected to a second end of the suspension.

9. A magnetic recording device comprising:
the magnetic head assembly according to claim 8; and
a magnetic recording media on which data is recorded using the magneto-resistive effect device mounted on the magnetic head assembly.

10. A magneto-resistive effect device comprising:
a stacked body; and
a pair of electrodes configured to supply current in a stacking direction of the stacked body,
the stacked body including
a first magnetic layer,
a second magnetic layer, and
a spacer layer disposed between the first magnetic layer and the second magnetic layer,
at least one of the first magnetic layer, the second magnetic layer, and the spacer layer including an oxide layer composed of a metal oxide,
a crystalline structure of the metal oxide being a spinel structure, and
the metal oxide includes divalent metal ions.

11. The device according to claim 10, wherein the oxide layer includes at least one metal selected from the group consisting of iron, cobalt, and nickel, and at least one material selected from the group consisting of zinc, cadmium, stannous, and indium.

12. The device according to claim 11, wherein the oxide layer includes iron and zinc.

13. The device according to claim 12, wherein a zinc concentration in the metal material included in the oxide layer is, in terms of atomic percentages, not less than 0.5 at. % and not more than 50 at. %.

14. A magnetic head assembly comprising:
the magneto-resistive effect device according to claim 10;
a suspension having the magneto-resistive effect device mounted on a first end thereof; and
an actuator arm connected to a second end of the suspension.

15. A magneto-resistive effect device comprising:
a stacked body; and
a pair of electrodes configured to supply current in a stacking direction of the stacked body,
the stacked body including
a first magnetic layer,
a second magnetic layer, and
a spacer layer disposed between the first magnetic layer and the second magnetic layer,
at least one of the first magnetic layer, the second magnetic layer, and the spacer layer including an oxide layer composed of a metal oxide,
the metal oxide including iron, and
a crystalline orientation of the metal oxide being a (111) plane orientation and an interplanar spacing of the (111) plane being not less than 0.242 nm.

16. The device according to claim 15, wherein a crystalline orientation dispersion angle of the oxide layer is not more than 5°.

17. The device according to claim 15, wherein a thickness of the oxide layer is not less than 0.5 nm and not more than 4 nm.

18. The device according to claim 15, wherein the spacer layer includes
an insulating member having through-holes provided in the insulating layer, and
conductive members provided in the through-holes.

19. The device according to claim 15, wherein the spacer layer includes
an upper metal layer, and
a lower metal layer, wherein
the oxide layer is disposed between the upper metal layer and the lower metal layer.

20. The device according to claim 15, wherein a magnetization direction of the first magnetic layer and a magnetization direction of the second magnetic layer are rotatable by an external magnetic field.

21. A magneto-resistive effect device comprising:
a non-magnetic layer including a first region and a second region;
a magnetization fixed layer provided on the first region and having a magnetization fixed in one direction; and
a magnetization free layer provided on the second region and having a magnetization configured to change in response to an external magnetic field,
a current being configured to be supplied between the non-magnetic layer and the magnetization fixed layer, and a voltage between the non-magnetic layer and the magnetization free layer being detectable,
at least one of the non-magnetic layer, the magnetization fixed layer and the magnetization free layer including an oxide layer composed of a metal oxide,
a crystalline orientation of the metal oxide being a (111) plane orientation, and
the metal oxide includes Wustit being iron oxide, a crystalline structure of the metal oxide being a NaCl structure.

22. The device according to claim 21, wherein the metal oxide includes at least one selected from the group consisting of Zn (zinc), In (indium), Sn (tin), Cd (cadmium), Co (cobalt), Ni (nickel), Cu (copper), Ti (titanium), V (vanadium), Cr (chromium), Mn (manganese), Al (aluminum), Si (silicon), Mg (magnesium), Pt (platinum), Pd (palladium), Ag (silver), Zr (zirconium), Hf (hafnium), and Ta (tantalum).

23. A magneto-resistive effect device comprising:
a non-magnetic layer including a first region and a second region;
a magnetization fixed layer provided on the first region and having a magnetization fixed in one direction; and
a magnetization free layer provided on the second region and having a magnetization configured to change in response to an external magnetic field,
a current being configured to be supplied between the non-magnetic layer and the magnetization fixed layer, and a voltage between the non-magnetic layer and the magnetization free layer being detectable,
at least one of the non-magnetic layer, the magnetization fixed layer and the magnetization free layer including an oxide layer composed of a metal oxide,
the metal oxide including a first element and a second element, the first element including at least one selected from a group consisting of iron, cobalt and nickel, the second element including at least one selected from a group consisting of zinc, cadmium, tin, and indium,
a crystalline structure of the metal oxide being a NaCl structure.

24. A magneto-resistive effect device comprising:
a non-magnetic layer including a first region and a second region;
a magnetization fixed layer provided on the first region and having a magnetization fixed in one direction; and
a magnetization free layer provided on the second region and having a magnetization configured to change in response to an external magnetic field,
a current being configured to be supplied between the non-magnetic layer and the magnetization fixed layer, and a voltage between the non-magnetic layer and the magnetization free layer being detectable,
at least one of the non-magnetic layer, the magnetization fixed layer and the magnetization free layer including an oxide layer composed of a metal oxide,
a crystalline structure of the metal oxide being a spinel structure, and
the metal oxide includes divalent metal ions.

25. A magneto-resistive effect device comprising:
a non-magnetic layer including a first region and a second region;
a magnetization fixed layer provided on the first region and having a magnetization fixed in one direction; and
a magnetization free layer provided on the second region and having a magnetization configured to change in response to an external magnetic field,
a current being configured to be supplied between the non-magnetic layer and the magnetization fixed layer, and a voltage between the non-magnetic layer and the magnetization free layer being detectable,
at least one of the non-magnetic layer, the magnetization fixed layer and the magnetization free layer including an oxide layer composed of a metal oxide,
the metal oxide including iron, and
a crystalline orientation of the metal oxide being a (111) plane orientation and an interplanar spacing of the (111) plane being not less than 0.242 nm.

26. A magneto-resistive effect device comprising:
a stacked body; and
a pair of electrodes configured to supply current in a stacking direction of the stacked body,
the stacked body including
a first magnetic layer,
a second magnetic layer, and
a spacer layer disposed between the first magnetic layer and the second magnetic layer,
at least one of the first magnetic layer, the second magnetic layer and the spacer free layer including an oxide layer composed of a metal oxide,
the metal oxide including a first element and a second element, the first element including at least one selected from a group consisting of iron, cobalt and nickel, the second element including at least one selected from a group consisting of zinc, cadmium, tin, and indium,
a crystalline structure of the metal oxide being a NaCl structure.

27. The device according to claim 26, wherein the oxide layer includes iron and zinc.

28. The device according to claim 26, wherein a zinc concentration in metal material included in the oxide layer is, in terms of atomic percentages, not less than 0.5 at. % and not more than 50 at. %.

29. The device according to claim 26, wherein a crystalline orientation dispersion angle of the oxide layer is not more than 5°.

30. The device according to claim 26, wherein a thickness of the oxide layer is not less than 0.5 nm and not more than 4 nm.

31. The device according to claim 26, wherein the spacer layer includes
an insulating member having through-holes provided in the insulating layer, and
conductive members provided in the through-holes.

32. The device according to claim 31, wherein the spacer layer includes
an upper metal layer, and
a lower metal layer, wherein
the oxide layer is disposed between the upper metal layer and the lower metal layer.

33. The device according to claim 26, wherein a magnetization direction of the first magnetic layer and a magnetization direction of the second magnetic layer are rotatable by an external magnetic field.

34. A magnetic head assembly comprising:
the magneto-resistive effect device according to claim 26;
a suspension having the magneto-resistive effect device mounted on a first end thereof; and
an actuator arm connected to a second end of the suspension.

* * * * *